United States Patent
Maeda et al.

(10) Patent No.: US 6,191,450 B1
(45) Date of Patent: *Feb. 20, 2001

(54) SEMICONDUCTOR DEVICE WITH FIELD SHIELD ELECTRODE

(75) Inventors: Shigenobu Maeda; Toshiaki Iwamatsu; Shigeto Maegawa; Takashi Ipposhi; Yasuo Yamaguchi; Yuichi Hirano, all of Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/990,285

(22) Filed: Dec. 15, 1997

(30) Foreign Application Priority Data

Jun. 27, 1997 (JP) .................................... 9-171773

(51) Int. Cl.$^7$ .................................... H01L 29/00
(52) U.S. Cl. ............... 257/347; 257/288; 257/324; 257/325; 257/296; 257/350; 257/351; 257/368; 257/392; 257/393
(58) Field of Search ............... 257/288, 324, 257/325, 347, 296, 350, 351, 368, 392, 393

(56) References Cited

U.S. PATENT DOCUMENTS

| 4,786,609 | * | 11/1988 | Chen | 438/303 |
| 4,818,715 | * | 4/1989 | Chao | 257/344 |
| 4,843,023 | * | 6/1989 | Chiu et al. | 257/344 |
| 4,868,140 | * | 9/1989 | Yonehara | 257/57 |
| 4,922,311 | * | 5/1990 | Lee et al. | 257/288 |
| 5,304,829 | * | 4/1994 | Mori et al. | 257/324 |
| 5,367,186 | * | 11/1994 | Vinal et al. | 257/327 |
| 5,640,032 |   | 6/1997 | Tomioka . | |
| 5,641,989 |   | 6/1997 | Tomioka . | |
| 5,783,469 | * | 7/1998 | Gardner et al. | 438/199 |
| 5,814,869 | * | 9/1998 | Dennen | 257/327 |

FOREIGN PATENT DOCUMENTS

| 36 87 179 | 4/1993 | (DE) . |
| 0 718 881 | 6/1996 | (EP) . |
| 6-302779 | 10/1994 | (JP) . |
| 7-201967 | 8/1995 | (JP) . |
| 7-283300 | 10/1995 | (JP) . |
| 8-31928 | 2/1996 | (JP) . |
| 8-162523 | 6/1996 | (JP) . |
| 9-27600 | 1/1997 | (JP) . |

OTHER PUBLICATIONS

S. A. Abbas, IBM Technical Disclosure Bulletin, vol. 15, No. 10, pp. 3022–3023, "FET Integrated Circuit Having Two Polysilicon Layers", Mar. 1, 1993.

T. Iwamatsu, et al., "CAD–compatible High–Speed CMOS/SIMOX Technology Using Field–Shield Isolation For 1M Gate Array", Proc IEEE IEDM, 1993, pp. 475–478.

T. Iwamatsu, et al., "High–Speed 0.5μm SOI 1/8 Frequency Divider with Body–Fixed Structure for Wide Range of Applications", Extended Abstracts of the 1995 International Conference on Solid State Devices and Materials, Osaka, 1995, pp. 575–577.

S. Maeda, et al., "Suppression of Delay Time Instability on Frequency using Field Shield Isolation Technology for Deep Sub–Micron SOI Circuits", Proc IEEE IEDM, 1996, pp. 129–132.

* cited by examiner

Primary Examiner—Fetsum Abraham
(74) Attorney, Agent, or Firm—Oblon, Spivak, McClelland, Maier & Neustadt, P.C.

(57) ABSTRACT

An FS upper nitride film (15) is formed on the upper surface of an FS electrode (5). Therefore, the upper surface of the FS electrode (5) is not exposed even when an FS upper oxide film (41) is partially almost removed in the manufacturing process. Thus, a semiconductor device which prevents degradation in operation characteristics and reliability due to existence of an FS insulating layer can be provided.

16 Claims, 40 Drawing Sheets

SEMICONDUCTOR DEVICE WITH FIELD SHIELD ELECTRODE

BACKGROUND OF THE INVENTION

1. Field of the Invention

The present invention relates to a semiconductor device and a manufacturing method therefor, and more particularly to a semiconductor device with field-shield isolation structure and a manufacturing method therefor.

2. Description of the Background Art

FIG. 82 is a sectional perspective view of a semiconductor device M90 with field-shield isolation structure in the background art of the present invention. This is an SOI (Semiconductor-On-Isolation) type semiconductor device using an SOI substrate which has a film-like semiconductor layer, i.e., an SOI layer on an insulating substrate as a semiconductor substrate in which a transistor element is provided.

In the semiconductor device M90, as shown in FIG. 82, a silicon semiconductor layer is formed as an SOI layer 3 on an insulating substrate constituted of a supporting substrate 1 and a buried oxide film 2. The SOI layer 3 includes a region where each of many NMOS transistors is formed (referred to as "NMOS region" hereinafter) and a region where each of many PMOS transistors is formed ("PMOS region" hereinafter). Plate-like field-shield (gate) electrodes 5 ("FS electrode" hereinafter) are each formed in a boundary between these element regions to electrically isolating these element regions from each other.

The FS electrodes 5 are disposed in parallel at a predetermined interval to define an active region in each element region. Each FS electrode 5 is covered with a field-shield insulating layer 4 ("FS insulating layer" hereinafter) and a gate electrode 6 is disposed on the active region, extending onto the two parallel FS insulating layers 4. A gate oxide film 10 is formed between the gate electrode 6 and the active region. The FS insulating layer 4 is made of an oxide, providing electrical isolation between the FS electrode 5 and the gate electrode 6.

A drain electrode and a source electrode (both not shown), i.e., main electrodes are connected to a source/drain layer (now shown) in the SOI layer 3 through a contact hole 7 provided in a not-shown insulating layer, and a gate interconnection (not shown) is connected to the gate electrode 6 through a contact hole 8.

The contact hole 9 connected to the body contact electrode (not shown) penetrates the FS electrode 5 to be connected to the SOI layer 3 in FIG. 82, but the contact hole 9 may be provided externally of the FS electrode 5.

In the semiconductor device M90, the FS electrode 5 is reversely biased to cut off an isolation region in the SOI layer 3, and as a result, an electrical isolation between the element regions is established. For isolation between the element regions, besides this structure, a LOCOS structure which provides an isolation by selectively oxidizing the SOI layer 3 or a mesa isolation structure which separates the element regions by selectively etching the SOI layer 3.

Formation of the LOCOS structure or the mesa isolation structure, however, needs a local oxidation or a local etching of the SOI layer 3, causing local concentration of stress in the SOI layer 3. As a result, there arises a problem in terms of reliability of device, such as generation of leak current. In contrast, formation of the field-shield isolation structure needs no local oxidation or local etching. This avoids stress concentration, suppressing leak current, to ensure relatively high reliability.

The following prior-art documents have been found by searching. Outlines thereof will be presented below. In Japanese Patent Application Laid Open Gazette 8-162523, a cap insulating film made of a silicon nitride film is provided on a shield gate electrode and instead of a side wall insulating film, a side surface of the shield gate electrode is thermally oxidized.

In Japanese Patent Application Laid Open Gazette 7-201967, a side surface of a polycrystalline silicon film is thermally oxidized to reduce the width of a field-shield electrode made of a polycrystalline silicon film.

In Japanese Patent Application Laid Open Gazette 8-31928, a shield gate oxide film, a silicon nitride film and a polycrystalline silicon film are sequentially formed.

In Japanese Patent Application Laid Open Gazette 6-302779, a shield plate electrode is formed on an ONO film.

Japanese Patent Application Laid Open Gazettes 7-283300 and 9-27600, an upper surface and a side surface of a shield electrode is covered with a nitride film.

In the background-art field-shield isolation structure, various problems are left unsolved in terms of reliability due to its structure and its manufacturing method.

Showing steps for manufacturing the field-shield isolation structure in the background art with reference to FIGS. 83 to 101, these problems will be discussed below.

First, as shown in FIG. 83, an oxide film OF1, a polysilicon layer PS1 doped with an impurity (e.g., phosphorus) and an oxide film OF2 are sequentially formed on a surface of the SOI layer 3 in the SOI substrate. The SOI layer 3 has a thickness of about 1000 Å, the oxide film OF1 has a thickness of about 200 Å, the polysilicon layer PS1 has a thickness of about 500 Å and the oxide film OF2 has a thickness of about 1000 Å.

Next, in the step of FIG. 84, a patterned resist mask R1 is formed on the oxide film OF2.

In the step of FIG. 85, with the resist mask R1 used as a mask, the oxide film OF2 and the polysilicon layer PS1 are selectively removed by anisotropic etching (dry etching), to form an FS upper oxide film 41 (the first oxide film) and an FS electrode 5.

Subsequently, in the step of FIG. 86, an oxide film OF3 is formed so as to cover the oxide film OF1, the FS upper oxide film 41 and the FS electrode 5. The oxide film OF3 has a thickness of 1500 to 2000 Å.

In the step of FIG. 87, the oxide film OF3 is removed by anisotropic etching (dry etching), to form a side wall oxide film 42 (the second oxide film) on side surfaces of the FS upper oxide film 41 and the FS electrode 5.

After that, in the step of FIG. 88, the oxide film OF1 is removed. The oxide film OF1 serves as a protective film for protecting the source/drain region from exposure to the plasma of the dry etching, and is removed by wet etching. Through this step, the oxide film OF1 remains only below the FS electrode 5 and the side wall oxide film 42, becoming an FS gate oxide film 43. The FS upper oxide film 41, the side wall oxide film 42 and the FS gate oxide film 43 constitute the FS insulating layer 4. Together with the oxide film OF1, the FS upper oxide film 41 and the side wall oxide film 42 are etched at the same time, to become thinner. As the FS upper oxide film 41 becomes thinner, the parasitic capacitance between the FS electrode 5 and the gate electrode 6 increases, to cause degradation of operating speed of the device and increase likelihood of short circuits between these electrodes.

In the step of FIG. 89, an oxide film OF4 which is to become the gate oxide film 10 on the surface of the SOI layer 3 by thermal oxidation. In forming the oxide film OF4, the oxygen used as an oxidant goes through the FS upper oxide film 41, the side wall oxide film 42 and the FS gate oxide film 43 to oxidize the FS electrode 5. The FS electrode 5 is a doped polysilicon layer which is easily oxidize and becomes thinner in substantial thickness by oxidation.

As the FS electrode 5 becomes thinner, its electrical resistance increases and there is a possibility of not achieving the desired performance during device operation with insufficient effect of field-shield isolation.

Further, the oxygen reaching the bottom of the FS electrode 5 oxidizes an edge portion of the FS electrode 5, and as it also oxidizes the SOI layer 3 beneath the side wall oxide film 42, an edge portion of the FS gate oxide film 43 becomes thicker and the edge portion of the FS electrode 5 is warped up. That's because an edge portion is more oxidized and a central portion is less oxidized. When the edge portion of the FS electrode 5 is warped up, the distance between the FS electrode 5 and the gate electrode 6 partially decreases, to raise the possibility of an increase of parasitic capacitance therebetween and dielectric breakdown.

Subsequently, in the step of FIG. 90, a polysilicon layer PS2 which is to become the gate electrode 6 is formed by CVD on the oxide film OF4 and the FS insulating layer 4, to have a thickness of 1000 to 1500 Å.

In the step of FIG. 91, the polysilicon layer PS2 is selectively removed by anisotropic etching (dry etching) to form the gate electrode 6. With the gate electrode 6 used as a mask, the oxide film OF4 is selectively removed to form the gate oxide film 10.

At this time, the FS upper oxide film 41 is partially removed by overetching and the FS upper oxide film 41 partially becomes thinner. In this state, side wall oxide films 61 are formed on both sides of the gate electrode 6 to provide a lightly doped drain layer ("LDD layer" hereinafter) in the source/drain layer. Through the steps of forming an oxide film so as to cover the gate electrode 6 and then removing it by anisotropic etching (dry etching), the side wall oxide films 61 are provided, being self-aligned, on the sides of the gate electrode 6. At this time the FS upper oxide film 41 is further removed by overetching.

A silicide-protection film 11 is formed entirely on a portion which does not require formation of a silicide layer. The silicide-protection film 11 is formed on a surface of a source/drain layer of a semiconductor element where forming the silicide layer would cause defective operation.

Through the steps of forming an oxide film entirely on the semiconductor substrate and selectively removing the oxide film by anisotropic etching (dry etching), the silicide-protection film 11 is formed so as to cover a surface of a predetermined source/drain layer, and at the same time it is formed, being self-aligned, on the side surface of the FS insulating layer 4 (on the side surfaces of the side wall oxide film 42 and the FS gate oxide film 43), as shown in FIG. 92. In forming the silicide-protection film 11, the FS upper oxide film 41 is further removed by overetching and the FS upper oxide film 41 partially becomes too much thinner.

Since the edge portion of the FS electrode 5 is warped up in the step of gate oxidation, the FS electrode 5 is partially exposed in some instances.

In this state, a silicide film 12 is formed, being self-aligned, on an upper surface of the gate electrode 6 and a surface of the not-shown source/drain layer. The silicide film 12 may be any of cobalt silicide ($CoSi_2$), titanium silicide ($TiSi_2$), nickel silicide ($NiSi_2$), tungsten silicide ($WSi_2$) or the like. Since the silicide film 12 is formed on surfaces of a polysilicon layer and a silicon layer, it is formed on the exposed surface of the FS electrode 5 as shown in FIG. 93.

The silicide film 12 formed on the exposed surface of the FS electrode 5 is easily exfoliated since the exposed surface of the FS electrode 5 is small in area and it is formed where the FS upper oxide film 41 is not completely removed. If the exfoliated silicide film 12 comes into conductive dust, and remains on the semiconductor device, the remainder ill affects the operation characteristics of the semiconductor device and deteriorates production yield of the device. Moreover, if the FS electrode 5 is partially lost together with the exfoliated silicide film 12, that causes a break in the FS electrode 5 resulting in lower production yield of the device.

In the above process for manufacturing the semiconductor device, only the oxide film OF3 is removed by anisotropic etching (dry etching), to form the side wall oxide film 42 through the step of FIG. 87, and the oxide film OF1 is removed by wet etching (see FIG. 88). The oxide films OF3 and OF1, however, may be removed by dry etching at the same time, though this causes the following problem.

In the step subsequent to that of FIG. 86, the oxide films OF3 and OF1 are removed to form the side wall oxide film 42, and the oxide film OF1 is left only beneath the side wall oxide film 42, becoming the FS gate oxide film 43. In this case, as shown if FIG. 94, there is a possibility of removing the surface of the SOI layer 3 by overetching.

In particular, an edge portion of the side wall oxide film 42 is more removed than any other portions, to be partially scooped out in the SOI layer 3. One of the factors that cause this phenomenon is inconsistent density of an etchant. Thus, a dent portion DP is created in the surface of the SOI layer 3 near the edge portion of the side wall oxide film 42 as shown in FIG. 94.

After the step of forming the side wall film 42, a natural oxide film formed on the surface of the SOI layer 3 must be removed by wet etching prior to forming the gate oxide film OF3 on the surface of the SOI layer 3 as discussed with reference to FIG. 89. At this time, together with the natural oxide film, the FS upper oxide film 41 and the side wall oxide film 42 are slightly removed. This state is shown in FIG. 95.

In this figure, the broken line indicates where the FS insulating film 4 was formed before removing the natural oxide film. As is clear from FIG. 95, an edge portion EP is created in the periphery of the side wall oxide film 42 as the FS insulating film 4 is retracted.

FIG. 96 shows a state after forming the oxide film OF4 which is to become the gate oxide film. In this figure, the oxide film OF4 is formed, reflecting the shape of the edge portion EP. In other words, the edge portion EP remains in the periphery of the side wall oxide film 42. Under this condition, when the polysilicon layer PS2 which is to become the gate electrode 6 is formed, electric field concentration occurs in the edge portion EP during device operation and the electric field becomes intense, to raise strong possibility of breaking down the gate oxide film. That results in less reliability of the gate oxide film and by extension, less reliability of the MOS transistor with field-shield isolation structure.

FIGS. 98 to 100 correspond to FIGS. 91 to 93, which show the problem due to warping up of the edge portion of the FS electrode 5 which is raised also in the gate oxidation process.

Besides the above problem, there is another problem, due to the material of the FS electrode, of a short circuit between electrodes which occurs at a portion where the gate electrode of the transistor overlaps the FS electrode.

As the FS electrode 5, which is made of an N-type polysilicon doped with phosphorus (P), has large grain diameter (including crystal grain having a diameter of 0.2 to 1 μm) and its oxidation is boosted along the grain boundary in the oxidation process, it is likely to be uneven.

Specifically discussing, the oxide film OF4 which is to become the gate oxide film 10 is formed on the surface of the SOI layer 3 as shown in FIG. 89, and at this time the oxygen used as an oxidant goes through the FS upper oxide film 41, the side wall oxide film 42 and the FS gate oxide film 43, to oxidize the FS electrode 5. Because of this, the FS electrode 5 becomes thinner and is warped up as discussed earlier, and at the same time the surface of the FS electrode 5 becomes uneven for the above reason.

This state is schematically shown in FIG. 101. FIG. 101 is a perspective view showing an arrangement of the FS insulating film 4, the FS electrode 5 and the gate electrode 6, for easy perception.

As the surface of the FS electrode 5 is uneven, the edge portion of the FS electrode 5 has large and small projections, as shown in FIG. 101. Therefore, electric field concentration occurs at these projections during device operation and dielectric breakdown occurs between the edge portion of the FS electrode 5 and the opposed gate electrode 6, to cause a short circuit between these electrodes.

SUMMARY OF THE INVENTION

The present invention is directed to a semiconductor device. According to a first aspect of the present invention, the semiconductor device comprises, for device isolation, a field-shield isolation structure having a field-shield insulating film selectively formed on a semiconductor substrate and a field-shield gate electrode formed on the field-shield insulating film, in which the field-shield isolation structure comprises: an oxidation-resistant film formed so as to cover an upper surface of the field-shield gate electrode; a first oxide film covering an upper surface of the oxidation-resistant film; and a second oxide film covering side surfaces of the first oxide film, the oxidation-resistant film and the field-shield gate electrode.

According to a second aspect of the present invention, in the semiconductor device, the oxidation-resistant film is a titanium nitride film or a tungsten nitride film.

According to a fourth aspect of the present invention, in the semiconductor device, the oxidation-resistant film is a silicon nitride film or an SiON film.

According to a fifth aspect of the present invention, in the semiconductor device, the second oxide film has a gently-stepped structure on its surface in a vertically sectional direction.

According to an eleventh aspect of the present invention, the semiconductor device comprises, for device isolation, a field-shield isolation structure having a field-shield insulating film selectively formed on a semiconductor substrate and a field-shield gate electrode formed on the field-shield insulating film, in which the field-shield insulating film has resistance to oxidation, and the field-shield isolation structure comprises: a first oxidation-resistant film formed so as to cover an upper surface of the field-shield gate electrode; and a second oxidation-resistant film formed so as to cover side surfaces of the first oxidation-resistant film and the field-shield gate electrode.

According to a twelfth aspect of the present invention, in the semiconductor device, a device isolated by the field-shield isolation structure is an MOS transistor, a surface part of the semiconductor substrate on which the MOS transistor is formed is located lower than a surface part of the semiconductor substrate on which the field-shield insulating film is formed.

According to a thirteenth aspect of the present invention, in the semiconductor device, the semiconductor substrate is an SOI substrate having an SOI layer formed on an insulating substrate, and the field-shield isolation structure and the MOS transistor are formed on the SOI layer and an impurity concentration in the SOI layer beneath the field-shield gate electrode is higher than that in a channel region of the MOS transistor formed in the SOI layer.

According to a fourteenth aspect of the present invention, in the semiconductor device, the field-shield isolation structure further comprises an oxide film formed between the semiconductor substrate and the field-shield insulating film so as to cover a lower surface of the field-shield insulating film, and an edge portion of the oxide film is thicker than a central portion thereof.

According to a sixteenth aspect of the present invention, the semiconductor device comprises, for device isolation, a field-shield isolation structure having a field-shield insulating film selectively formed on a semiconductor substrate and a field-shield gate electrode formed on the field-shield insulating film, in which the field-shield isolation structure comprises: a first oxide film covering an upper surface of the field-shield gate electrode; and a second oxide film covering side surfaces of the first oxide film and the field-shield gate electrode, a device isolated by the field-shield isolation structure is an MOS transistor, and a thickness of the first oxide film is larger than the total of those of a side wall oxide film formed in an end surface of a gate electrode of the MOS transistor for formation of a lightly doped drain layer of the MOS transistor and a silicide-protection film formed on a portion of the MOS transistor which does not require formation of a silicide film.

According to a seventeenth aspect of the present invention, in the semiconductor device, the thickness of the first oxide film is 1.1 to 3 times as large as the total of those of the side wall oxide film and the silicide-protection film.

According to an eighteenth aspect of the present invention, in the semiconductor device, the field-shield gate electrode is made of a polycrystalline silicon layer, and the polycrystalline silicon layer has a crystal grain of which the average diameter is not more than 0.1 μm.

According to a nineteenth aspect of the present invention, in the semiconductor device, a device isolated by the field-shield isolation structure is an MOS transistor, a gate electrode of the MOS transistor and the field-shield gate electrode are each made of a polycrystalline silicon layer, and the average diameter of a crystal grain of the field-shield gate electrode is smaller than that of the gate electrode of the MOS transistor.

According to a twentieth aspect of the present invention, in the semiconductor device, the polycrystalline silicon layer includes therein nitrogen having a density of $1 \times 10^{19}/cm^3$.

The present invention is also directed to a method for manufacturing a semiconductor device. According to a twenty-first aspect of the present invention, the semiconductor device comprises, for device isolation, a field-shield isolation structure having a field-shield insulating film selectively formed on a semiconductor substrate and a field-shield gate electrode formed on the field-shield insulating film, and the method comprises the steps of: (a) forming the field-shield insulating film entirely on the semiconductor substrate; (b) selectively forming a multi-layered structure consisting of the field-shield gate electrode, an oxidation-resistant film and a first oxide film which are sequentially layered on the field-shield insulating film; and (c) forming a second oxide film which covers side surfaces of the first oxide film, the oxidation-resistant film and the field-shield gate electrode, wherein the step (c) includes the steps of (c-1) forming an oxide film so as to cover the field-shield insulating film and the multi-layered structure; (c-2) thinning the oxide film on the field-shield insulating film by anisotropic dry etching; and (c-3) removing the oxide film on the field-shield insulating film by wet etching to form the second oxide film and selectively removing the field-shield insulating film.

In the semiconductor device of the first aspect of the present invention, since the oxidation-resistant film is formed on the field-shield gate electrode and the first oxide film is formed thereon, the upper surface of the field-shield gate electrode is not exposed if the first oxide film is partially almost removed in such steps of, for example, partially forming the gate electrode of the MOS transistor on the first oxide film and forming the side wall oxide film for formation of the lightly doped drain layer on the side surface of the gate electrode. Therefore, since no silicide film is formed on the surface of the field-shield gate electrode even when the silicide film is formed on the gate electrode, it is possible to prevent ill effect on the operation characteristics of the semiconductor device due to the exfoliated silicide film which comes into conductive dust to be left on the semiconductor device. Further, it is possible to prevent a break in the field-shield gate electrode caused by partial lost of the field-shield gate electrode with exfoliation of the silicide film. Existence of the oxidation-resistant film prevents oxidation of the upper surface of the field-shield gate electrode, cutting the rate of decrease in substantial thickness of the field-shield gate electrode due to the oxidation, to suppress an increase of the electrical resistance of the field-shield gate electrode. In the Japanese Patent Application Laid Open Gazette 8-162523, there is no structure which corresponds to the first or second oxide film of the present invention, therefore the parasitic capacitance between the gate electrode and the field-shield gate electrode increases and it is difficult to form the gate electrode. In the Japanese Patent Application Laid Open Gazette 7-201967, it is impossible to prevent deformation of the field-shield gate electrode due to oxidation, unlike the present invention, since the width of the field-shield electrode is shorten by horizontally oxidizing a polycrystalline silicon film.

In the semiconductor device of the second aspect of the present invention, the resistance value of the field-shield gate electrode decreases since the oxidation-resistant film is a titanium nitride film or a tungsten nitride film which is conductive.

In the semiconductor device of the fourth aspect of the present invention, the oxidation-resistant film can be formed relatively easily when it is a silicon nitride film, and the oxidation-resistant film can have a property intermediate between the oxide film and the nitride film when it is an SiON film.

In the semiconductor device of the fifth aspect of the present invention, the problem of exfoliating the gate electrode can be solved with excellent adherence of the gate electrode when, for example, the gate electrode of the MOS transistor is formed partially on the second oxide film and the first oxide film.

In the semiconductor device of the eleventh aspect of the present invention, since the field-shield gate electrode is surrounded by the oxidation-resistant films, the oxidation-resistant films are not removed and no edge portion is formed in the periphery of the second oxidation-resistant film even when, for example, the natural oxide film on the semiconductor substrate is removed by wet etching. Therefore, when the gate electrode of the MOS transistor is formed partially on the first oxidation-resistant film, it is possible to prevent a breakage of the gate oxide film due to the edge portion and increase the reliability of the gate oxide film. Existence of the first and second oxidation-resistant films prevents oxidation of the upper and lower surface sides of the field-shield gate electrode and prevents the edge portion of the field-shield gate electrode from being warped up. Therefore, for example, when the gate electrode of the MOS transistor is formed partially on the first oxidation-resistant film, it is possible to prevent an increase of the parasitic capacitance between the gate electrode and the field-shield gate electrode and a dielectric breakdown caused by partial decrease in distance between the gate electrode and the field-shield gate electrode. Further, no decrease in substantial thickness of the field-shield gate electrode due to the oxidation prevents an increase of electrical resistance of the field-shield gate electrode. Furthermore, for example, when the gate electrode of the MOS transistor is formed partially on the first oxidation-resistant film and the side wall oxide film is formed on the side surface of the gate electrode for formation of a lightly doped drain layer, the first oxidation-resistant film is not removed and the upper surface of the field-shield gate electrode is not exposed in this process. Therefore, since no silicide film is formed on the surface of the field-shield gate electrode even when the silicide film is formed on the gate electrode, it is possible to prevent ill effect on the operation characteristics of the semiconductor device due to the exfoliated silicide film which comes into conductive dust to be left on the semiconductor device. Further, it is possible to prevent a break in the field-shield gate electrode caused by partial lost of the field-shield gate electrode with exfoliation of the silicide film, and sufficient field-shield isolation effect can be achieved during device operation. In the Japanese Patent Application Laid Open Gazettes 7-283300 and 9-27600, both configuration and manufacturing process of the silicon nitride film are complex and it is possible to prevent oxidation of the lower surface side of the shield electrode.

In the semiconductor device of the twelfth aspect of the present invention, for example, when the SOI substrate is used as the semiconductor substrate, the SOI layer beneath the field-shield gate electrode can be made thicker and the resistance value of the SOI layer beneath the field-shield gate electrode can be lowered while the requirement of proper thickness of the SOI layer in the channel region is satisfied.

In the semiconductor device of the thirteenth aspect of the present invention, since the impurity concentration of the SOI layer beneath the field-shield gate electrode is higher than that in the channel region of the MOS transistor formed in the SOI layer, the electrical resistance of the SOI layer beneath the field-shield gate electrode is lowered to surely fix the body electrode through this portion.

In the semiconductor device of the fourteenth aspect of the present invention, since the edge portion of the oxide film beneath the field-shield insulating film is thicker than the central portion thereof, it is possible to prevent a dielectric breakdown at the edge portion where electric field concentration is liable to occur and increase the reliability of the field-shield isolation structure.

In the semiconductor device of the sixteenth aspect of the present invention, since the thickness of the first oxide film is larger than the total of those of the side wall oxide film for formation of a lightly doped layer and the silicide-protection film, the first oxidation-resistant film is not so removed as to expose the upper surface of the field-shield gate electrode by overetching in forming the side wall oxide film and the silicide-protection film. Therefore, since no silicide film is formed on the surface of the field-shield gate electrode even when the silicide film is formed on the gate electrode, it is possible to prevent ill effect on the operation characteristics of the semiconductor device due to the exfoliated silicide film which comes into conductive dust to be left on the semiconductor device. Further, it is possible to prevent a break in the field-shield gate electrode caused by partial lost of the field-shield gate electrode with exfoliation of the silicide film, and sufficient field-shield isolation effect can be achieved during device operation.

In the semiconductor device of the seventeenth aspect of the present invention, it is possible to surely prevent the upper surface of the field-shield gate electrode from being exposed by overetching.

In the semiconductor device of the eighteenth aspect of the present invention, since no large projection exists in the edge portion of the field-shield gate electrode, it is possible to prevent a dielectric breakdown between the edge portion of the field-shield gate electrode and the opposed gate electrode during the device operation and a short circuit between these electrodes.

In the semiconductor device of the nineteenth aspect of the present invention, it is possible to prevent a dielectric breakdown between the edge portion of the field-shield gate electrode and the opposed gate electrode during the device operation and a short circuit between these electrodes.

In the semiconductor device of the twentieth aspect of the present invention, it is possible to surely obtain a polycrystalline silicon layer having a crystal grain of which the diameter is not more than 0.1 μm.

By the method for manufacturing a semiconductor device of the twenty-first aspect of the present invention, the second oxide film in the semiconductor device of the first aspect can have the gently-stepped structure on its surface in a vertically sectional direction.

The first object of the present invention is to provide a semiconductor device with field-shield isolation structure which has no problem of deterioration in operation characteristics and reliability of the device due to existence of the FS insulating layer. The second object of the present invention is to provide a semiconductor device with field-shield isolation structure which is capable of preventing a breakage of the gate oxide film due to its manufacturing process. The third object of the present invention is to provide a semiconductor device which is capable of preventing a short circuit between the FS electrode and the gate electrode due to the material of the FS electrode. Another object of the present invention is to provide methods suitable for manufacturing these semiconductor devices.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. The First Preferred Embodiment>

<A-1. Device Structure>

Figure 82:
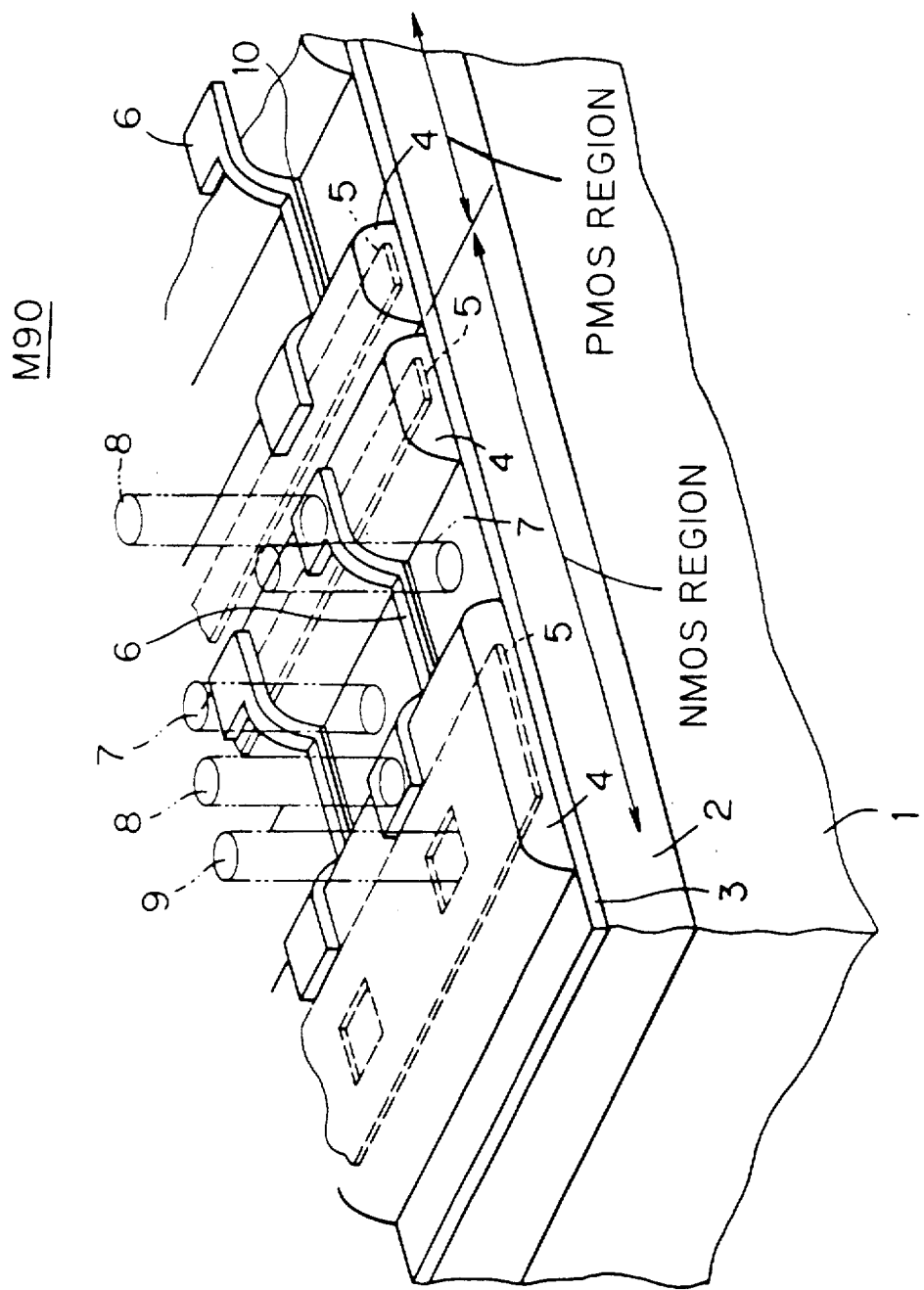
FIG. 82 is a perspective view showing an overall structure of a semiconductor device with field-shield isolation structure.
Figure 83:
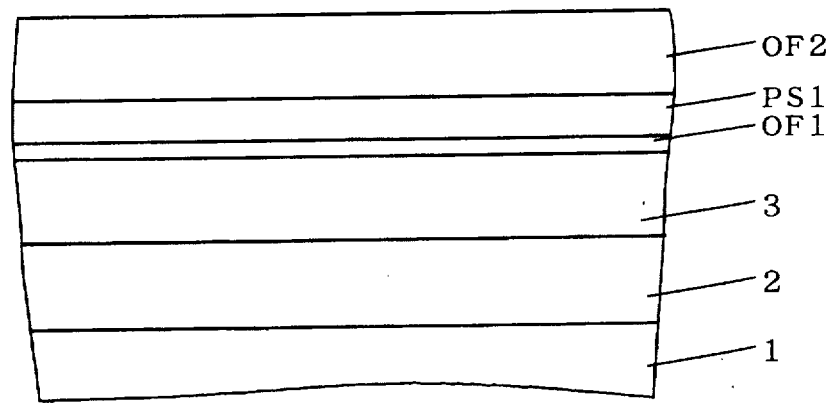
FIGS. 83 to 100 illustrate steps for manufacturing a semiconductor device in the background art.
Figure 84:
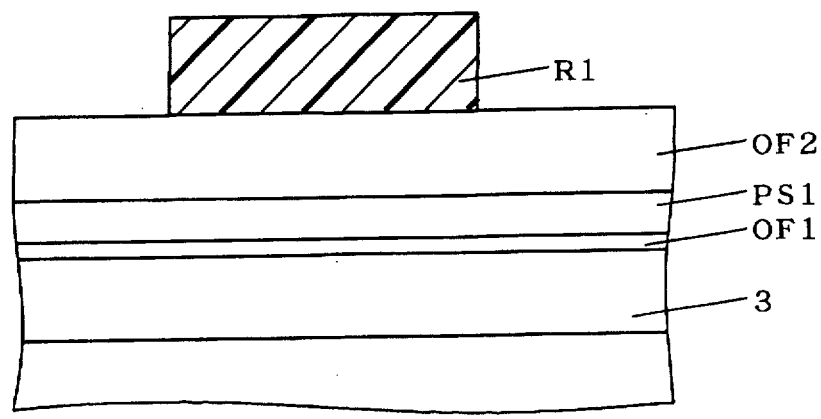
Figure 85:
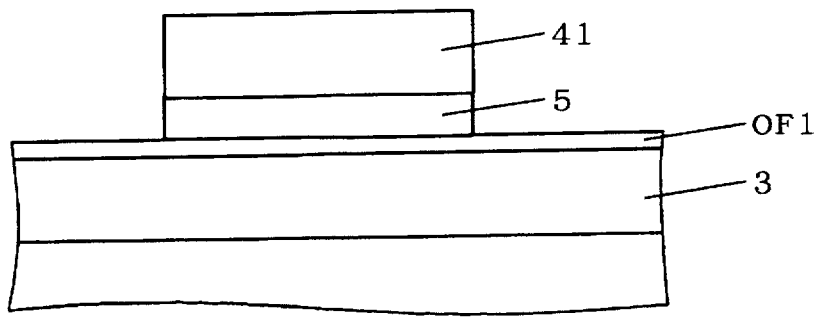
Figure 86:
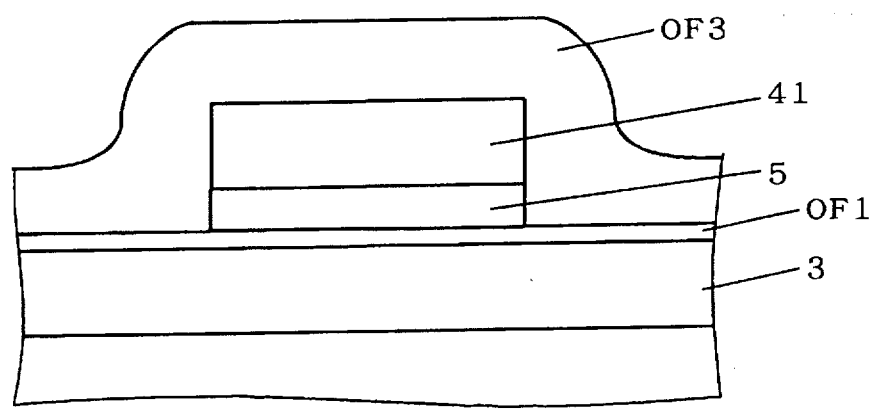
Figure 87:
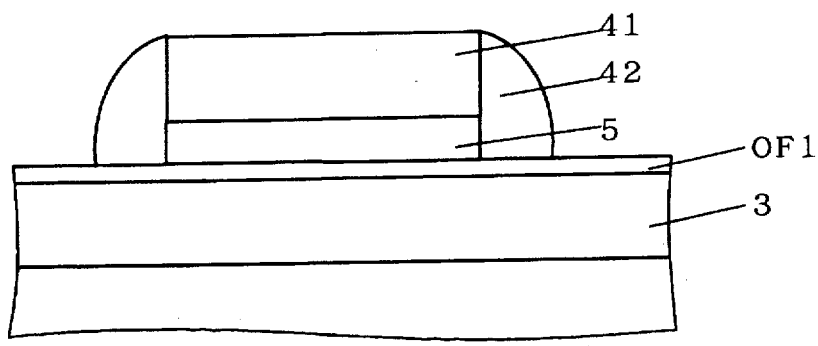
Figure 88:
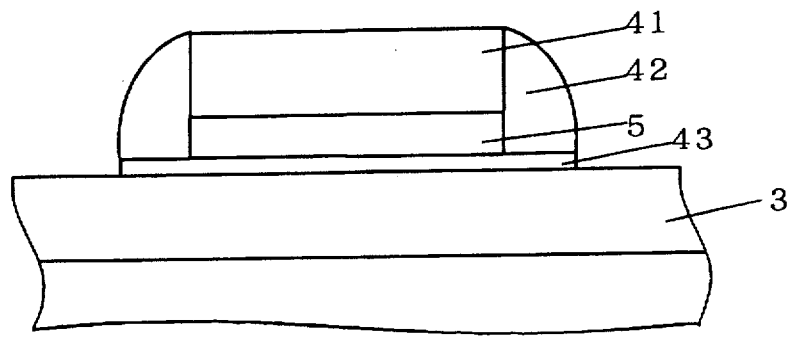
Figure 89:
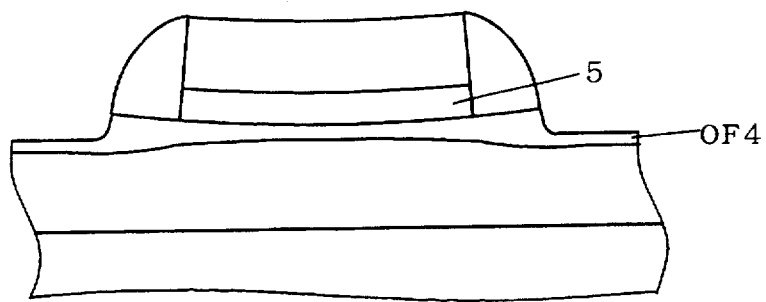
Figure 90:
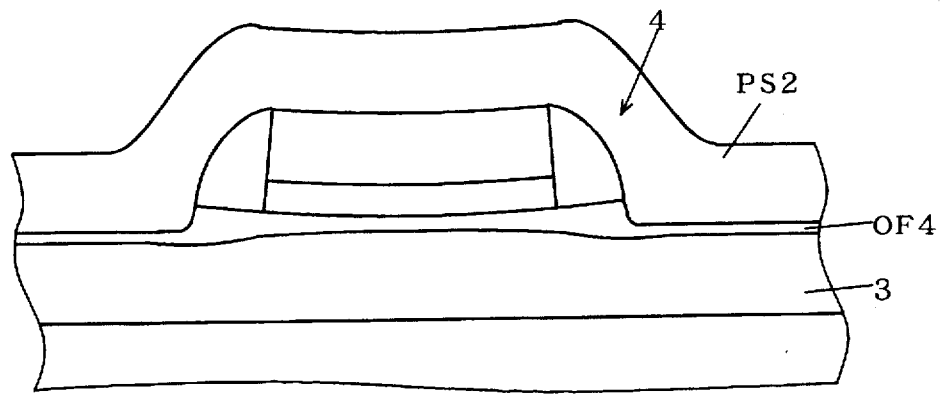
Figure 91:
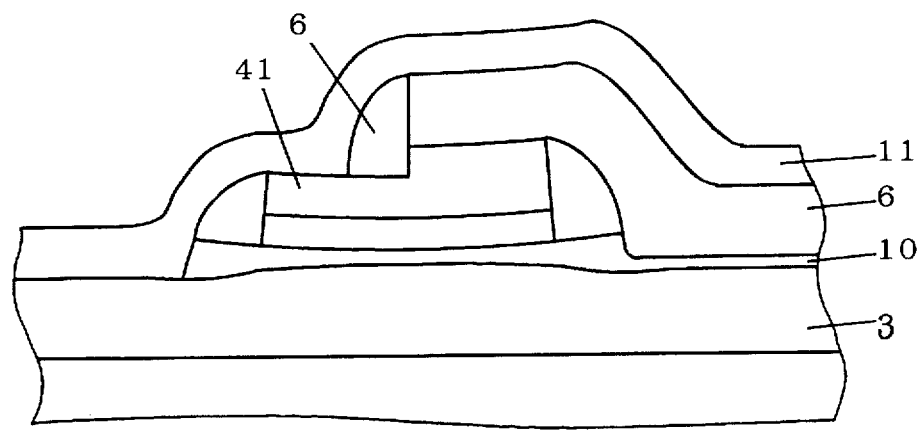
Figure 92:
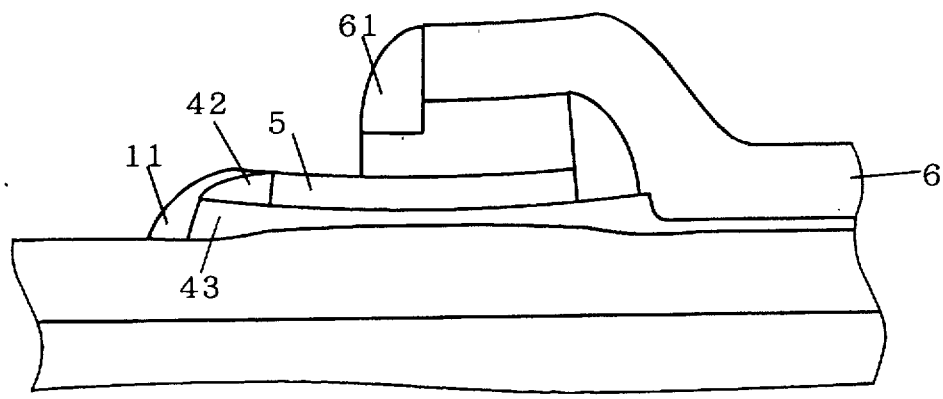
Figure 93:
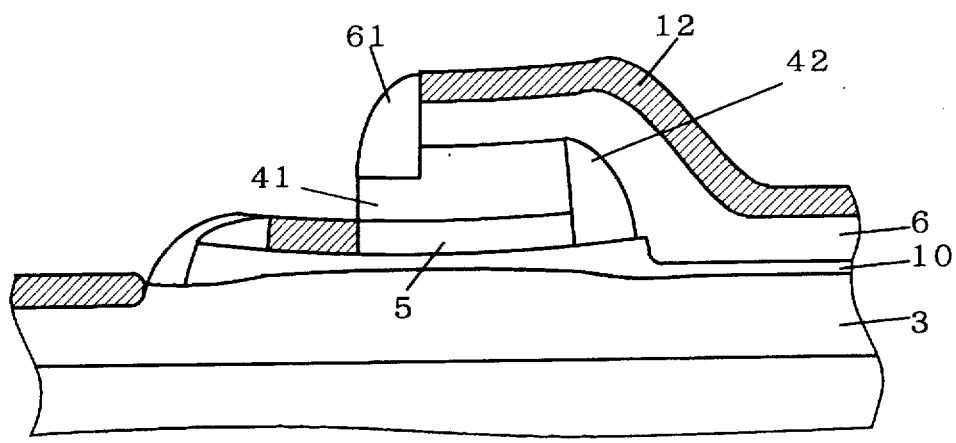
Figure 94:
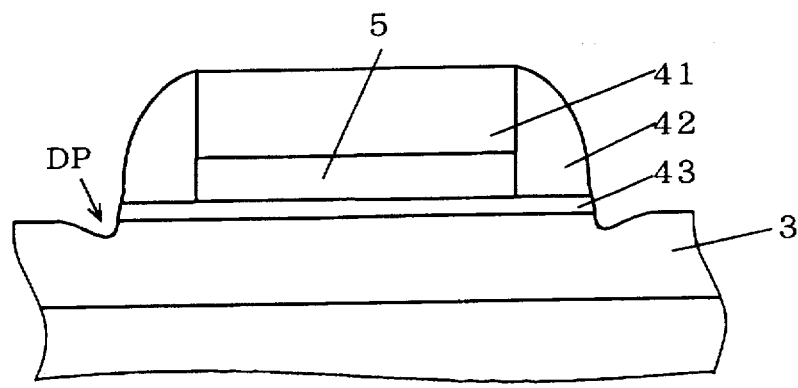
Figure 95:
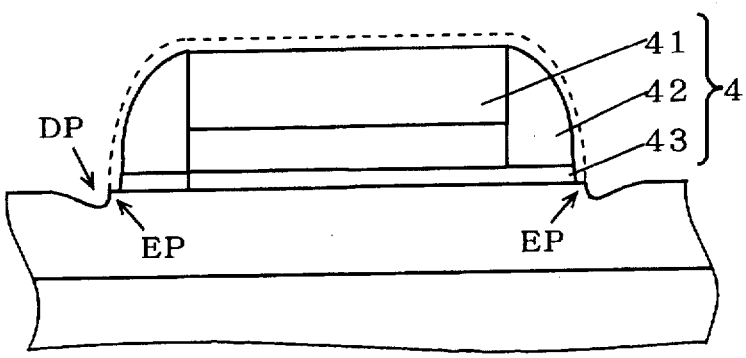
Figure 96:
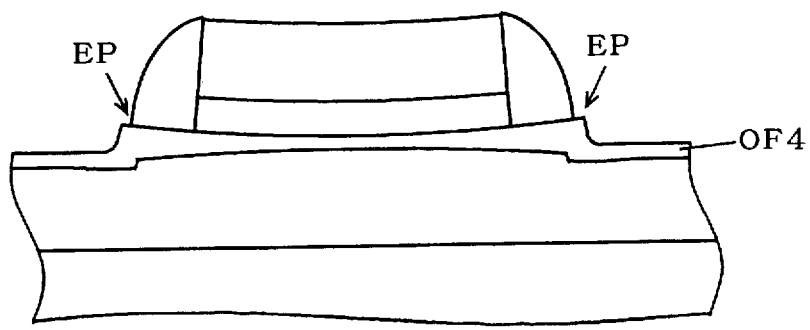
Figure 97:
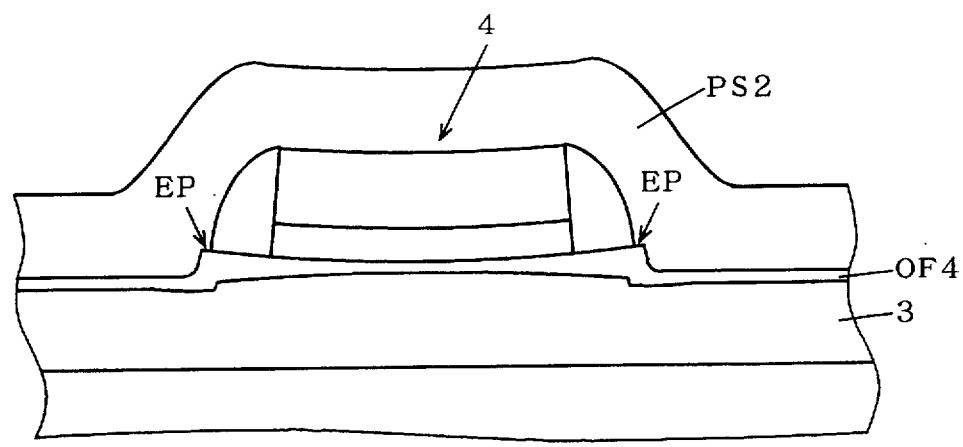
Figure 98:
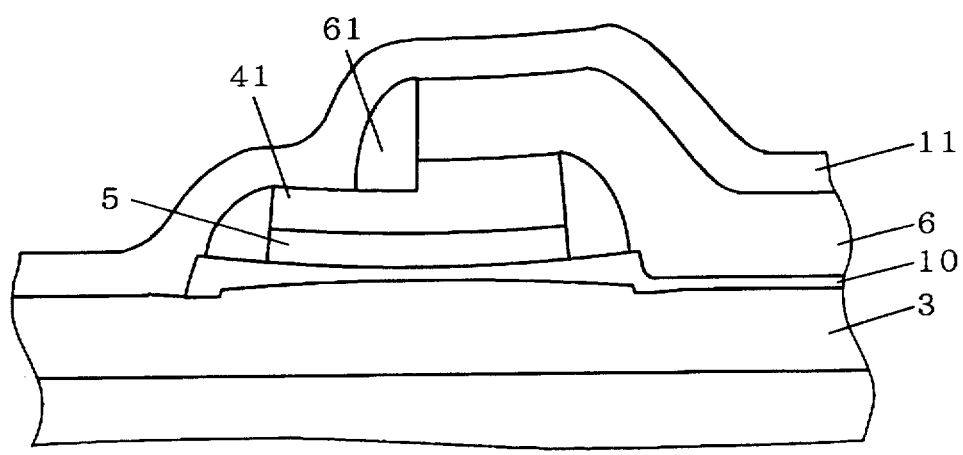
Figure 99:
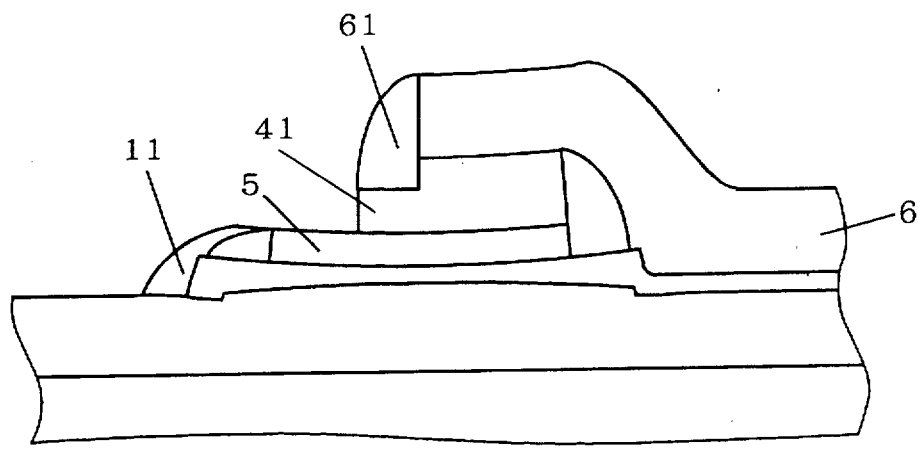
Figure 100:
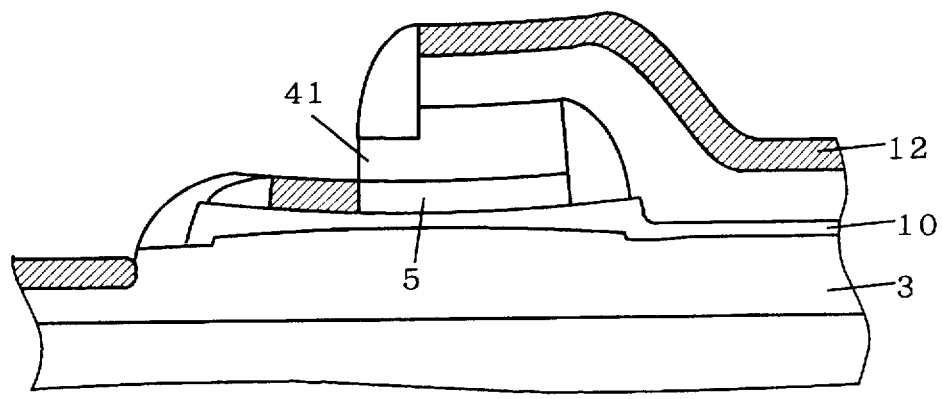
Figure 101:
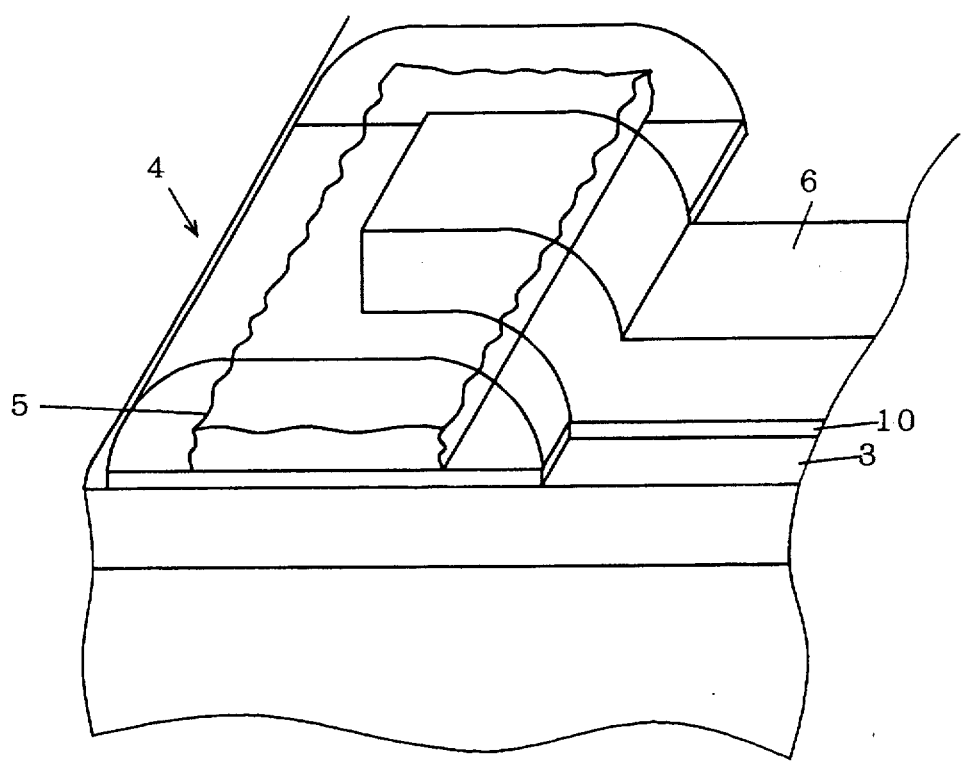
FIG. 101 illustrates a structure of the background-art semiconductor device.

A structure of a semiconductor device with field-shield isolation structure M100 in accordance with the first preferred embodiment of the present invention and its characteristic action and effect will be discussed below, showing steps for manufacturing the semiconductor device with field-shield isolation structure M100 in FIGS. 1 to 9. Since the structure of the semiconductor device M100 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<A-2. Manufacturing Method>

Figure 1:
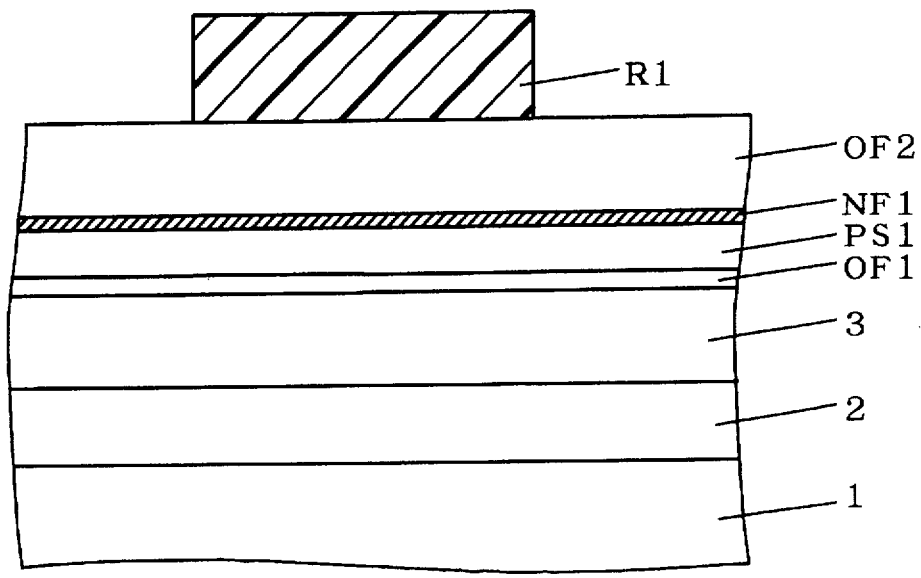
FIGS. 1 to 9 illustrate steps for manufacturing a semiconductor device in accordance with a first preferred embodiment of the present invention.

First, as shown in FIG. 1, the oxide film OF1, the polysilicon layer PS1 doped with an impurity (e.g., phosphorus), an silicon nitride film NF1 and the oxide film OF2 are sequentially formed on the surface of the SOI layer 3 provided on the insulating substrate constituted of the supporting substrate 1 and the buried oxide film 2, and the patterned resist mask R1 is formed on the oxide film OF2. In the following discussion, the silicon oxide film is referred to as an oxide film and the silicon nitride film is referred to as a nitride film.

The oxide film OF1 is formed by thermal oxidation or CVD to have a thickness of 200 Å, the polysilicon layer PS1 is formed by CVD to have a thickness of 500 Å, the silicon nitride film NF1 is formed by CVD to have a thickness of 100 Å and the oxide film OF2 is formed by CVD to have a thickness of 1000 Å. The above thickness of these layers are examples, and the oxide film OFI may have a thickness of 100 to 1000 Å, the polysilicon may have a thickness of 500 to 1000 Å, the silicon nitride film NF1 may have a thickness of 100 to 1000 Å and the oxide film OF2 may have a thickness of 500 to 2000 Å. Further, to obtain the polysilicon layer PSI, a non-doped polysilicon layer is first formed by CVD and then an impurity is injected therein by ion implantation.

With the resist mask R1 used as a mask, the oxide film OF2 is selectively removed by anisotropic etching (dry etching), to form the FS upper oxide film 41.

Figure 2:
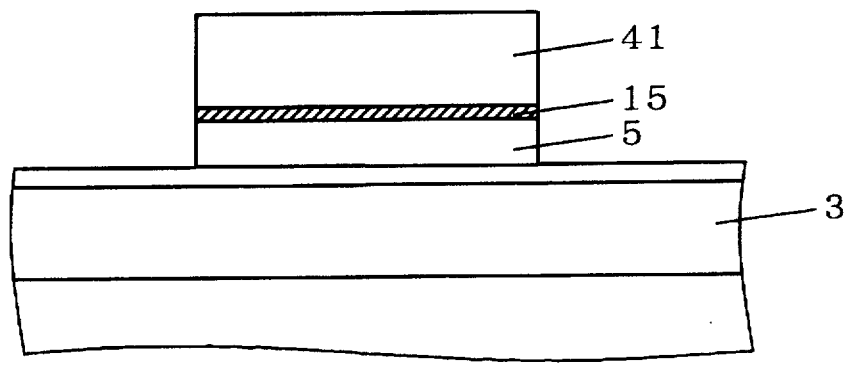

Next, in the step of FIG. 2, the resist mask R1 is removed, and with the FS upper oxide film 41 used as a mask, the nitride film NF1 and the polysilicon layer PS1 are selectively removed by anisotropic etching (dry etching), to form an FS upper nitride film 15 (an oxidation-resistant film) and the FS electrode 5.

Figure 3:
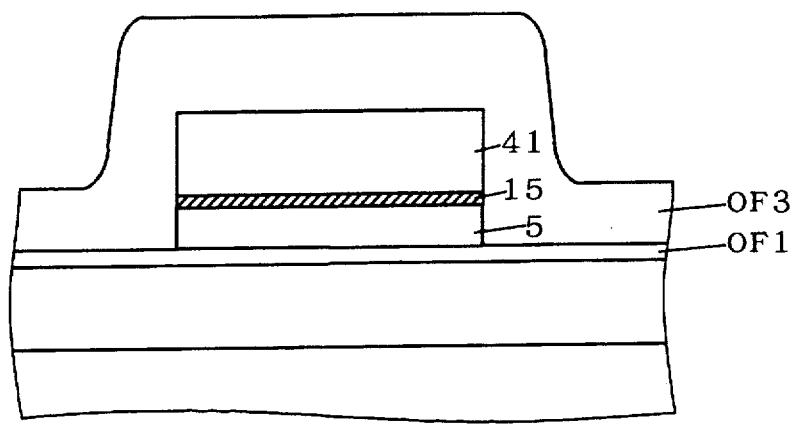

Subsequently, in the step of FIG. 3, the oxide film OF3 is formed by CVD so as to cover the oxide film OF1, the FS upper nitride film 15, the FS upper oxide film 41 and the FS electrode 5. The oxide film OF3 has a thickness of 1500 to 2000 Å.

Figure 4:
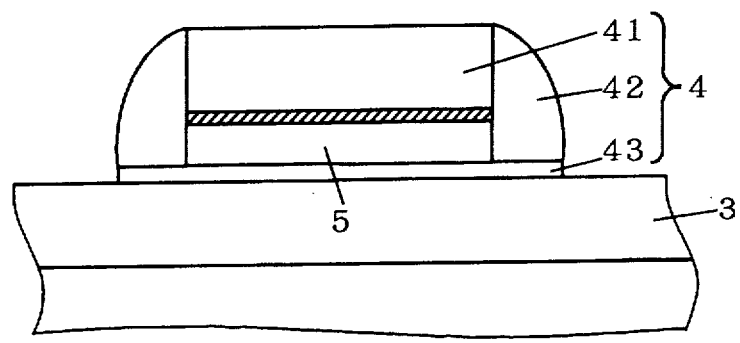

In the step of FIG. 4, the oxide films OF3 and OF1 are removed by anisotropic etching (dry etching), to form the side wall oxide film 42 on side surfaces of the FS upper oxide film 41, the FS upper nitride film 15 and the FS electrode 5, and the oxide film OF1 remains only below the FS electrode 5 and the side wall oxide film 42, becoming the FS gate oxide film 43. The FS upper oxide film 41, the side wall oxide film 42 and the FS gate oxide film 43 constitute the FS insulating layer 4.

Figure 5:
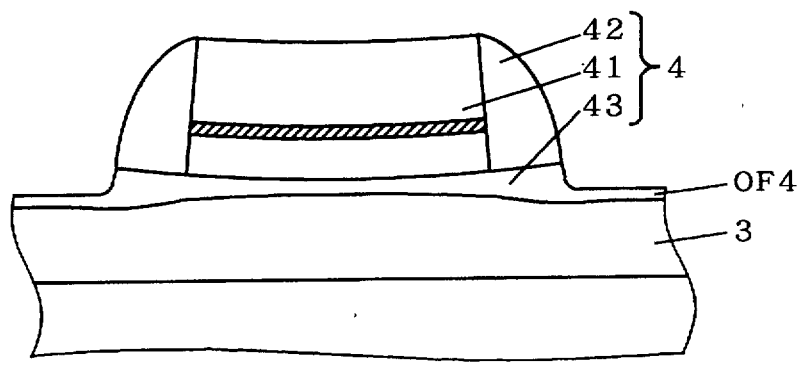

In the step of FIG. 5, the oxide film OF4 which is to become the gate oxide film 10 is formed on the surface of the SOI layer 3 by thermal oxidation. In forming the oxide film OF4, the oxygen used as an oxidant goes through the side wall oxide film 42 and the FS gate oxide film 43 to oxidize an lower surface side of the FS electrode 5, but an upper surface side of the FS electrode 5 is not oxidized since the FS upper nitride film 15 is formed over the upper surface of the FS electrode 5, to cut the rate of decrease in substantial thickness of the FS electrode 5 due to oxidation.

Further, the oxygen reaching the bottom of the FS electrode 5 oxidizes the edge portion of the FS electrode 5 to be warped up. That's because an edge portion is more oxidized and a central portion is less oxidized. Since the oxygen also oxidizes the SOI layer 3 beneath the side wall oxide film 42, the edge portion of the FS gate oxide film 43 becomes thicker.

Figure 6:
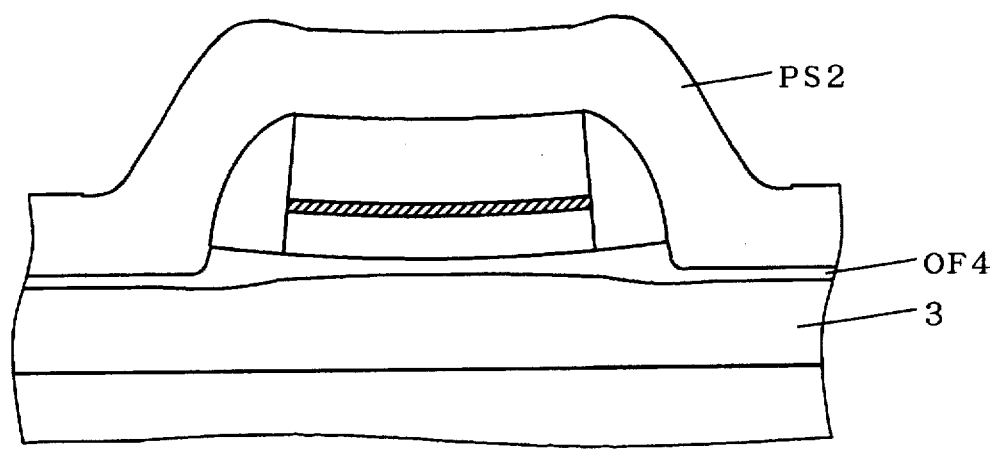

Subsequently, in the step of FIG. 6, the polysilicon layer PS2 which is to become the gate electrode 6 is formed by CVD on the oxide film OF4 and the FS insulating layer 4, to have a thickness of 1000 to 1500 Å.

Figure 7:
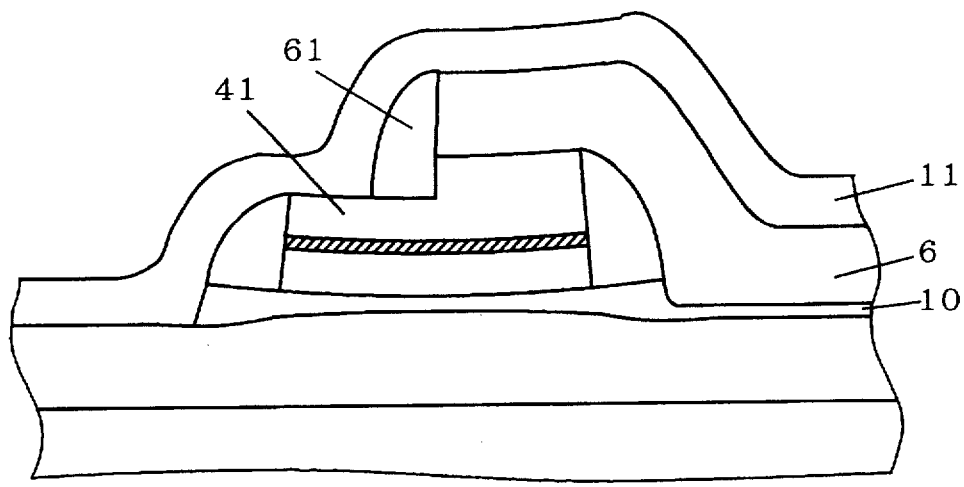

In the step of FIG. 7, the polysilicon layer PS2 is selectively removed by anisotropic etching (dry etching), to form the gate electrode 6. With the gate electrode 6 used as a mask, the oxide film OF4 is selectively removed to form the gate oxide film 10.

At this time, the FS upper oxide film 41 is partially removed by overetching and the FS upper oxide film 41 partially becomes thinner. In this state, side wall oxide films 61 are formed on both sides of the gate electrode 6 to provide a lightly doped drain layer ("LDD layer" hereinafter) in the source/drain layer. Through the steps of forming an oxide film so as to cover the gate electrode 6 and then removing it by anisotropic etching (dry etching), the side wall oxide films 61 are provided, being self-aligned, on the sides of the gate electrode 6. At this time the FS upper oxide film 41 is further removed by overetching.

The silicide-protection film 11 is formed entirely on a portion which does not require formation of a silicide layer. The silicide-protection film 11 is formed on a surface of a source/drain layer of a semiconductor element where forming the silicide layer would cause defective operation. Further discussion will be presented on the silicide-protection film later.

Figure 8:
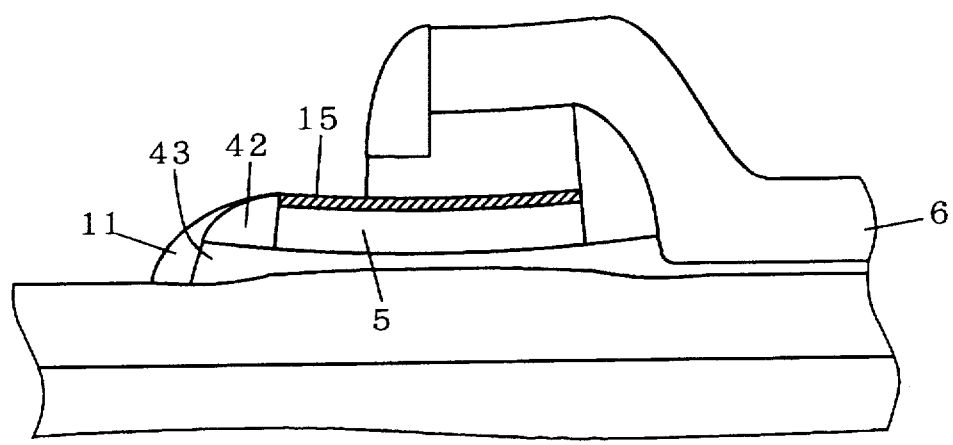

Through the steps of forming an oxide film entirely on the semiconductor substrate and selectively removing the oxide film by anisotropic etching (dry etching), the silicide-protection film 11 is formed so as to cover a surface of a predetermined source/drain layer, and at the same time it is formed, being self-aligned, on the side surface of the FS insulating layer 4 (on the side surfaces of the side wall oxide film 42 and the FS gate oxide film 43), as shown in FIG. 8. In forming the silicide-protection film 11, the FS upper oxide film 41 is further removed by overetching and the FS upper oxide film 41 partially becomes too much thinner.

Since the FS upper nitride film 15 is formed over the upper surface of the FS electrode 5, however, the upper surface of the FS electrode is not exposed even if the FS upper oxide film 41 is partially almost removed.

Figure 9:
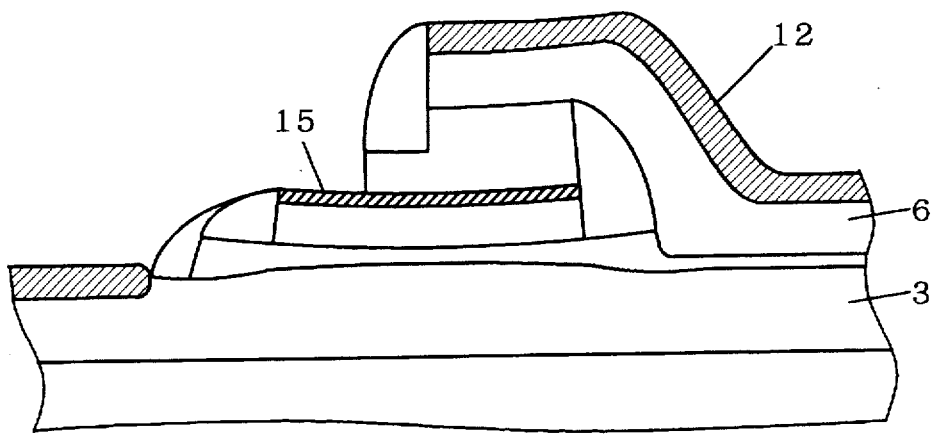

In this state, as shown in FIG. 9, the silicide film 12 is formed, being self-aligned, on the upper surface of the gate electrode 6 and the surface of the not-shown source/drain layer, to have a thickness of e.g., 800 Å. To obtain the silicide film 12, a metal thin film such as cobalt (Co) is deposited on surfaces of the polysilicon layer and the silicon layer and then a heat treatment is performed at the temperature of 700° C. to cause a reaction of the silicon and the metal.

The salicide film 12 may be any of cobalt silicide ($CoSi_2$), titanium silicide ($TiSi_2$), nickel silicide ($NiSi_2$), tungsten silicide ($WSi_2$) or the like.

Since no silicide film is formed on a surface of a nitride film, the silicide film 12 is not formed on a surface of the FS upper nitride film 15, as shown in FIG. 9.

<A-3. Characteristic Action and Effect>

In the semiconductor device M1OO, as discussed above, since the silicide film 12 is not formed on the surface of the FS electrode 5, it is possible to prevent ill effect on the operation characteristics of the semiconductor device due to the exfoliated silicide film 12 which comes into conductive dust to be left on the semiconductor device. Further, it is possible to prevent a break in the FS electrode 5 caused by partial lost of the FS electrode 5 with exfoliation of the silicide film 12.

Furthermore, for prevention of forming the silicide film 12, the film to be formed over the upper surface of the FS electrode 5 is not restricted to a nitride film, and an oxide nitride film (SiON) may be used, for example. A titanium nitride (TiN) film and a tungsten nitride (WN) film may be also used. These films have an action of reducing the resistance value of the FS electrode 5 as being conductive.

<A-4. Modification>

In the first preferred embodiment discussed with reference to FIGS. 1 to 9, the oxide films OF3 and OF1 are removed by anisotropic etching (dry etching) as shown in FIG. 4, but the oxide film OF1 may be removed by wet etching. In this case, forming the FS upper oxide film 41 so as to be smaller in width than the FS upper nitride film 15 and the FS electrode 5 allows the following characteristic action and effect.

Figure 10:
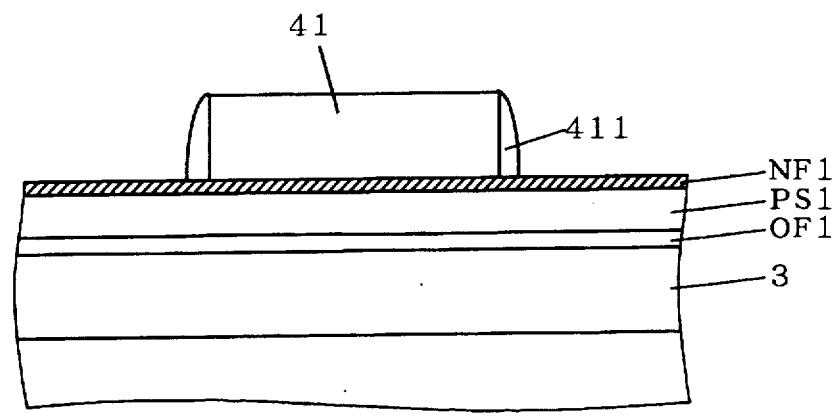
FIGS. 10 to 13 illustrate modified steps for manufacturing the semiconductor device in accordance with the first preferred embodiment of the present invention.

An exemplary step for forming the FS upper oxide film 41 so as to be slightly smaller in width than the FS upper nitride film 15 and the FS electrode 5 is shown in FIG. 10. As is clear from this figure, the FS upper oxide film 41 is formed so as to be slightly smaller in width than the FS upper nitride film 15 and the FS electrode 5 and deposit films 411 are formed on both sides thereof. Then, with the FS upper oxide film 41 and the deposit films 411 used as a mask, the nitride film NF1 and the polysilicon film PS1 are removed. After that, the deposit films 411 are removed, to form the FS upper oxide film 41 which is slightly smaller in width than the FS upper nitride film 15 and the FS electrode 5.

At this time, the deposit film 411 may be intentionally formed, but it is possible to take advantage of the phenomenon that an etchant such as $CF_4$ used in the dry etching for forming the FS upper oxide film 41 is deposited by itself. In other words, if it is known that the etchant should be deposited on the side surfaces of the FS upper oxide film 41 by itself, that can be made use of.

Figure 11:
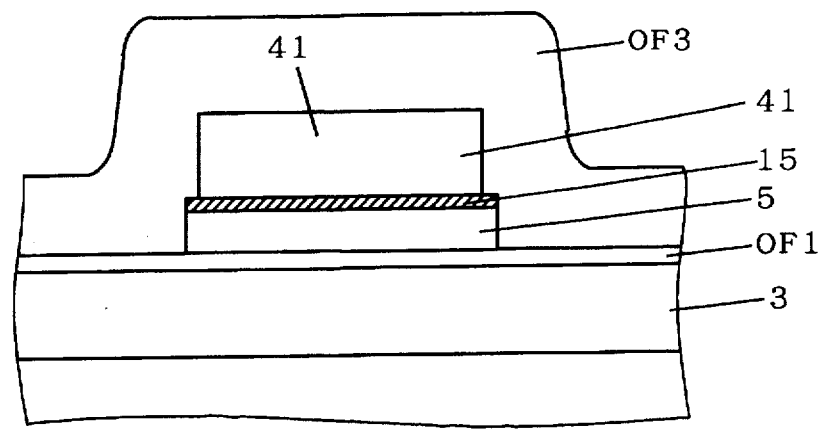

FIG. 11 shows a state where the oxide film OF3 is formed so as to cover the oxide film OF1, the FS upper nitride film 15, the FS upper oxide film 41 and the FS electrode 5.

Figure 12:
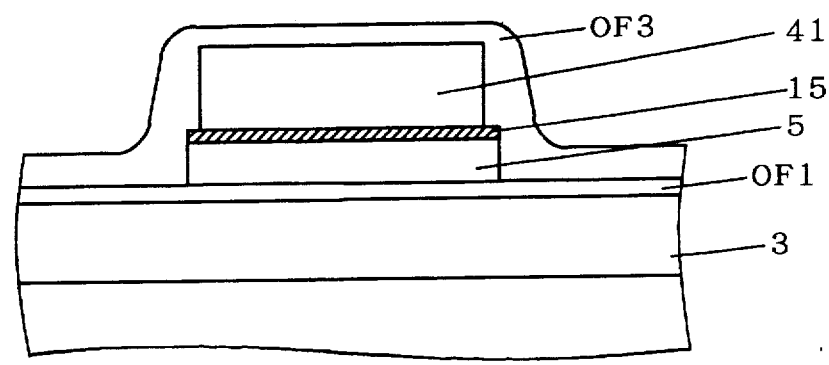

Then, as shown in FIG. 12, the oxide film OF3 is removed to a predetermined thickness by dry etching.

Figure 13:
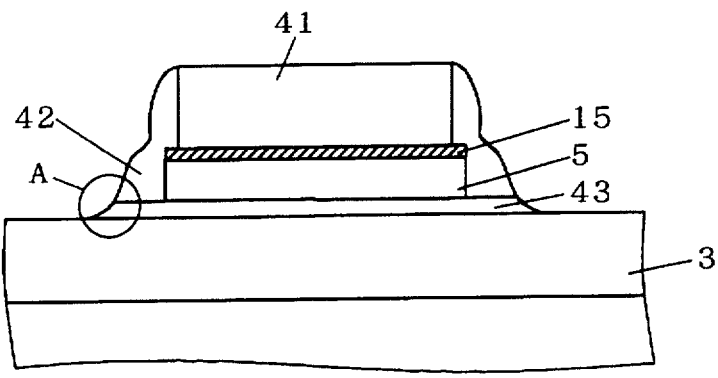

Subsequently, in the step of FIG. 13, the oxide film OF3 is removed by wet etching and together the oxide film OF1 is removed. The wet etching proceeds reversing the step of forming the oxide film 3.

Specifically discussing, the oxide film OF3 grows reflecting the shape of the stepped structure of the FS upper oxide film 41, the FS upper nitride film 15 and the FS electrode 5. Therefore, a contour of the oxide film OF3 has gentle steps. The steps disappears with growth but remains in history. The wet etching reproduces the roughness and gentle steps are created on the surface of the side wall oxide film 42.

Thus, because of gentle steps on the surface of the side wall oxide film 42, better cohesiveness of the polysilicon layer in forming the polysilicon layer which is to become the gate electrode, as discussed with reference to FIG. 6, solves the problem of removing the gate electrode.

Moreover, as shown in a region A of FIG. 13, an edge portion of the FS gate oxide film 43 has a gentle slope, and that is more advantageous in the following point than having a sharp slope. In the later steps of forming the polysilicon layer and selectively etching to form the gate electrode (see FIG. 7), the structure with the gentle slope produces excellent effect of preventing a residue of necessary polysilicon and therefore it can suppress occurrence of a short circuit and avoids deterioration of production yield.

<A-5. Silicide Protection Film>

Figure 14:
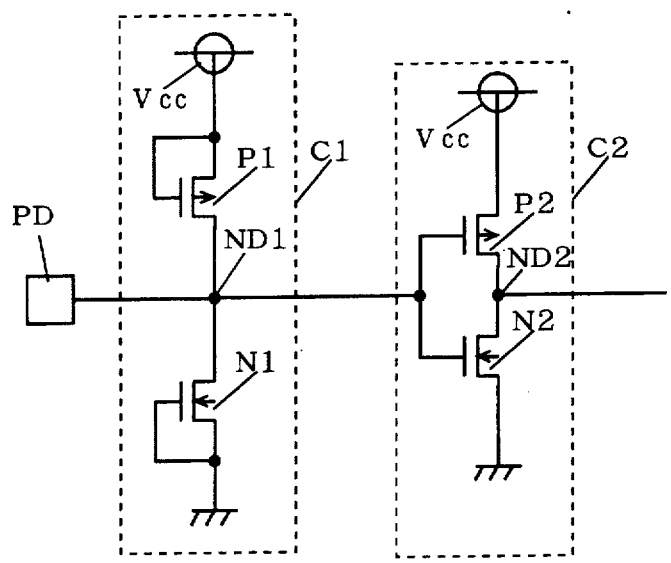
FIGS. 14 to 16 are views used for discussion on a silicide-protection film.

Now, discussion will be presented on the silicide-protection film 11. FIG. 14 shows an inverter circuit C2 and a protective circuit C1 as exemplary semiconductor integrated circuits.

In the protective circuit C1, a P-channel MOS transistor P1 and an N-channel MOS transistor N1 are connected in series to each other and an input pad PD is connected to a node ND1 connecting these MOS transistors. A gate electrode of the P-channel MOS transistor P1 is connected to a power supply potential (Vcc), being always in an OFF-state. A gate electrode of the N-channel MOS transistor N1 is connected to a ground potential, being always in an OFF-state.

In the inverter circuit C2, a P-channel MOS transistor P2 and an N-channel MOS transistor N2 are connected in series to each other and a node ND2 connecting these MOS transistors is connected to another circuit not shown. Gate electrodes of the P-channel MOS transistor P2 and the N-channel MOS transistor N2 are connected to the node ND1 of the protective circuit C1.

Assuming that a surge voltage is inputted through the input pad PD, as the surge voltage is so much higher than an operating voltage of a normal MOS transistor, if the protective circuit C1 is not provided, the surge voltage is applied to the gate electrodes of the P-channel MOS transistor P2 and the N-channel MOS transistor N2 in the inverter circuit C2, raising the possibility of dielectric breakdown in both the gates. When the protective circuit C1 is provided, applying the surge voltage causes a breakdown between the source and drain in the P-channel MOS transistor P1 and the N-channel MOS transistor N1 to produce a current and therefore the surge voltage is not applied to the inverter circuit C2.

The protective circuit C1 operates thus, applying the surge voltage across the source and drain. That's the reason why the silicide-protection film explained below is needed.

Figure 15:
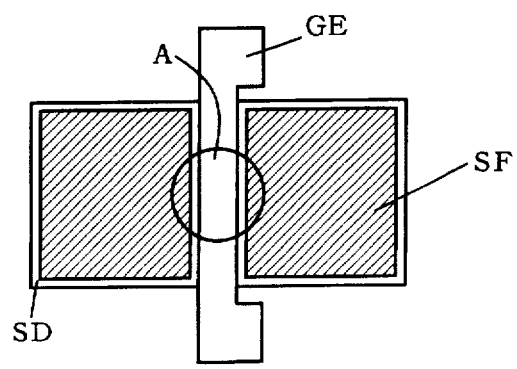

FIG. 15 is a plan view of a MOS transistor. In the MOS transistor, an elongated gate electrode GE is disposed in its center and a source/drain region SD is provided externally on both sides widthwise. In general, a silicide film SF is formed on a surface of the source/drain region SD to reduce a contact resistance between the source/drain region SD and a not-shown contact hole, but the silicide film causes a defect in a MOS transistor including the protective circuit C1.

Figure 16:
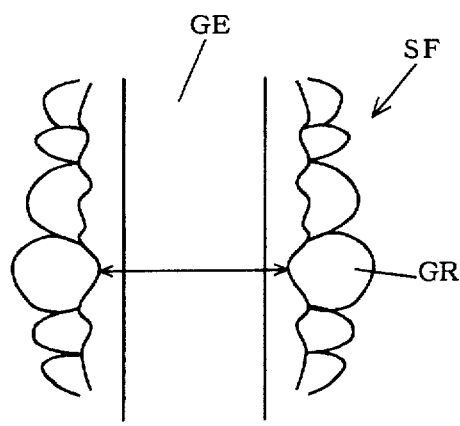

FIG. 16 is an enlarged view of a region A of FIG. 15. The silicide film SF is generally a polycrystal and made of large and small crystal grains GR of silicide. Therefore, the grain boundary has roughness, reflecting the shapes of the grains. An edge portion of the silicide film SF along an edge portion of the gate electrode GE also has roughness, and the crystal grains GR are disposed on the opposite sides of the gate electrode GE as shown in FIG. 16. In this structure, when the surge voltage is applied, a surge current is concentrated between projections (indicated by an arrow) of the crystal grains GR on both sides of the gate electrode GE, and this portion is intensively broken. That causes an operation failure of the MOS transistor and loses the function of a protective circuit. For this reason, instead of the silicide film, the silicide-protection film is formed on the surface of the source/drain region of the protective circuit.

In the semiconductor integrated circuit other than the protective circuit, such as the inverter circuit C2, it is necessary to form the silicide film on the surface of its source/drain region, and the step of removing the silicide-protection film is needed prior to forming the silicide film, as discussed earlier.

<B. The Second Preferred Embodiment>

<B-1. Device Structure>

A structure of a semiconductor device with field-shield isolation structure M200 in accordance with the second preferred embodiment of the present invention and its characteristic action and effect will be discussed below, showing steps for manufacturing the semiconductor device with field-shield isolation structure M200 in FIGS. 17 to 24. Since the structure of the semiconductor device M200 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<B-2. Manufacturing Method>

Figure 17:
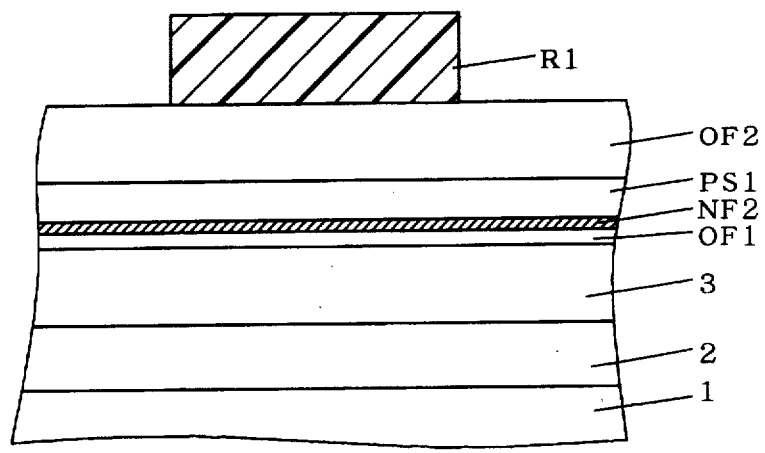
FIGS. 17 to 24 illustrate steps for manufacturing a semiconductor device in accordance with a second preferred embodiment of the present invention.

First, as shown in FIG. 17, the oxide film OF1, a nitride film NF2, the polysilicon layer PS1 doped with an impurity (e.g., phosphorus) and the oxide film OF2 are sequentially formed on the surface of the SOI layer 3 provided on the insulating substrate constituted of the supporting substrate 1 and the buried oxide film 2, and the patterned resist mask R1 is formed on the oxide film OF2.

The nitride film NF2 is formed by CVD to have a thickness of 200 Å. The thicknesses and the formation methods of the oxide film OF1, the polysilicon layer PS1 and the oxide film OF2 are the same as those of the first preferred embodiment, and not discussed herein.

Figure 18:
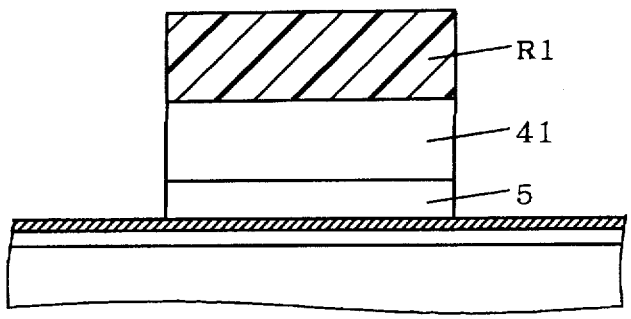

In the step of FIG. 18, with the resist mask R1 used as a mask, the oxide film OF2 is selectively removed by anisotropic etching (dry etching), to form the FS upper oxide film 41.

Next, the resist mask R1 is removed, and with the FS upper oxide film 41 used as a mask, the polysilicon layer PS1 is selectively removed by anisotropic etching (dry etching), to form the FS electrode 5.

Figure 19:
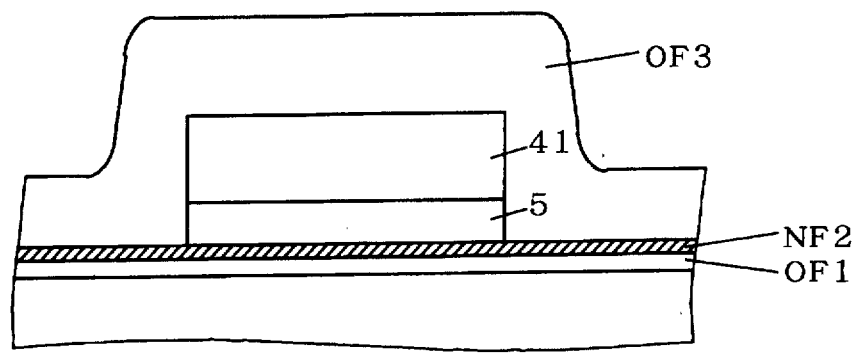

Subsequently, in the step of FIG. 19, the oxide film OF3 is formed by CVD so as to cover the nitride film NF2, the FS upper oxide film 41 and the FS electrode 5. The oxide film OF3 has a thickness of 1500 to 2000 Å.

Figure 20:
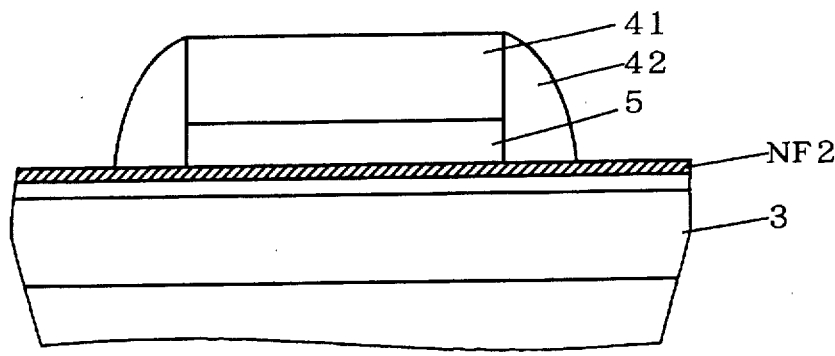

In the step of FIG. 20, the oxide film OF3 is removed by anisotropic etching (dry etching), to form the side wall oxide film 42 on the side surfaces of the FS upper oxide film 41 and the FS electrode 5.

Next, in the step of FIG. 21, the nitride film NF2 is etched so as to be left only below the FS electrode 5 and the side wall oxide film 42, becoming an FS lower nitride film 16 (an oxidation-resistant film). To etch the nitride film NF2, the wet etching with thermal phosphoric acid, for example, is performed, and therefore an edge portion of the FS lower nitride film 16 is slightly retracted from an edge portion of the side wall oxide film 42 by overetching.

Figure 22:
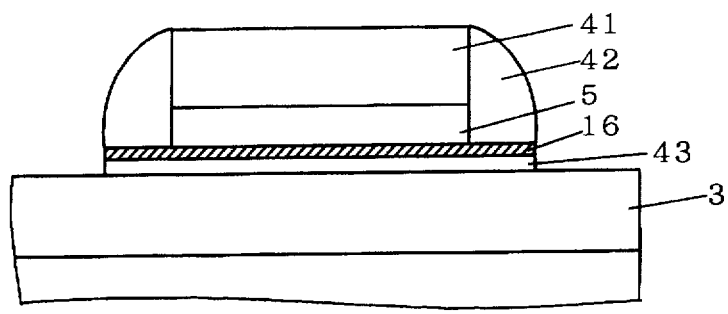

In the step of FIG. 22, the oxide film OF1 is etched so as to be left only below the FS lower nitride film 16, becoming the FS gate oxide film 43. To etch the oxide film OF1, the wet etching with hydrofluoric acid (HF), for example, is performed, and therefore an edge portion of the FS gate oxide film 43 may be retracted from the edge portion of the FS lower nitride film 16 by overetching (not illustrated). Furthermore, the wet etching should be completed in as short time as possible lest unnecessary polysilicon layer remains as a residue because of much retraction in the later step of forming the gate electrode. For that, the thickness of the oxide film OF1 should be half of that of the nitride film NF2, e.g., about 100 Å.

Figure 23:
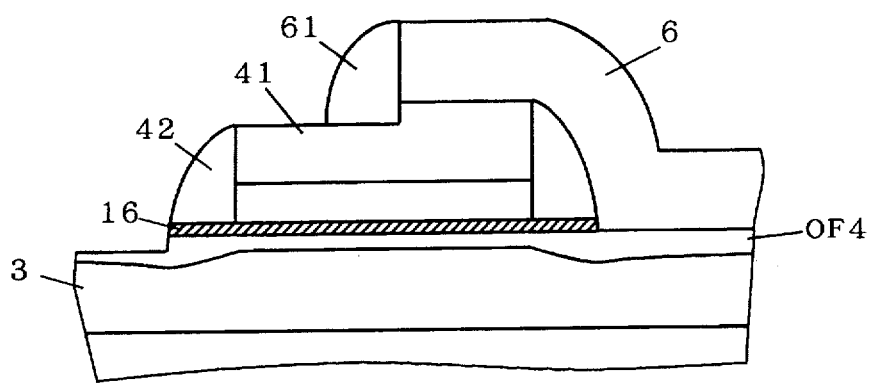

In the step of FIG. 23, the oxide film OF4 which is to become the gate oxide film 10 is formed on the surface of the SOI layer 3 by thermal oxidation. In forming the oxide film OF4, the oxygen used as an oxidant goes through the side wall oxide film 42 and the FS gate oxide film 43, but the lower surface side of the FS electrode 5 is not oxidized since the FS lower nitride film 16 is formed below the lower surface of the FS electrode 5, to cut the rate of decrease in substantial thickness of the FS electrode 5 due to oxidation. Further, since the edge portion of the FS electrode 5 is not oxidized, it is possible to prevent the FS electrode 5 from being warped up.

Since the SOI layer 3 below the side wall oxide film 42 is oxidized less easily than the FS electrode 5 and the FS lower nitride film 16 extends below the side wall oxide film 42, there is less increase in thickness of the edge portion of the FS gate oxide film 43.

Subsequently, the polysilicon layer PS2 which is to become the gate electrode 6 is formed by CVD on the oxide film OF4 and the FS insulating layer 4, the polysilicon layer PS2 is selectively removed by anisotropic etching (dry etching), to form the gate electrode 6. Then, with the gate electrode 6 used as a mask, the oxide film OF4 is selectively removed to form the gate oxide film 10.

At this time, the FS upper oxide film 41 is partially removed by overetching and the FS upper oxide film 41 partially becomes thinner. In this state, side wall oxide films 61 are formed on both sides of the gate electrode 6 to provide an LDD layer in the source/drain layer. Through the steps of forming an oxide film so as to cover the gate electrode 6 and then removing it by anisotropic etching (dry etching), the side wall oxide films 61 are provided, being self-aligned, on the sides of the gate electrode 6, as shown in FIG. 23. At this time the FS upper oxide film 41 is further removed by overetching.

Figure 24:
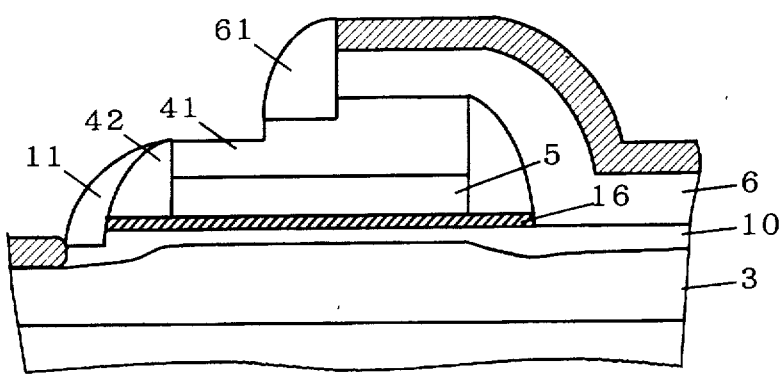

The silicide-protection film 11 is formed entirely. Then, the silicide-protection film 11 is selectively removed by anisotropic etching (dry etching), to cover a surface of a predetermined source/drain layer, and is formed, being self-aligned, on side surfaces of the side wall oxide film 42, the FS lower nitride film 16 and the FS gate oxide film 43, as shown in FIG. 24. When the silicide-protection film 11 is formed, the FS upper oxide film 41 is further removed by overetching, but there is no case where the FS upper oxide film 41 partially becomes too much thinner or it is partially almost removed since the FS electrode 5 is even.

In this state, the silicide film 12 is formed, being self-aligned, to have a thickness of e.g., 800 Å, on the upper surface of the gate electrode 6 and the surface of the not-shown source/drain layer. Since no silicide film is formed on a surface of an oxide film, the silicide film 12 is not formed on the surface of the FS electrode 5.

<B-3. Characteristic Action and Effect>

In the semiconductor device M200, as discussed above, since the silicide film 12 is not formed on the surface of the FS electrode 5, it is possible to prevent ill effect on the operation characteristics of the semiconductor device due to the exfoliated silicide film 12 which comes into conductive dust to be left on the semiconductor device. Further, it is possible to prevent a break in the FS electrode 5 caused by partial lost of the FS electrode 5 with exfoliation of the silicide film 12.

<B-4. Modification>

Figure 21:
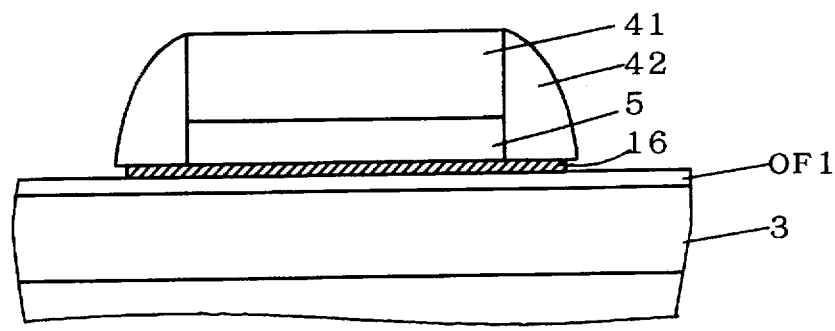

In the second preferred embodiment discussed with reference to FIGS. 17 to 24, the oxide film OF3 is removed by anisotropic etching (dry etching) and the nitride film NF2 and the oxide film OF1 are removed by wet etching, as shown in FIGS. 21 and 22. In this case, forming the FS upper oxide film 41 so as to be smaller in width than the FS electrode 5 allows the following characteristic action and effect.

The step for forming the FS upper oxide film 41 so as to be slightly smaller in width than the FS electrode 5 was discussed with reference to FIG. 10 in the first preferred embodiment, so redundant discussion will be omitted.

Figure 25:
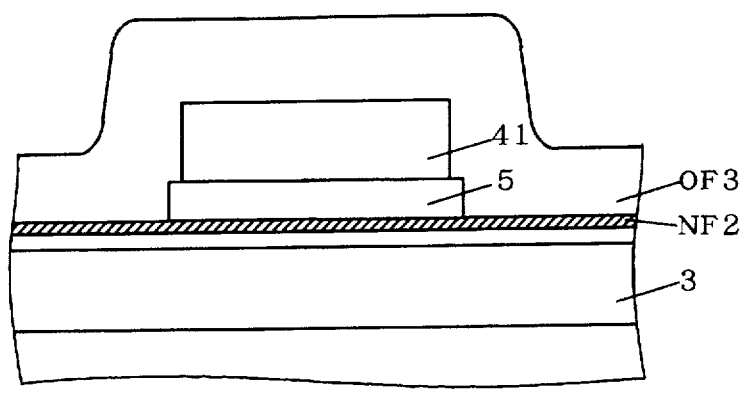
FIGS. 25 to 28 illustrate modified steps for manufacturing the semiconductor device in accordance with the second preferred embodiment of the present invention.

FIG. 25 shows a state where the oxide film OF3 is formed so as to cover the nitride film NF2, the FS upper oxide film 41 and the FS electrode 5.

Figure 26:
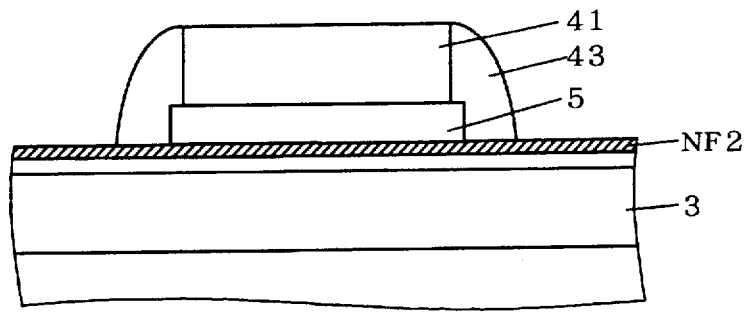

Then, as shown in FIG. 26, the oxide film OF3 is removed to a predetermined thickness by dry etching.

Figure 27:
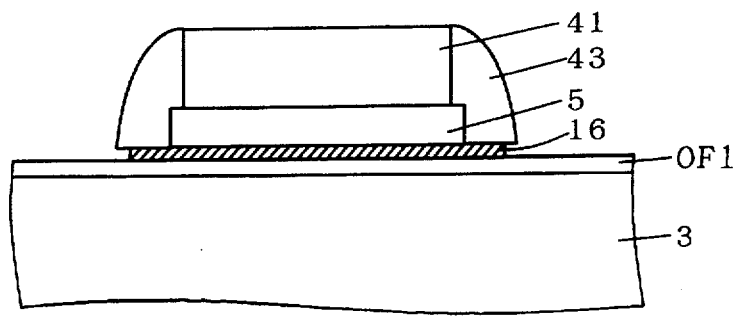

Subsequently, in the step of FIG. 27, the nitride film NF2 is etched so as to be left only below the FS electrode 5 and the side wall oxide film 42, becoming the FS lower nitride film 16. To etch the nitride film NF2, the wet etching with thermal phosphoric acid, for example, is performed, and therefore the edge portion of the FS lower nitride film 16 is slightly retracted from the edge portion of the side wall oxide film 42 by overetching.

Figure 28:
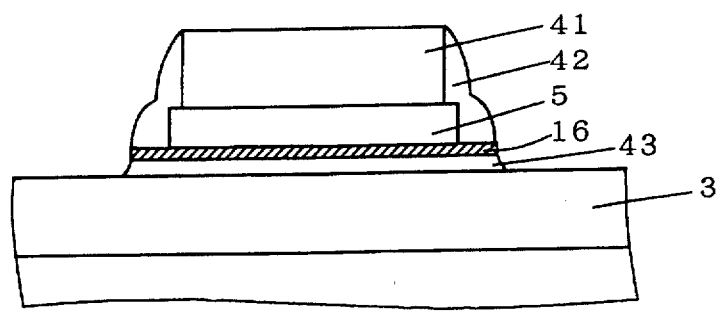

In the step of FIG. 28, the oxide film OF1 is etched so as to be left only below the FS lower nitride film 16, becoming the FS gate oxide film 43. To etch the oxide film OF1, the wet etching with hydrofluoric acid (HF), for example, is performed, and therefore the edge portion of the FS gate oxide film 43 may be retracted from the edge portion of the FS lower nitride film 16 by overetching (not illustrated).

The wet etching of the oxide film proceeds reversing the step of forming the oxide film 3. This was discussed in the first preferred embodiment, so redundant discussion will be omitted. Through the wet etching of the oxide film, gentle steps are created on the surface of the side wall oxide film 42, reflecting a stepped structure due to the difference in width between the FS upper oxide film 41 and the FS electrode 5.

Thus, because of gentle steps on the surface of the side wall oxide film 42, better cohesiveness of the polysilicon layer in forming the polysilicon layer which is to become the gate electrode, as discussed with reference to FIG. 23, solves the problem of removing the gate electrode.

<C. The Third Preferred Embodiment>

<C-1. Device Structure>

A structure of a semiconductor device with field-shield isolation structure M300 in accordance with the third preferred embodiment of the present invention and its characteristic action and effect will be discussed below, showing steps for manufacturing the semiconductor device with field-shield isolation structure M300 in FIGS. 29 to 38. Since the structure of the semiconductor device M300 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<C-2. Manufacturing Method>

Figure 29:
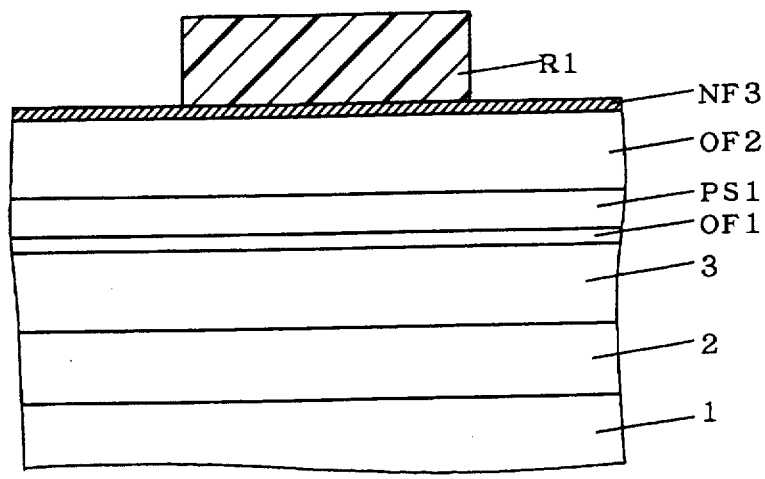
FIGS. 29 to 38 illustrate steps for manufacturing a semiconductor device in accordance with a third preferred embodiment of the present invention.

First, as shown in FIG. 29, the oxide film OF1, the polysilicon layer PS1 doped with an impurity (e.g., phosphorus), the oxide film OF2 and a nitride film NF3 are sequentially formed on the surface of the SOI layer 3 provided on the insulating substrate constituted of the supporting substrate 1 and the buried oxide film 2, and the patterned resist mask R1 is formed on the nitride film NF3.

The oxide film OF1 is formed by thermal oxidation or CVD to have a thickness of 200 Å, the polysilicon layer PS1 is formed by CVD to have a thickness of 500 Å, the oxide film OF2 is formed by CVD to have a thickness of about 1000 Å and the nitride film NF3 is formed by CVD to have a thickness of about 100 Å. The above thickness of these layers are examples, and the nitride film NF3 may have a thickness of 100 to 1000 Å. The thickness of the other films was discussed in the first preferred embodiment, so redundant discussion will be omitted.

Figure 30:
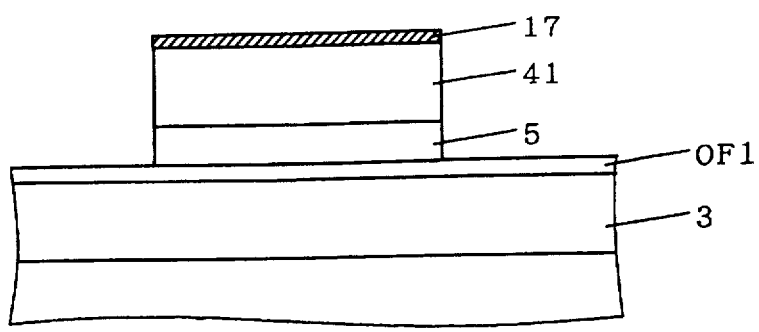

In the step of FIG. 30, with the resist mask R1 used as a mask, the oxide film OF3, the oxide film OF2 and the polysilicon layer PS1 are selectively removed by anisotropic etching (dry etching), to form a cap nitride film 17 (the first oxidation-resistant film), the FS upper oxide film 41 and the FS electrode 5.

Figure 31:
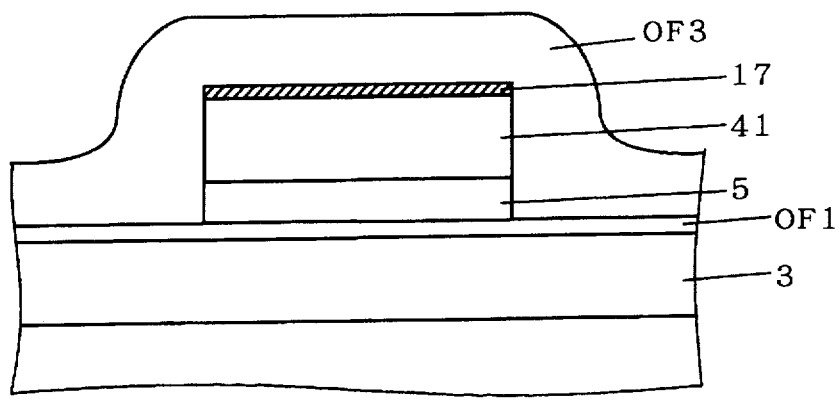

Next, the resist mask R1 is removed, and in the step of FIG. 31, the oxide film OF3 is formed by CVD so as to cover the oxide film OF1, the cap nitride film 17, the FS upper oxide film 41 and the FS electrode 5. The oxide film OF3 has a thickness of 1500 to 2000 Å.

Figure 32:
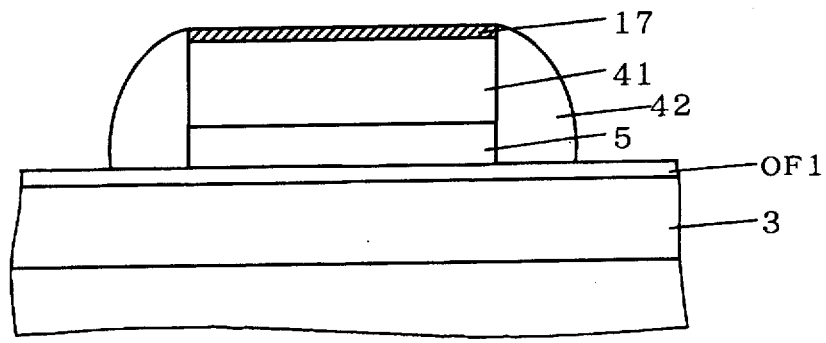

In the step of FIG. 32, the oxide film OF3 is removed by anisotropic etching (dry etching), to form the side wall oxide film 42 on side surfaces of the cap nitride film 17, the FS upper oxide film 41 and the FS electrode 5.

Further, the side wall oxide film 42 becomes thicker by the thickness of the cap nitride film 17, obtaining an etch margin for the etching of the oxide film OF1 as discussed below.

Figure 33:
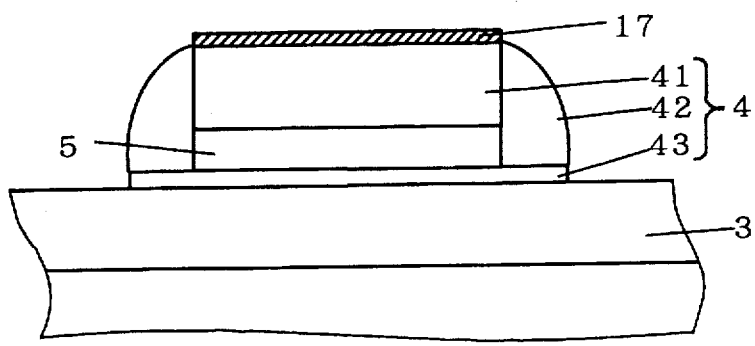

After that, in the step of FIG. 33, the oxide film OF1 is removed. The oxide film OF1 also serves as a protective film for protection of the source/drain region from exposure to the plasma of the dry etching, and is removed by wet etching with buffered hydrofluoric acid (HF). Through this step, the oxide film OF1 remains only below the FS electrode 5 and the side wall oxide film 42, becoming the FS gate oxide film 43. The FS upper oxide film 41, the side wall oxide film 42 and the FS gate oxide film 43 constitute the FS insulating layer 4.

Since the oxide films OF3 and OF1 are etched with buffered HF and a nitride film, i.e., the cap nitride film 17 is little etched with buffered HF, the thickness of the FS upper oxide film 41 does not decrease. Therefore, it is possible to prevent an increase of parasitic capacitance between the gate electrode 6 formed on the FS upper oxide film 41 and the FS electrode 5 in the later steps and to sufficiently keep the electrical isolation between the gate electrode 6 and the FS electrode 5.

Though the side wall oxide film 42 becomes slightly thinner, the side wall oxide film 42 has a proper thickness after this etching since it is originally formed thicker by the thickness of the cap nitride film 17. Further, by retraction of the side wall oxide film 42, the cap nitride film 17 protrudes on an upper surface of the FS upper oxide film 41.

The buffered HF (hydrofluoric acid) is a mixed aqueous solution of hydrogen fluoride (HF) and ammonium fluoride ($NH_4F$) and provides more stable etching rate for a silicon oxide film than dilute hydrofluoric acid.

Figure 34:
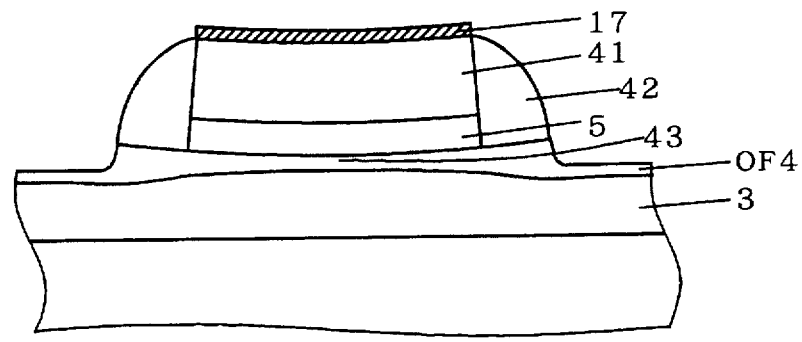

In the step of FIG. 34, the oxide film OF4 which is to become the gate oxide film 10 is formed on the surface of the SOI layer 3 by thermal oxidation. In forming the oxide film OF4, the oxygen used as an oxidant goes through the side wall oxide film 42 and the FS gate oxide film 43 to oxidize the lower surface of the FS electrode 5, but the upper surface of the FS electrode 5 is less oxidized since the cap nitride film 17 is formed over an upper surface of the FS upper oxide film 41 to block the oxidant entering the upper surface of the FS upper oxide film 41, to cut the rate of decrease in substantial thickness of the FS electrode 5 due to oxidation.

Further, the oxygen reaching the bottom of the FS electrode 5 oxidizes the edge portion of the FS electrode 5 to be warped up. That's because an edge portion is more oxidized and a central portion is less oxidized. Since the oxygen also oxidizes the SOI layer 3 beneath the side wall oxide film 42, the edge portion of the FS gate oxide film 43 becomes thicker.

Figure 35:
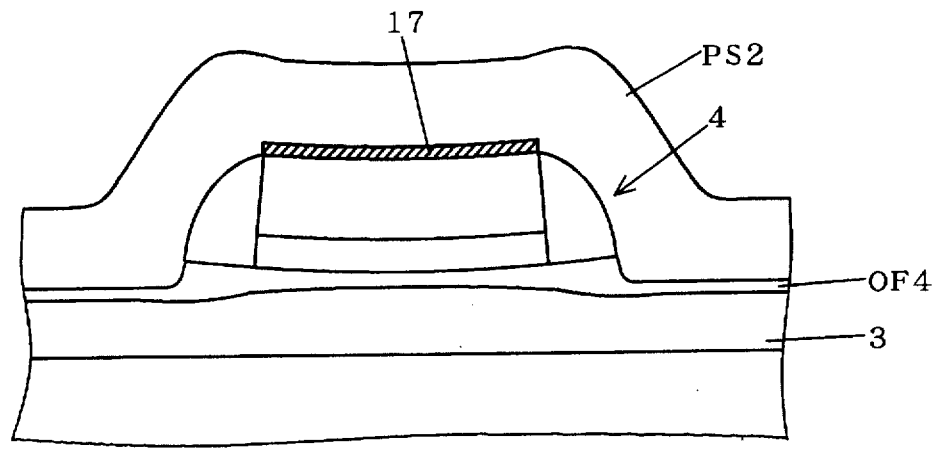

Subsequently, in the step of FIG. 35, the polysilicon layer PS2 which is to become the gate electrode 6 is formed by CVD on the oxide film OF4, the cap nitride film 17 and the FS insulating layer 4, to have a thickness of 1000 to 1500 Å.

Figure 36:
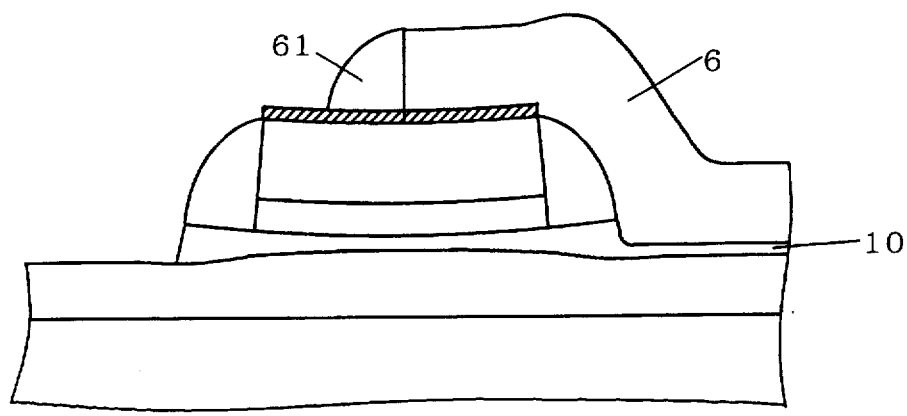

In the step of FIG. 36, the polysilicon layer PS2 is selectively removed by anisotropic etching (dry etching), to form the gate electrode 6. At this time, the etching condition is determined so that the etching rate for the polysilicon layer PS2 may be greater than that for the cap nitride film 17. For example, choosing appropriate temperature and kind of gas for the etching prevents etching of the cap nitride film 17 and by extension, prevents etching of the FS upper oxide film 41.

Subsequently, with the gate electrode 6 used as a mask, the oxide film OF4 is selectively removed to form the gate oxide film 10.

Next, the side wall oxide films 61 are formed on both sides of the gate electrode 6 to provide an LDD layer in the source/drain layer. Through the steps of forming an oxide film so as to cover the gate electrode 6 and then removing it by anisotropic etching (dry etching), the side wall oxide films 61 are provided, being self-aligned, on the sides of the gate electrode 6.

At this time, the etching condition is determined so that the etching rate for the oxide film may be greater than that for the cap nitride film 17. For example, choosing fluorine-contained gas as etching gas prevents etching of the cap nitride film 17 and by extension, prevents etching of the FS upper oxide film 41.

Figure 37:
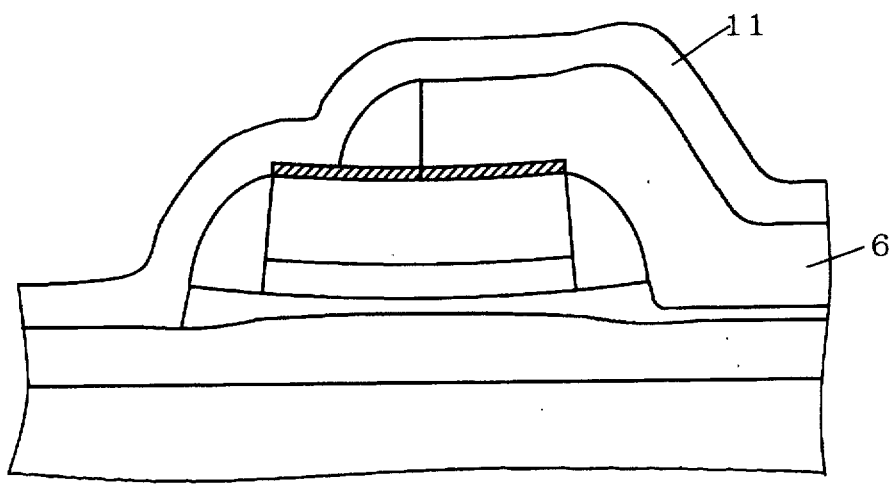
Figure 38:
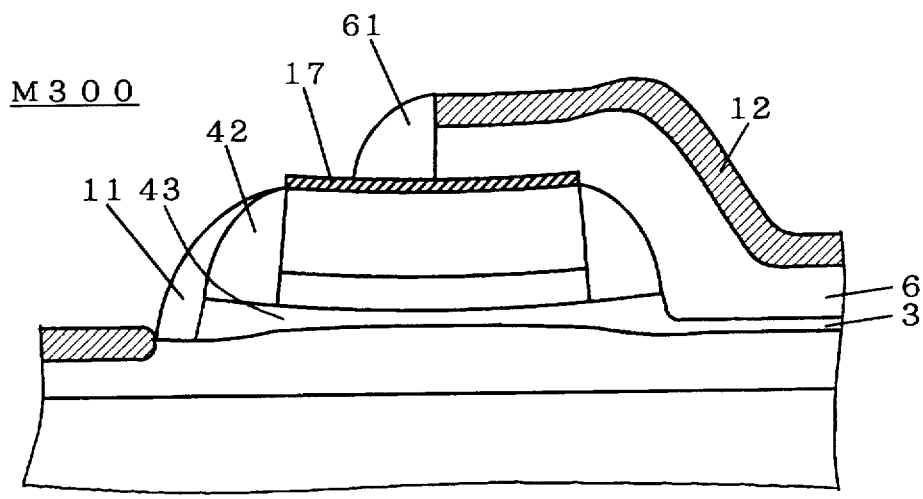

In the step of FIG. 37, the silicide-protection film 11 is formed entirely. Through the steps of forming an oxide film entirely on the substrate and then selectively removing it by anisotropic etching (dry etching), the silicide-protection film 11 is provided so as to cover a surface of a predetermined source/drain layer, and at the same time it is formed, being self-aligned, on sides of the FS insulating layer 4 (the side wall oxide film 42 and the FS gate oxide film 43) as shown in FIG. 38. When the silicide-protection film 11 is formed, choosing the etching condition so that the etching rate for the oxide film may be greater than that for the cap nitride film 17 prevents etching of the cap nitride film 17 and by extension, prevents etching of the FS upper oxide film 41.

In this state, the silicide film 12 is formed, being self-aligned, to have a thickness of e.g., 800 Å, on the upper surface of the gate electrode 6 and the surface of the not-shown source/drain layer, but since the cap nitride film 17 is formed on the upper surface of the FS upper oxide film 41 and there is no case where the FS upper oxide film 41 is partially removed to expose the surface of the FS electrode 5, the silicide film 12 is not formed on the upper surface of the FS electrode 5.

To obtain the silicide film 12, a metal thin film such as cobalt (Co) is deposited on surfaces of the polysilicon layer and the silicon layer and then a heat treatment is performed at the temperature of 700° C. to cause a reaction of the silicon and the metal.

<C-3. Characteristic Action and Effect>

In the semiconductor device M300, as discussed above, forming the cap nitride film 17 on the upper surface of the FS upper oxide film 41 avoids a decrease in thickness of the FS upper oxide film 41. As a result, it is possible to prevent an increase of parasitic capacitance between the gate electrode 6 and the FS electrode 5 and degradation of operating speed of the device. Moreover, sufficient electrical isolation between the gate electrode 6 and FS electrode 5 prevents a short circuit between these electrodes.

Provision of the cap silicide film 17 blocks the oxidant entering the upper surface side of the FS upper oxide film 41, to cut the rate of oxidation of the upper surface side of the FS electrode 5. That cuts the rate of decrease in substantial thickness of the FS electrode 5 due to oxidation, to control an increase in electrical resistance.

Moreover, in the semiconductor device M300, since the silicide film 12 is not formed on the surface of the FS electrode 5, it is possible to prevent ill effect on the operation characteristics of the semiconductor device due to the exfoliated silicide film 12 which comes into conductive dust to be left on the semiconductor device. Further, it is possible to prevent a break in the FS electrode 5 caused by partial lost of the FS electrode 5 with exfoliation of the silicide film 12 and sufficient field-shield isolation effect is achieved when the device operates.

<C-4. Modification>

In the third preferred embodiment discussed with reference to FIGS. 29 to 38, a nitride film is used as the cap nitride film 17. Instead of the oxide film, an oxide nitride film (SiON) may be used to produce the same action and effect as the above example.

The oxide nitride film is an insulator having a property intermediate between $SiO_2$ and $Si_3N_4$, and is formed by CVD or thermal oxidation of $Si_3N_4$.

<D. The Fourth Preferred Embodiment>

<D-1. Device Structure>

A structure of a semiconductor device with field-shield isolation structure M400 in accordance with the fourth preferred embodiment of the present invention and its characteristic action and effect will be discussed below, showing steps for manufacturing the semiconductor device with field-shield isolation structure M400 in FIGS. 39 to 42. Since the structure of the semiconductor device M400 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

The same elements as those in the third preferred embodiment discussed with reference to FIGS. 29 to 38 are given the same reference signs and duplicate discussion will be omitted.

<D-2. Manufacturing Method>

Figure 39:
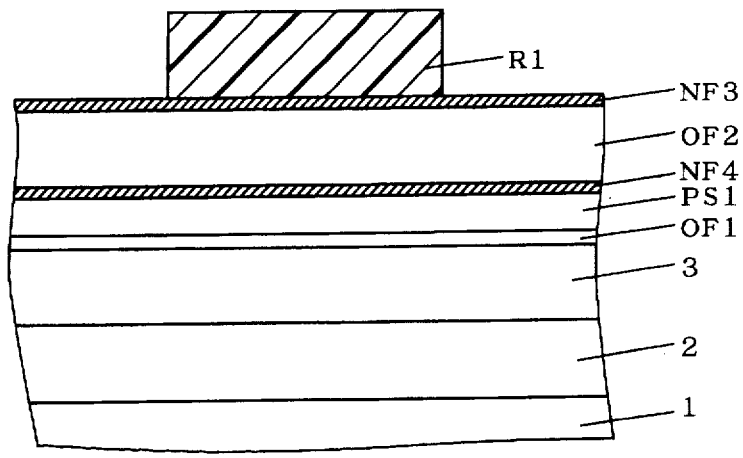
FIGS. 39 to 42 illustrate steps for manufacturing a semiconductor device in accordance with a fourth preferred embodiment of the present invention.

First, as shown in FIG. 39, the oxide film OF1, a nitride film NF4, the polysilicon layer PS1 doped with an impurity (e.g., phosphorus), the oxide film OF2 and the nitride film NF3 are sequentially formed on the surface of the SOI layer 3 provided on the insulating substrate constituted of the supporting substrate 1 and the buried oxide film 2, and the patterned resist mask R1 is formed on the nitride film NF3.

The nitride films NF3 and NF4 are formed by CVD to have a thickness of 100 Å. The above thickness of the nitride films NF3 and NF4 layers is an example, and the nitride film NF3 may have a thickness of 100 to 1000 Å. The thickness of the other films was discussed in the first preferred embodiment, so redundant discussion will be omitted.

With the resist mask R1 used as a mask, the nitride film NF3, the oxide film OF2, the nitride film NF4 and the polysilicon layer PS1 are selectively removed by anisotropic etching (dry etching), to form the cap nitride film 17 (the first oxidation-resistant film), the FS upper oxide film 41, an FS upper nitride film 18 (the second oxidation-resistant film) and the FS electrode 5.

Figure 40:
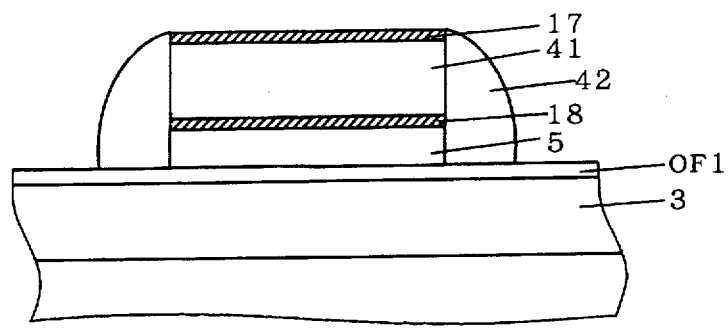

Next, the resist mask R1 is removed, and an oxide film is formed by CVD to have a thickness of 1500 to 2000 Å so as to cover the oxide film OF1, the cap nitride film 17, the FS upper oxide film 41, the FS upper nitride film 18 and the FS electrode 5. Then, the oxide film is removed by anisotropic etching (dry etching), to form the side wall oxide film 42 on side surfaces of the cap nitride film 17, the FS upper oxide film 41, the FS upper nitride film 18 and the FS electrode 5, as shown in FIG. 40.

Further, the side wall oxide film 42 becomes thicker by the thickness of the cap nitride film 17, obtaining an etch margin for the etching of the oxide film OF1 as discussed below.

Figure 41:
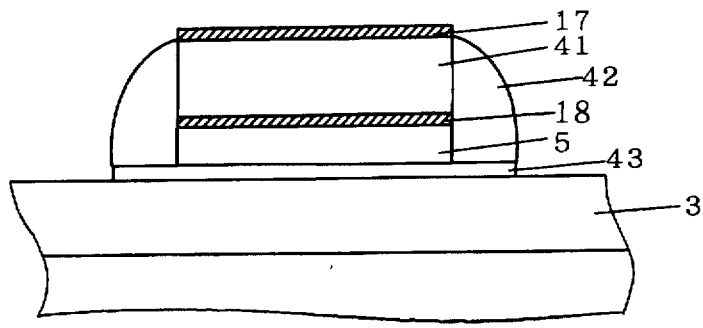

After that, in the step of FIG. 41, the oxide film OF1 is removed. The oxide film OF1 also serves as a protective film for protection of the source/drain region from exposure to the plasma of the dry etching, and is removed by wet etching with buffered hydrofluoric acid (HF). Through this step, the oxide film OF1 remains only below the FS electrode 5 and the side wall oxide film 42, becoming the FS gate oxide film 43. The FS upper oxide film 41, the side wall oxide film 42 and the FS gate oxide film 43 constitute the FS insulating layer 4.

Since the oxide films OF3 and OF1 are etched with buffered HF and a nitride film, i.e., the cap nitride film 17 is little etched with buffered HF, the thickness of the FS upper oxide film 41 does not decrease. Therefore, it is possible to avoid an increase of parasitic capacitance between the gate electrode 6 formed on the FS upper oxide film 41 and the FS electrode 5 in the later steps and sufficiently keep the electrical isolation between the gate electrode 6 and the FS electrode 5.

Though the side wall oxide film 42 becomes slightly thinner, the side wall oxide film 42 has a proper thickness after this etching since it is originally formed thicker by the thickness of the cap nitride film 17. Further, by retraction of the side wall oxide film 42, the cap nitride film 17 protrudes on the upper surface of the FS upper oxide film 41.

Next, an oxide film which is to become the gate oxide film 10 is formed on the surface of the SOI layer 3 by thermal oxidation. In forming the oxide film, the oxygen used as an oxidant goes through the side wall oxide film 42 and the FS gate oxide film 43 to oxidize the lower surface side of the FS electrode 5, but since the cap nitride film 17 is formed over the upper surface of the FS upper oxide film 41 and the FS upper nitride film 18 is formed over the upper surface of the FS electrode 5, the oxidant entering the upper surface of the FS upper oxide film 41 is thereby blocked, to prevent oxidation of the upper surface side of the FS electrode 5 even if the oxidant enters.

Further, the oxygen reaching the bottom of the FS electrode 5 oxidizes the edge portion of the FS electrode 5 to be warped up. That's because an edge portion is more oxidized and a central portion is less oxidized. Since the oxygen also oxidizes the SOI layer 3 beneath the side wall oxide film 42, the edge portion of the FS gate oxide film 43 becomes thicker.

Figure 42:
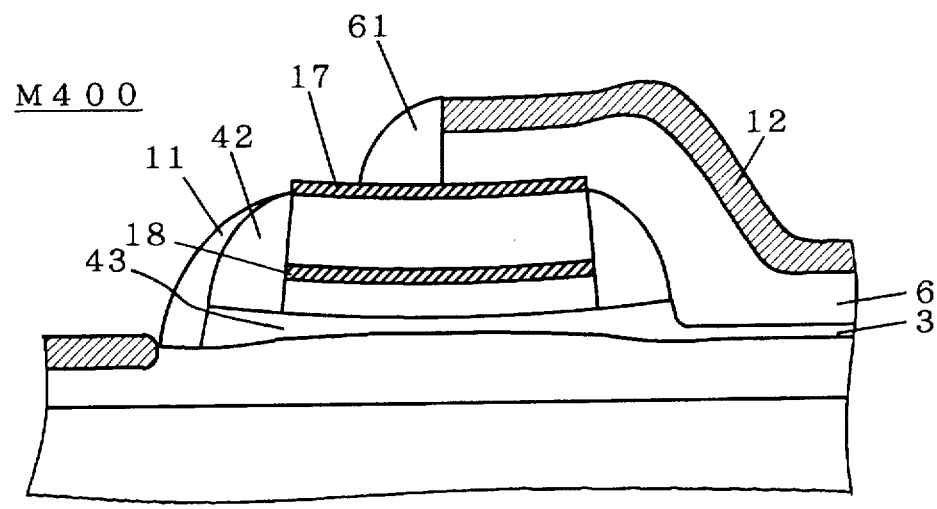

Subsequent steps are the same as those of FIGS. 35 to 38, and through the steps of selectively forming the gate electrode 6, forming the side wall oxide films 61 on the side surfaces of the gate electrode 6, selectively forming the silicide-protection film 11 and selectively forming the silicide film 12, the semiconductor device M400 of FIG. 42 is provided.

<D-3. Characteristic Action and Effect>

In the semiconductor device M400, as discussed above, provision of the cap nitride film 17 prevents the FS upper oxide film 41 from becoming thinner and prevents the silicide film 12 from being formed on the surface of the FS electrode 5, like the third preferred embodiment. Further, forming the FS upper nitride film 18 on the upper surface of the FS electrode 5 prevents oxidation of the upper surface of the FS electrode 5, to cut the rate of decrease in substantial thickness of the FS electrode 5 due to oxidation.

Naturally, an oxide nitride film (SiON) may be used as the cap nitride film and the FS upper nitride film, instead of the oxide film.

<E. The Fifth Preferred Embodiment>

<E-1. Device Structure>

A structure of a semiconductor device with field-shield isolation structure M500 in accordance with the fifth preferred embodiment of the present invention and its characteristic action and effect will be discussed below, showing steps for manufacturing the semiconductor device with field-shield isolation structure M500 in FIGS. 43 to 45. The same elements as those in the third preferred embodiment discussed with reference to FIGS. 29 to 38 are given the same reference signs and duplicate discussion will be omitted.

<E-2. Manufacturing Method>

Figure 43:
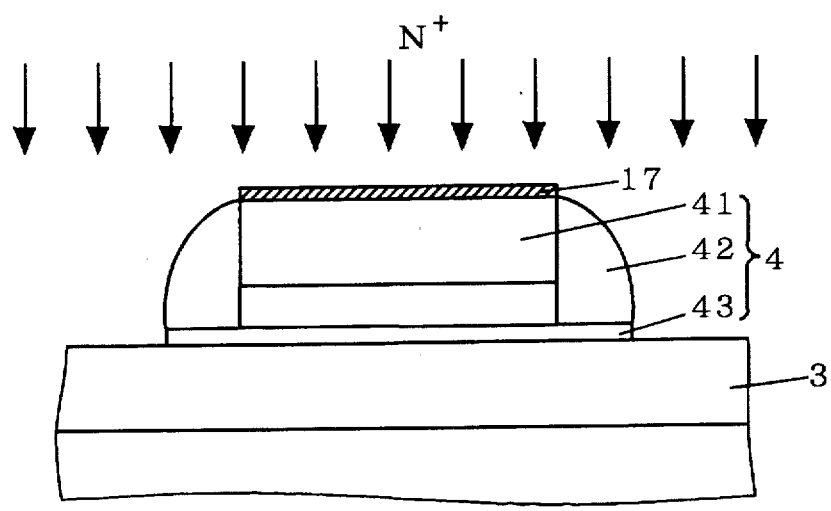
FIGS. 43 to 45 illustrate steps for manufacturing a semiconductor device in accordance with a fifth preferred embodiment of the present invention.
Figure 44:
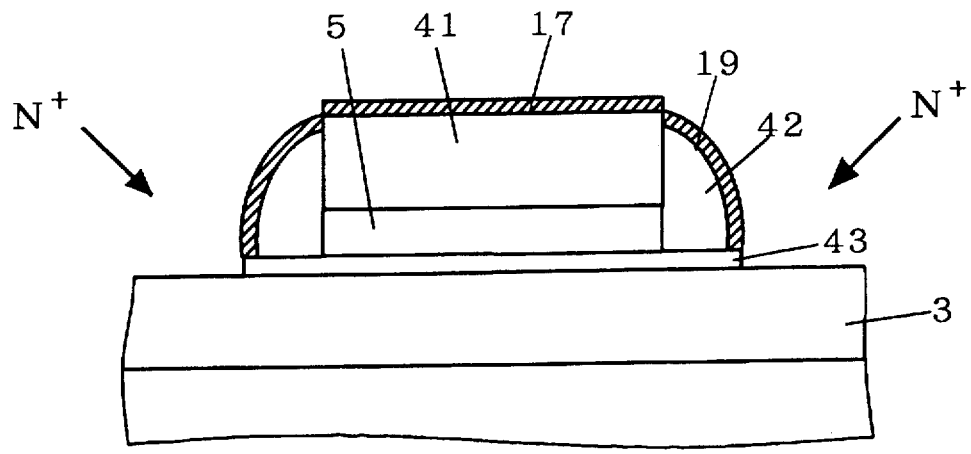

In the step of FIG. 43, ion implantation is performed with nitrogen (N) ion from above the cap nitride film 17 (the first oxidation-resistant film) and the FS insulating film 4. By this ion implantation, a side wall protective film 19 (the second oxidation-resistant film) like a nitride film in structure is formed on at least the surface of the side wall oxide film 42 as shown in FIG. 44. Steps prior to that of FIG. 43 are the same as those of FIGS. 29 to 33 in the third preferred embodiment, so redundant discussion will be omitted.

The nitrogen (N) ion is injected at an energy of 20 to 60 KeV, to give a density of $1 \times 10^{14}$ to $1 \times 10^{20}$/cm$^3$ after implantation. The side wall protective film 19 formed through this process has a property to protect passage of oxygen like a nitride film.

Subsequently, an oxide film which is to become the gate oxide film 10 is formed by thermal oxidation on the surface of the SOI layer 3. In forming the oxide film, the oxygen as an oxidant can not pass the cap nitride film 17 or the side wall protective film 19 and therefore the upper surface and lower surface sides of the FS electrode 5 are not oxidized. A little oxygen enters only a side surface of an edge portion of the FS gate oxide film 43 but can not oxidize the FS electrode 5.

Furthermore, by injecting nitrogen ion diagonally, as well as from above, a protective film like a nitride film in structure is formed on the side surface of the edge portion of the FS gate oxide film 43 to block entrance of the oxygen as effective as possible, thereby preventing oxidation of the FS electrode 5.

Therefore, it is possible to prevent the edge portion of the FS electrode 5 from being warped up and a decrease in substantial thickness of the FS electrode 5.

Figure 45:
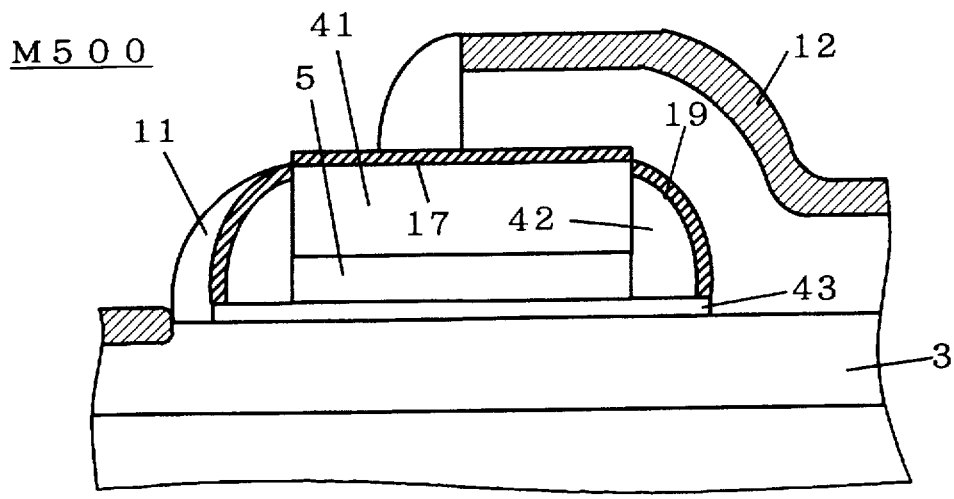

Subsequent steps are the same as those of FIGS. 35 to 38, and through the steps of selectively forming the gate electrode 6, forming the side wall oxide films 61 on the side surfaces of the gate electrode 6, selectively forming the silicide-protection film 11 and selectively forming the silicide film 12, the semiconductor device M500 of FIG. 45 is provided.

<E-3. Characteristic Action and Effect>

In the semiconductor device M500, as discussed above, provision of the cap nitride film 17 prevents the FS upper oxide film 41 from becoming thinner and prevents the silicide film 12 from being formed on the surface of the FS electrode 5, like the third preferred embodiment. Provision of the cap nitride film 17 and the side wall protective film 19 produces further action and effect as discussed below.

Specifically, neither the upper nor lower surface of the FS electrode 5 is oxidized and the edge portion of the FS electrode 5 is not warped up, and therefore it is possible to prevent partial decrease in distance between the FS electrode 5 and the gate electrode 6 and prevent an increase of parasitic capacitance between the FS electrode 5 and the gate electrode 6 and dielectric breakdown.

Because of no decrease in substantial thickness of the FS electrode 5 due to oxidation, it is possible to prevent an increase in electrical resistance of the FS electrode 5.

Provision of the side wall protective film 19 prevents partial removal of the side wall oxide film 42 due to overetching in the steps of forming the gate electrode 6, forming the side wall oxide film 61 and forming the silicide-protection film 11.

<E-4. The First Modification>

In the fifth preferred embodiment, as discussed above, the side wall protective film 19 like a nitride film in structure is formed by nitrogen ion implantation on the surface of the side wall oxide film 42. Instead of the side wall protective film 19, a side wall surface nitride film 20 (the second oxidation-resistant film) made of a nitride film may be formed on the surface of the side wall oxide film 42.

Figure 46:
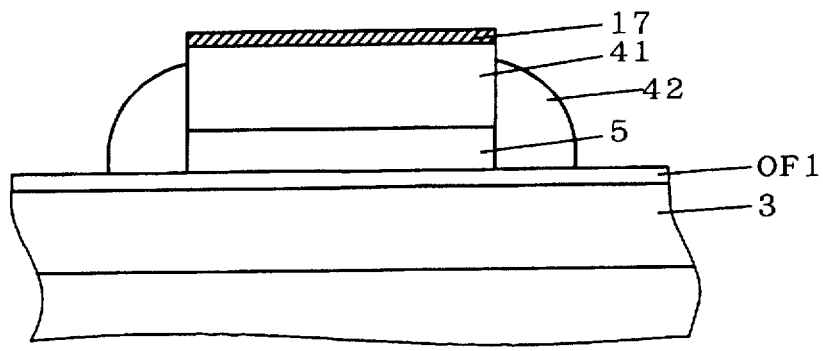
FIGS. 46 to 52 illustrate modified steps for manufacturing the semiconductor device in accordance with the fifth preferred embodiment of the present invention.
Figure 47:
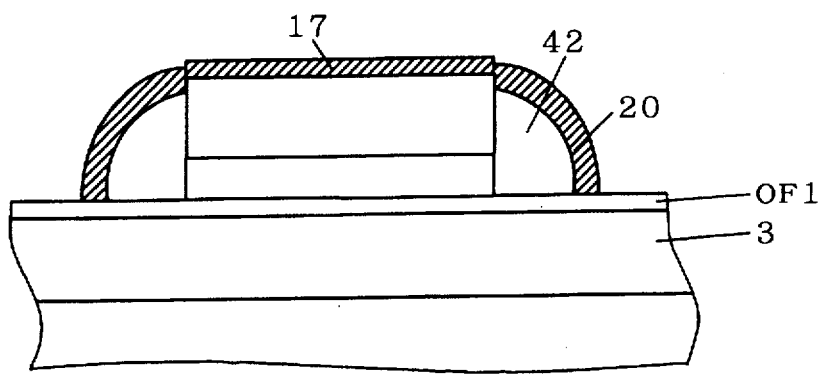

An example of the above structure will be discussed with reference to FIGS. 46 to 48. As shown in FIG. 46, the side wall oxide film 42 is formed on the side surfaces of the FS upper oxide film 41 and the FS electrode 5. At this time, the side wall oxide film 42 is formed so as not to completely cover the side surface of the FS upper oxide film 41 with consideration of a thickness of the side wall surface nitride film 20 formed later. Steps prior to that of FIG. 46 are the same as those of FIGS. 29 to 32 in the third preferred embodiment, so redundant discussion will be omitted.

Subsequently, in the step of FIG. 47, the side wall surface nitride film 20 made of a nitride film is formed on the surface of the side wall oxide film 42. To obtain the side wall surface nitride film 20, an nitride film is entirely formed by CVD, to have a thickness of e.g., 1000 Å, and then the nitride film other than that on the surface of the side wall oxide film 42 is removed by anisotropic etching.

Figure 48:
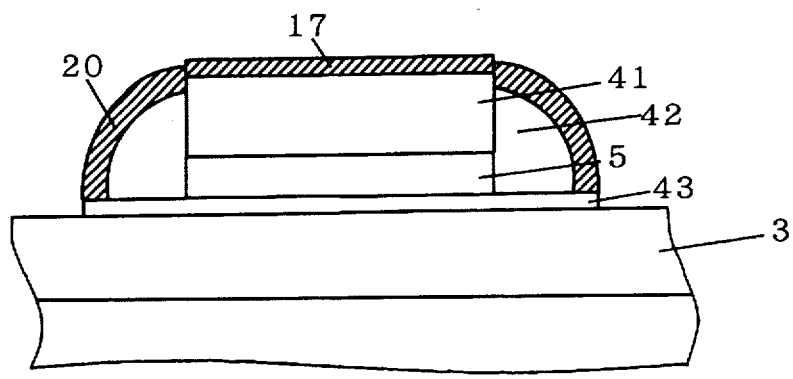

After that, in the step of FIG. 48, the oxide film OF1 is removed by wet etching with buffered HF (hydrofluoric acid). Through this step, the oxide film OF1 remains only below the FS electrode 5 and the side wall oxide film 42, becoming the FS gate oxide film 43.

Since the oxide film OF1 is etched with buffered HF and nitride films, i.e., the cap nitride film 17 and the side wall surface nitride film 20 are little etched with buffered HF, the thickness of the FS upper oxide film 41 does not decrease.

<E-5. The Second Modification>

In the above example, the side wall surface nitride film 20 has a thickness of about 1000 Å, but it may be thinner.

Figure 49:
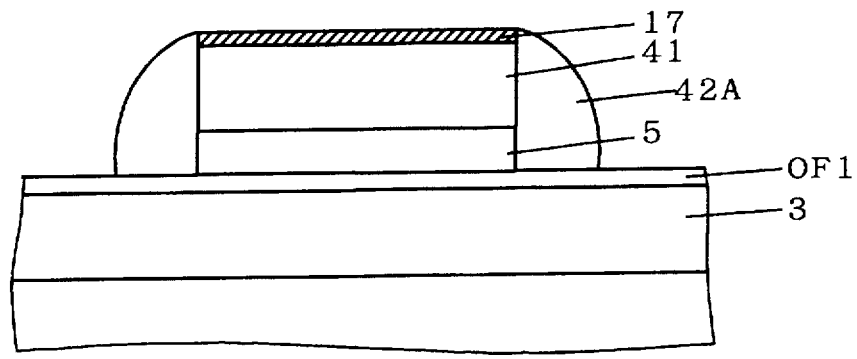

An example will discussed with reference to FIGS. 49 to 52. First, as shown in FIG. 49, a side wall oxide film 42A (the second oxidation-resistant film) is formed on side surfaces of the cap nitride film 17, the FS upper oxide film 41 and the FS electrode 5. Steps prior to that of FIG. 49 are almost the same as those of FIGS. 29 to 32 in the third preferred embodiment, so redundant discussion will be omitted. In this case, the side wall oxide film 42A is thinner than the side wall oxide film 42 used in the first to fourth preferred embodiments.

Figure 50:
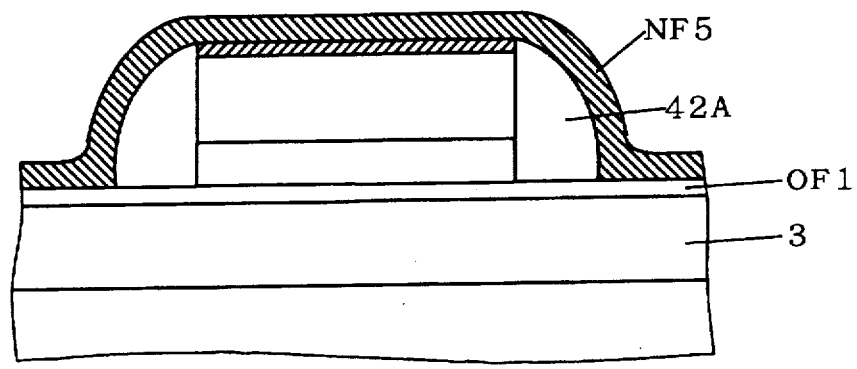

Next, in the step of FIG. 50, a nitride film NF5 is entirely formed by CVD, to have a thickness of e.g., 200 to 300 Å.

Figure 51:
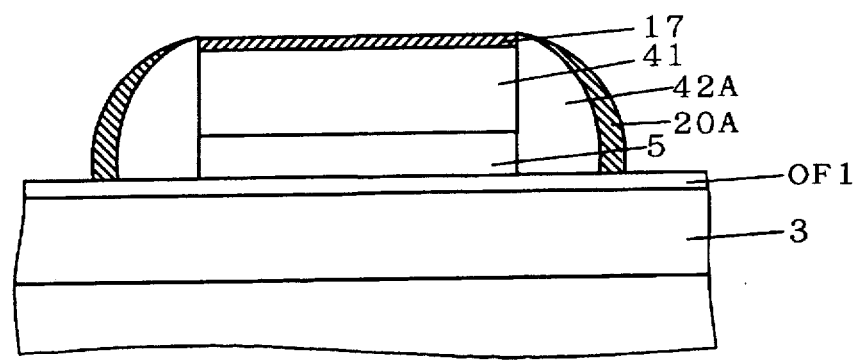

Subsequently, in the step of FIG. 51, the nitride film NF5 other than that on the surface of the side wall oxide film 42A is removed by anisotropic etching, to obtain a side wall surface nitride film 20A (the second oxidation-resistant film).

Figure 52:
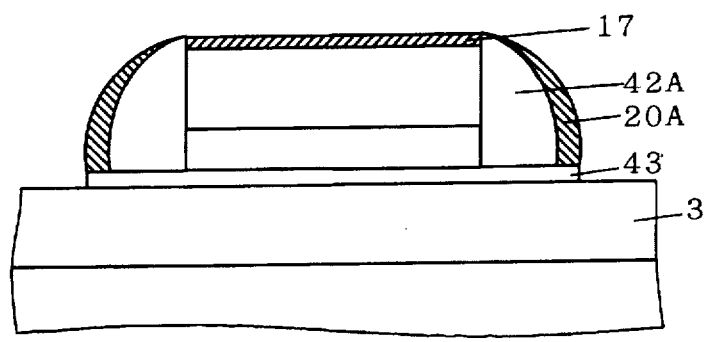

After that, in the step of FIG. 52, the oxide film OF1 is removed by wet etching with buffered HF (hydrofluoric acid). Through this step, the oxide film OF1 remains only below the FS electrode 5 and the side wall oxide film 42A, becoming the FS gate oxide film 43.

Since the oxide film OF1 is etched with buffered HF and nitride films, i.e., the cap nitride film 17 and the side wall surface nitride film 20A are little etched with buffered HF, the thicknesses of the FS upper oxide film 41 and the side wall surface oxide film 42A do not decrease.

<F. The Sixth Preferred Embodiment>

<F1. Device Structure>

A structure of a semiconductor device with field-shield isolation structure M600 in accordance with the sixth preferred embodiment of the present invention and its characteristic action and effect will be discussed below, showing steps for manufacturing the semiconductor device with field-shield isolation structure M600 in FIGS. 53 to 57. Since the structure of the semiconductor device M600 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<F-2. Manufacturing Method>

Figure 53:
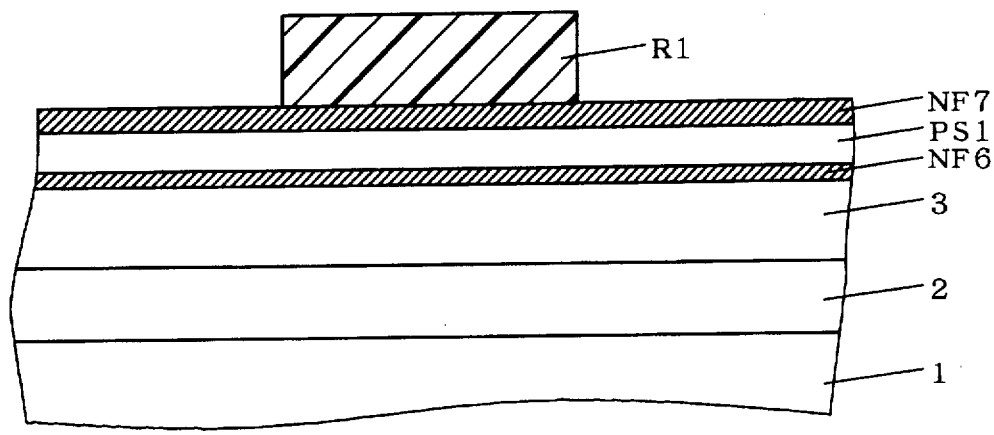
FIGS. 53 to 57 illustrate steps for manufacturing a semiconductor device in accordance with a sixth preferred embodiment of the present invention.

First, as shown in FIG. 53, a nitride film NF6, the polysilicon layer PS1 doped with an impurity (e.g., phosphorus) and a nitride film NF7 are sequentially formed on the surface of the SOI layer 3 provided on the insulating substrate constituted of the supporting substrate 1 and the buried oxide film 2, and the patterned resist mask R1 is formed on the nitride film NF7.

The nitride films NF6 and NF7 are formed by CVD to have thickness of 200 Å and 300 Å, respectively. The nitride films NF6 and NF7 may each have a thickness of 100 to 1000 Å. The thickness of the polysilicon layer PS1 and the forming method are the same as those in the first preferred embodiment, so redundant discussion will be omitted.

Figure 54:
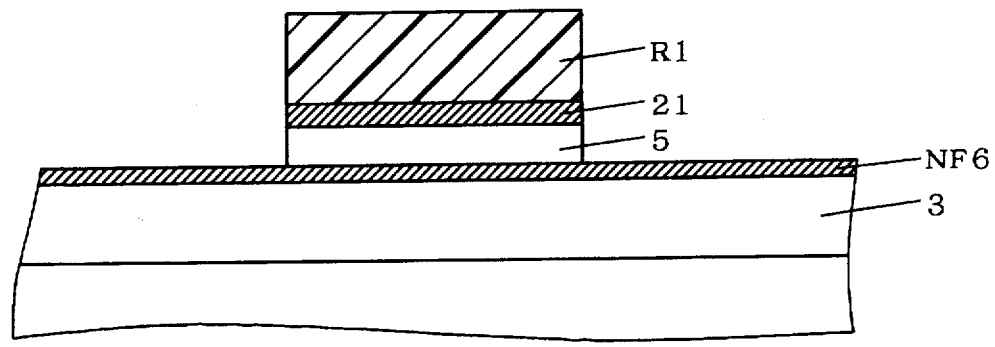

In the step of FIG. 54, the nitride film NF7 and the polysilicon layer PS1 are selectively removed, to form an FS upper nitride film 21 (the first oxidation-resistant film) and the FS electrode 5. At this time, the nitride film NF6 is left in order to reduce a damage of the SOI layer 3 due to etching.

Figure 55:
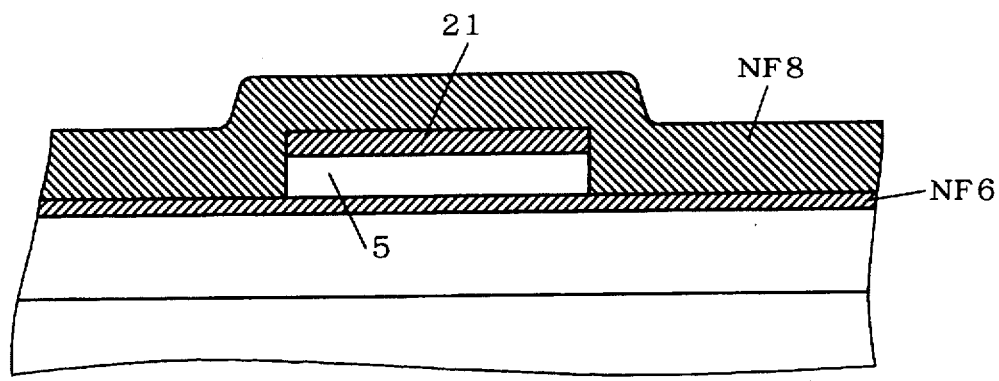

Next, the resist mask R1 is removed, and in the step of FIG. 55, an nitride film NF8 is formed by CVD so as to cover the nitride film NF6, the FS upper nitride film 21 and the FS gate electrode 5.

Figure 56:
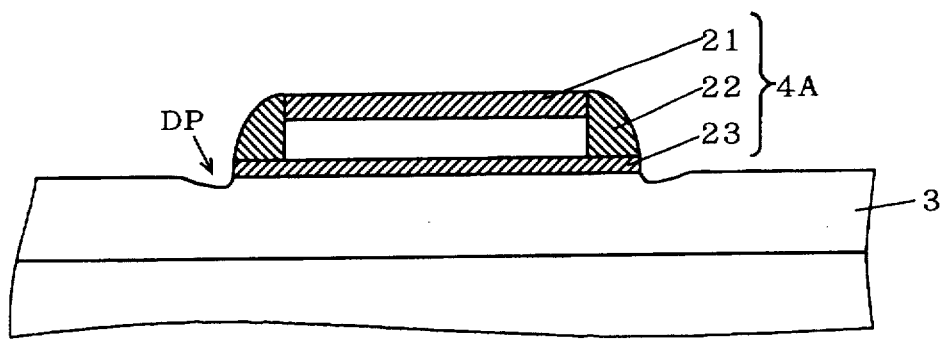

Then, in the step of FIG. 56, the nitride films NF8 and NF6 are removed by anisotropic etching, to form a side wall nitride film 22 (the second oxidation-resistant film) on side surfaces of the FS upper nitride film 21 and the FS electrode 5, and an FS gate nitride film 23 below the side wall nitride film 22 and the FS electrode 5.

At this time, the SOI layer 3 near an edge portion of the side wall nitride film 22 is scooped out by overetching, to create a dent portion DP. The FS upper nitride film 21, the side wall nitride film 22 and the FS gate nitride film 23 constitute an FS insulating film 4A.

Prior to forming a gate oxide film on the surface of the SOI layer 3, the natural oxide film formed on the surface of the SOI layer 3 must be removed by wet etching. At this time, if buffered HF, for example, is used as an etchant, since the oxide film is etched but nitride film, i.e., the FS insulating film 4A (the FS upper nitride film 21, the side wall nitride film 22 and the FS gate nitride film 23) is little etched, the thickness of the FS insulating film 4A does not decrease.

Therefore, no edge portion is created in the periphery of the side wall nitride film 22 due to retraction of the side wall nitride film 22, and it is possible to prevent a breakage of the gate oxide film due to existence of the edge portion and increase the reliability of the gate oxide film.

Moreover, since the FS electrode 5 is covered with the nitride film, without ill effect of the above wet etching, the FS electrode 5 does not become thinner.

After forming the side wall nitride film 22, i.e., dry etching, electric furnace annealing may be performed at the temperature of 600 to 1200° C. in nitrogen atmosphere for 10 to 60 minutes. Combination of short-time annealing at the temperature of about 1000 to 1200° C. for 10 to 60 seconds and the above electric furnace annealing may be adopted. An object of this annealing is to recover the surface of the substrate from an etching damage given in forming the side wall nitride film 22.

For removing the etching damage, chemical dry etching which mainly uses $CF_4$ may be performed to etch the surface of the SOI layer 3 by 10 to 300 Å. In this chemical etching, usually, a silicon oxide film is deposited while etching silicon. Therefore, it is necessary to perform wet etching of the deposited silicon oxide film, but the FS insulating film 4A is not removed because of its resistance to the etchant such as a buffered HF.

Subsequently, an oxide film which is to become the gate oxide film 10 is formed by thermal oxidation on the surface of the SOI layer 3. In forming the oxide film, since the oxygen as an oxidant can not pass the FS upper nitride film 21, the side wall nitride film 22 and the FS gate nitride film 23, the upper surface and lower surface sides of the FS electrode 5 are not oxidized.

Therefore, it is possible to prevent the edge portion of the FS electrode 5 from being warped up and a decrease in substantial thickness of the FS electrode 5.

Figure 57:
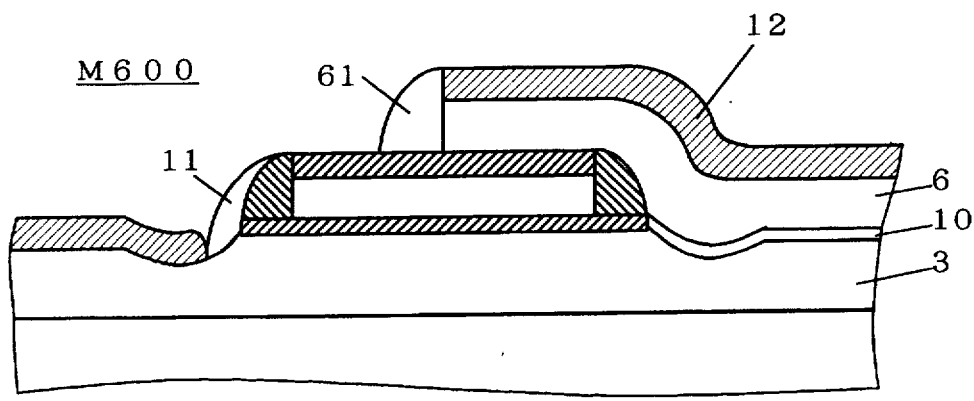

Subsequent steps are the same as those of FIGS. 35 to 38, and through the steps of selectively forming the gate electrode 6, forming the side wall oxide films 61 on the side surfaces of the gate electrode 6, selectively forming the silicide-protection film 11 and selectively forming the silicide film 12, the semiconductor device M600 of FIG. 57 is provided.

Though the thickness of the FS upper nitride film 21 is 300 Å in the above discussion, it may be about 1000 Å if there is a need for reducing the parasitic capacitance between the FS upper nitride film 21 and the gate electrode 6 and preventing the dielectric breakdown.

Furthermore, it is necessary to prevent overetching of the FS upper nitride film 21 in each of the above steps. In other words, the etching condition is determined so that the etching rate for the gate electrode material (polysilicon) may be higher than that for the FS upper nitride film 21 in forming the gate electrode 6, it is determined so that the etching rate for an oxide film may be higher than that for the FS upper nitride film 21 in forming the side wall oxide film 61 and it is determined so that the etching rate for an oxide film may be higher than that for the FS upper nitride film 21 in forming the silicide-protection film 11.

<F-3. Characteristic Action and Effect>

As discussed above, in the semiconductor device M600, since the FS insulating film 4A is made of a nitride film, there is no edge portion created in the periphery of the side wall nitride film 22 when the natural oxide film is removed by wet etching and no breakage of the gate oxide film due to retraction of the side wall nitride film 22 and the existence of the edge portion. That increases the reliability of the gate oxide film.

In forming the gate oxide film 10, since the oxygen as an oxidant can not pass the FS upper nitride film 21, the side wall nitride film 22 and the FS gate nitride film 23, the upper surface and lower surface sides of the FS electrode 5 are not oxidized and the edge portion of the FS electrode 5 is not warped up. Therefore, it is possible to prevent partial decrease in distance between the FS electrode 5 and the gate electrode 6 and prevent an increase of parasitic capacitance between the FS electrode 5 and the gate electrode 6 and dielectric breakdown.

Moreover, because of no decrease in substantial thickness of the FS electrode 5 due to oxidation, it is possible to prevent an increase in electrical resistance of the FS electrode 5.

Furthermore, since the FS upper nitride film 21 is formed on the FS electrode 5, determining the etching conditions for forming the gate electrode 6, forming the side wall oxide film 61 and forming the silicide-protection film 11 as discussed earlier prevents the FS upper nitride film 21 from being removed by overetching. Therefore, it is possible to prevent an increase of parasitic capacitance between the gate electrode 6 and the FS electrode 5 and degradation of operating speed of the device. Moreover, sufficient electrical isolation between the gate electrode 6 and FS electrode 5 prevents a short circuit between these electrodes.

Determining the etching conditions as discussed earlier also prevents the side wall nitride film 22 from being partially removed by overetching in the steps of forming the gate electrode 6, the side wall oxide film 61 and the silicide-protection film 11.

Since the FS electrode 5 is not exposed, it is possible to prevent ill effect on the operation characteristics of the semiconductor device due to the exfoliated silicide film 12 which comes into conductive dust to be left on the semiconductor device. Further, it is possible to prevent a break in the FS electrode 5 caused by partial lost of the FS electrode 5 with exfoliation of the silicide film 12, and sufficient field-shield isolation effect is achieved when the device operates.

<F-4. Modification>

In the sixth preferred embodiment as discussed above with reference to FIGS. 54 and 55, the FS upper nitride film 22 and the FS electrode 5 are formed at the same time by using the resist mask R1. Another method may be adopted, where only the FS upper nitride film 22 is patterned with the resist mask R1 and the remainder of the films are patterned with the FS upper nitride film 22 used as a mask.

This reduces the inconvenience caused by using the resist mask R1. Specifically, when the resist mask R1 is used, an impurity released from the resist mask R1 is deposited on the side wall of the film therebeneath and the width of the film increases. If this phenomenon occurs in more than one layer, there arises a possibility that the multi-layered structure which becomes stepped in cross section does not precisely reflect the shape of the resist mask R1. Limiting the use of the resist mask R1 suppresses such inconvenience as above.

In the example of FIGS. 54 and 55, the nitride film NF8 which is to become the side wall nitride film 22 is formed by CVD without removing the nitride film NF6. The nitride film NF8 which is to become the side wall nitride film 22 may be formed after forming the FS gate nitride film 23.

<G. The Seventh Preferred Embodiment>

<G-1. Detailed Description on SOI Device>

In the first to sixth preferred embodiments, semiconductor devices with field-shield isolation structure formed on the SOI substrate are discussed. It is natural that use of a bulk silicon substrate, instead of the SOI substrate, produces the same action and effect.

The seventh preferred embodiment discussed below produces marked action and effect when it applies to a semiconductor device with field-shield isolation structure formed on the SOI substrate.

Since the SOI device has a structure where the channel is in a floating state, there is a problem of deterioration of drain breakdown voltage, for example, due to floating-substrate effect (an phenomenon caused by a channel in a floating state). To solve this problem, it is effective to fix the substrate potential, i.e., the channel potential by providing a body contact electrode. The semiconductor device with field-shield isolation structure is most suitable for providing the body contact electrode.

Figure 58:
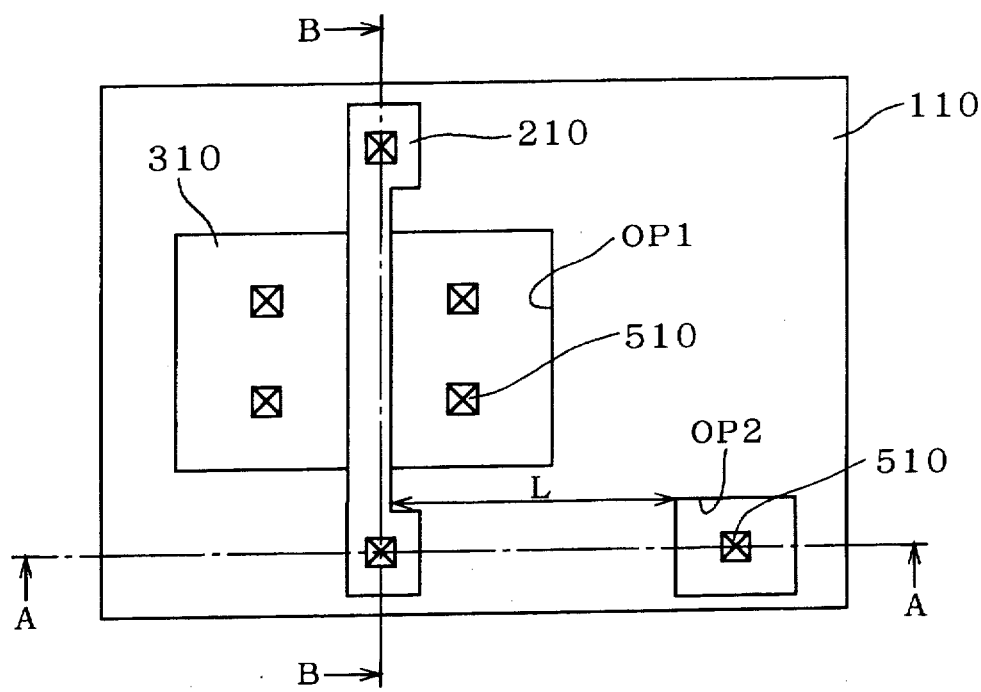
FIGS. 58 to 60 illustrate an exemplary semiconductor device in accordance with a seventh preferred embodiment of the present invention.

FIG. 58 is a plan view of an exemplary SOI device with field-shield isolation structure. In this figure, an opening portion OP1 is provided in an FS electrode 110 which is a rectangular from plan view, serving as an active region of the MOS transistor. A gate electrode 210 of the MOS transistor is formed so as to halve the active region. The active regions externally located on both sides of the gate electrode 210 are regions to serve as source/drain (S/D) regions 310. Further, contact holes 510 are connected to the S/D region 310.

The edge portions along the length of the gate electrode 210 are extended onto the FS electrode 110, to which the contact holes 510 are connected.

In addition to the opening portion OP1, an opening portion OP2 is provided, to which the contact hole 510 is connected for connection with the body contact electrode.

Figure 59:
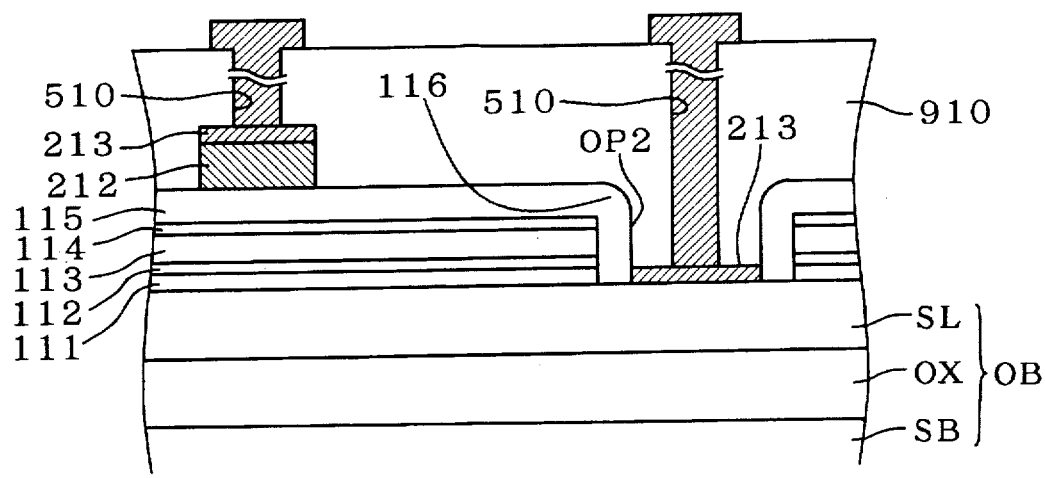
Figure 60:
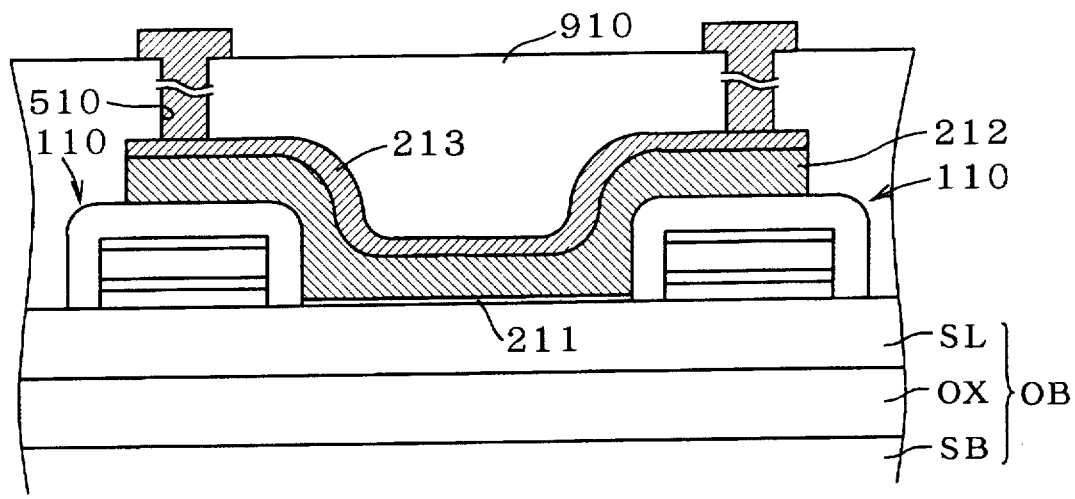

FIGS. 59 and 60 are cross sections taken along the lines A-A and B-B, respectively, of FIG. 58.

In FIG. 59, the FS electrode 110 is formed on an SOI substrate OB. The SOI substrate OB consists of an insulating substrate including the silicon substrate SB and a buried oxide layer OX formed thereon, and an SOI layer (single crystalline silicon layer) SL formed on the insulating substrate. The FS electrode 110 has an FS gate oxide film 111 formed on the surface of the SOI layer SL, an FS lower nitride film 112, a polysilicon layer 113, an FS upper nitride film 114 and an FS upper oxide film 115 formed in this order on the FS gate oxide film 111, and side wall films 116 are formed on the side surfaces of these films and layer.

The SOI substrate OB may be formed by SIMOX (Separation by Implanted Oxygen), wafer bonding and any other methods.

A polysilicon layer 212 is partially formed on the FS electrode 110 and a salicide film 213 is formed on the polysilicon layer 212.

Another salicide film 213 which is to serve as a body contact electrode is formed on the surface of the SOI layer SL at the bottom of the opening portion OP2 provided in the FS electrode 110, and an interlayer insulating film 910 is formed so as to cover the FS electrode 110 and the opening portion OP2. The contact holes 510 are formed, penetrating the interlayer insulating film 910, on the salicide film 213 formed in the opening portion OP2 and on the salicide film 213 formed on the polysilicon layer 212.

In FIG. 60, the gate oxide film 211 is formed on the surface of the SOI layer SL between two FS gate electrodes 110, and the polysilicon layer 212 is formed so as to cover the gate oxide film 211 and partially cover the FS gate electrodes 110. The salicide film 213 is formed on the polysilicon layer 212.

The interlayer insulating film 910 is formed over the FS gate electrodes 110 and the gate electrode 210 and the contact holes 510 are formed, penetrating the interlayer insulating film 910, at the edge portions of the polysilicon layer 212.

In the semiconductor device having the constitution of FIG. 58, how reliably the body potential is fixed depends on the resistance across the channel of the transistor and the body contact electrode, i.e., on the resistance of the SOI layer beneath the FS gate electrode.

Furthermore, the resistance value of the SOI layer beneath the FS gate electrode depends on the film thickness of the SOI layer, the impurity concentration thereof and the distance between the channel of the transistor and the body contact electrode. Specifically, in FIG. 58, it depends on the film thickness of the SOI layer SL, the impurity concentration thereof and the distance between the salicide film 213 and the SOI layer SL below the polysilicon layer 212. In FIG. 58, the minimum distance L between the edge portion of the opening portion OP2 and the body of the gate electrode 210 is the distance between the channel of the transistor and the body contact electrode.

In order to reduce the resistance value of the SOI layer beneath the FS gate electrode, it is necessary to make the minimum distance L as short as possible. If that is difficult in terms of the device constitution, it is instead necessary to increase the film thickness of the SOI layer SL or increase the impurity concentration in the SOI layer SL.

For optimization of transistor characteristics, a limit is imposed on the film thickness of the SOI layer SL. For example, the SOI layer SL must have a film thickness of about 1000 Å.

It is impossible to set the impurity concentration in the SOI layer SL too high since it is determined in accordance with the impurity concentration in the channel region.

The seventh preferred embodiment meets these requirements and further can reduce the resistance value of the SOI layer beneath the FS gate electrode.

A structure of a semiconductor device with field-shield isolation structure M700 in accordance with the seventh preferred embodiment of the present invention and its characteristic action and effect will be discussed below, showing steps for manufacturing the semiconductor device with field-shield isolation structure M700 in FIGS. 61 to 63. Since the structure of the semiconductor device M700 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<G-2. Manufacturing Method>

Figure 61:
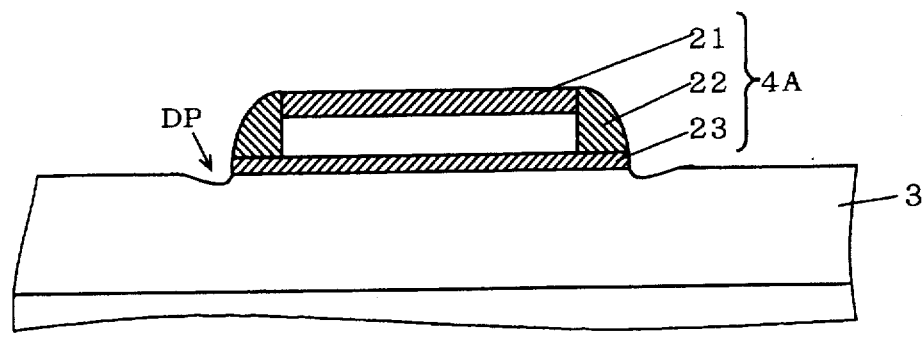
FIGS. 61 to 63 illustrate steps for manufacturing the semiconductor device in accordance with the seventh preferred embodiment of the present invention.

Steps prior to that of FIG. 61 are almost the same as those of FIGS. 53 to 55 in the sixth preferred embodiment, so redundant discussion will be omitted.

In the step of FIG. 61, the SOI layer 3 near an edge portion of the side wall nitride film 22 is scooped out by overetching, to create a dent portion DP, like the sixth preferred embodiment.

Prior to forming a gate oxide film on the surface of the SOI layer 3, the natural oxide film formed on the surface of the SOI layer 3 must be removed by wet etching. At this time, no edge portion is created in the periphery of the side wall nitride film 22, and it is possible to prevent a breakage of the gate oxide film due to existence of the edge portion and increase the reliability of the gate oxide film, like the sixth preferred embodiment.

Figure 62:
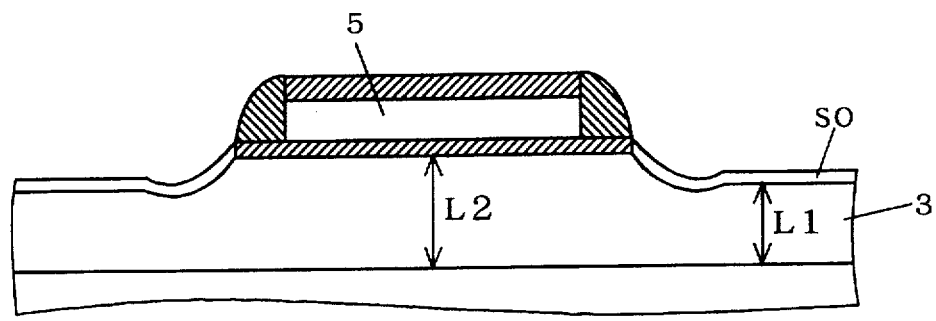

In the step of FIG. 62, a sacrifice oxide film SO is formed on the surface of the SOI layer 3. The sacrifice oxide film SO is formed by CVD or thermal oxidation at the temperature of 750 to 1200° C. to have a thickness of 100 to 500 Å.

Since the silicon of the surface of the SOI layer 3 is consumed by forming the sacrifice oxide film SO, the surface of the SOI layer 3 is retracted by this silicon consumption after removing the sacrifice oxide film SO. Taking full advantage of this phenomenon allows the SOI layer 3 below the FS electrode 5 to be thicker and the SOI layer 3 in the channel region to have a proper thickness.

Specifically, in FIG. 62, the thickness of the SOI layer 3 in the channel region (inside the SOI layer 3 not beneath the FS electrode 5 in FIG. 62) is represented by L1 while that of the SOI layer 3 beneath the FS electrode 5 is represented by L2 which is thicker than L1.

In the step of forming the SOI layer 3, the thickness of the SOI layer 3 is set to L2 thicker than L1 which is suitable for operation characteristics of a transistor so that the thickness of the SOI layer 3 should become L1 after removing the sacrifice oxide film SO.

By this setting, while the requirement of proper thickness of the SOI layer 3 in the channel region is satisfied, the SOI layer 3 beneath the FS electrode 5 can be made thicker and the resistance value of the SOI layer beneath the FS electrode 5 can be lowered.

After removing the sacrifice oxide film SO by wet etching, an oxide film which is to become the gate oxide film 10 is formed by thermal oxidation on the surface of the SOI layer 3. In forming the oxide film, the oxygen as an oxidant can not pass the FS upper nitride film 21, the side wall nitride film 22 or the FS gate nitride film 23 and therefore the upper surface and lower surface sides of the FS electrode 5 are not oxidized.

Thus, it is possible to prevent the edge portion of the FS electrode 5 from being warped up and a decrease in substantial thickness of the FS electrode 5.

Since the FS insulating film 4A is not removed when the sacrifice oxide film SO is removed, there is no edge portion created in the periphery of the side wall nitride film 22 or no decrease in thickness of the FS electrode 5.

Figure 63:
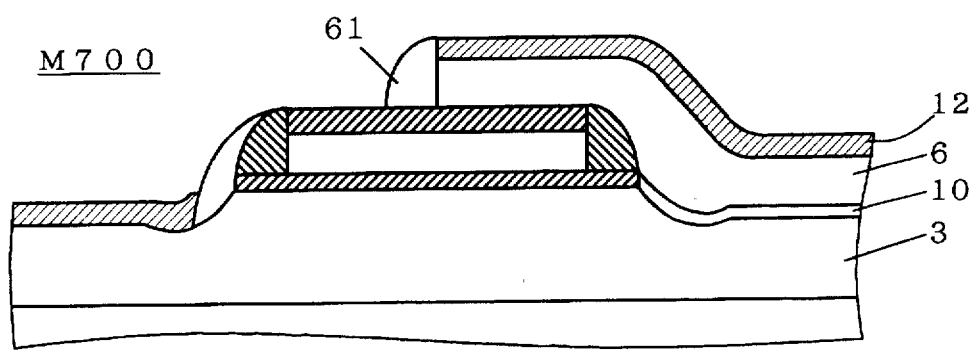

Subsequent steps are the same as those of FIGS. 35 to 38 in the third preferred embodiment, and through the steps of selectively forming the gate electrode 6, forming the side wall oxide films 61 on the side surfaces of the gate electrode 6, selectively forming the silicide-protection film 11 and selectively forming the silicide film 12, the semiconductor device M700 of FIG. 63 is provided.

<G-3. Characteristic Action and Effect>

As discussed above, in the semiconductor device M700, the FS insulating film 4A made of a nitride film produces the same action and effect as the sixth preferred embodiment, and further, by forming the sacrifice oxide film SO on the exposed surface of the SOI layer 3 after removing the natural oxide film, the SOI layer 3 beneath the FS electrode 5 can be made thicker while the requirement of proper thickness of the SOI layer 3 in the channel region is satisfied and the resistance value of the SOI layer 3 beneath the FS electrode 5 can be lowered.

<G-4. Modification>

In the seventh preferred embodiment as discussed above, by forming the sacrifice oxide film SO on the exposed surface of the SOI layer 3 after removing the natural oxide film and then removing the sacrifice oxide film SO, the SOI layer 3 beneath the FS electrode 5 can be made thicker while the requirement of proper thickness of the SOI layer 3 in the channel region is satisfied. Taking the advantage of the sacrifice oxide film SO, the SOI layer 3 beneath the FS electrode 5 can have an impurity of high concentration while the requirement of proper impurity concentration of the SOI layer 3 in the channel region is satisfied.

Specifically, prior to forming the field-shield isolation structure, an impurity is injected into the SOI layer 3 so that the impurity concentration may become higher than that suitable for the channel region. For example, if an NMOS transistor is formed, boron (B) is injected as impurity at an energy of 10 to 30 KeV at a dose of $1 \times 10^{12}$ to $5 \times 10^{13}/cm^2$.

Through a predetermined steps, the structure of FIG. 61 is obtained and in the step of FIG. 62, the sacrifice oxide film SO is formed on the surface of the SOI layer 3. Taking full advantage of an action that the sacrifice oxide film SO absorbs the impurity in the SOI layer 3, the impurity concentration in the channel region (inside the SOI layer 3 not beneath the FS electrode 5 in FIG. 62) can be set suitable for the channel region while the impurity concentration in the SOI layer 3 beneath the FS electrode 5 is high, keeping the concentration which is determined before forming the FS electrode (initial concentration).

Specifically, as the sacrifice oxide film SO absorbs the impurity in the SOI layer 3, the impurity concentration in the channel region becomes lower than that determined before forming the FS electrode. In consideration of the amount of impurity to be absorbed by the sacrifice oxide film SO, the initial concentration of the impurity should be determined so that the impurity concentration may become proper after absorption of the impurity in the channel region.

Thus, by taking full advantage of the action that the sacrifice oxide film SO absorbs the impurity in the SOI layer 3, while the requirement of proper impurity concentration in the channel region is satisfied, the impurity concentration in the SOI layer 3 beneath the FS electrode 5 can be raised and the resistance value of the SOI layer 3 beneath the FS gate electrode can be lowered.

Furthermore, the technical concept that the stepped structure is created on the surface of the SOI layer 3 and the impurity concentration in the SOI layer 3 is controlled by providing the sacrifice oxide film SO may surely applies to the constitutions of the semiconductor devices M100 to M500 in the first to fifth preferred embodiments.

<H. The Eighth Preferred Embodiment>
<H-1. Device Structure>

A structure of a semiconductor device with field-shield isolation structure M800 in accordance with the eighth preferred embodiment of the present invention and its characteristic action and effect will be discussed below, showing steps for manufacturing the semiconductor device with field-shield isolation structure M800 in FIGS. 64 to 69. Since the structure of the semiconductor device M800 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<H-2. Manufacturing Method>

Figure 64:
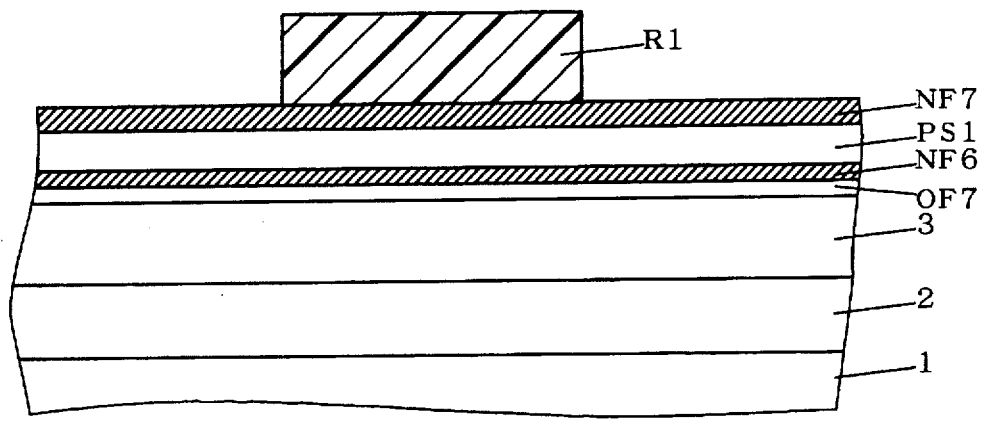
FIGS. 64 to 69 illustrate steps for manufacturing a semiconductor device in accordance with an eighth preferred embodiment of the present invention.

First, as shown in FIG. 64, an oxide film OF7, the nitride film NF6, the polysilicon layer PS1 doped with an impurity (e.g., phosphorus) and the nitride film NF7 are sequentially formed on the surface of the SOI layer 3 provided on the insulating substrate constituted of the supporting substrate 1 and the buried oxide film 2, and the patterned resist mask R1 is formed on the nitride film NF7.

The oxide film OF7 may have a thickness of about 100 to 500 Å and may be formed by thermal oxidation or CVD. The thickness of other films are discussed in the sixth preferred embodiment, so redundant discussion will be omitted.

Figure 65:
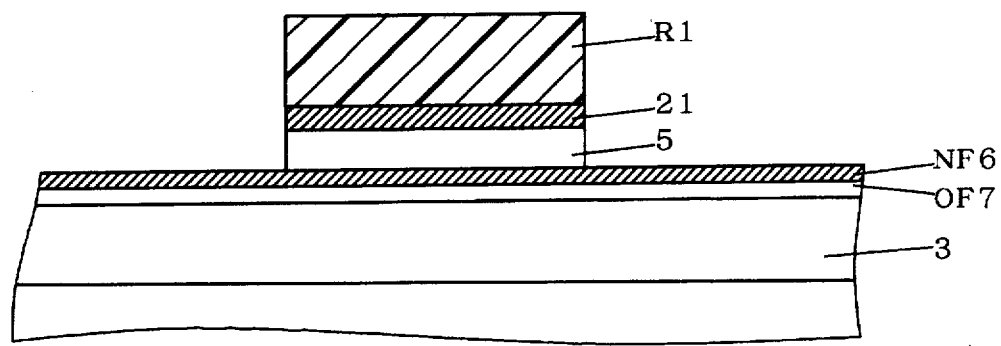

In the step of FIG. 65, the nitride film NF7 and the polysilicon layer PS1 are selectively removed, to form the FS upper nitride film 21 and the FS electrode 5.

Figure 66:
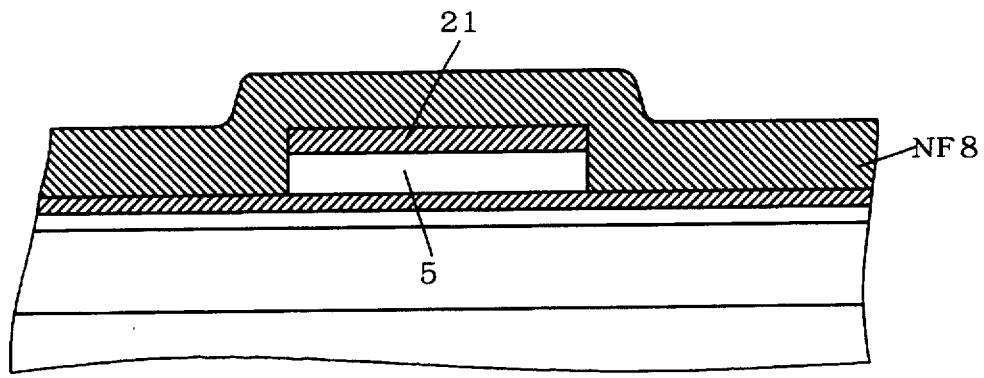

Next, the resist mask R1 is removed, and in the step of FIG. 66, the nitride film NF8 is formed by CVD so as to cover the nitride film NF6, the FS upper nitride film 21 and the FS gate electrode 5.

Figure 67:
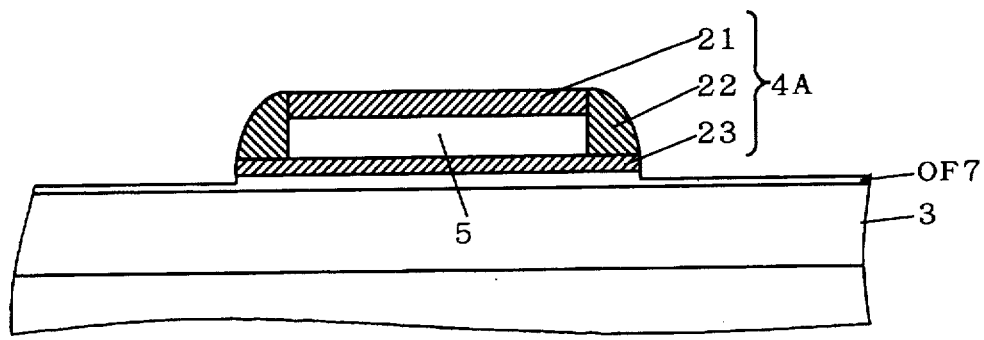

Then, in the step of FIG. 67, the nitride films NF8 and NF6 are removed by anisotropic etching, to form the side wall nitride film 22 on side surfaces of the FS upper nitride film 21 and the FS electrode 5, and the FS gate nitride film 23 below the side wall nitride film 22 and the FS electrode 5.

At this time, the etching is performed under the etching condition that the etching rate for the nitride film is higher than that for the oxide film so that the oxide film OF7 may be left on the SOI layer 3, to prevent the SOI layer 3 near the edge portion of the side wall nitride film 22 from being scooped out by overetching. The FS upper nitride film 21, the side wall nitride film 22 and the FS gate nitride film 23 constitute an FS insulating film 4A.

Prior to forming a gate oxide film on the surface of the SOI layer 3, the oxide film 7 is removed by wet etching, leaving the oxide film OF7 only below the FS gate nitride film 23, to form an FS lower oxide film 44. At this time, if buffered HF, for example, is used as an etchant, since the oxide film is etched but nitride film, i.e., the FS insulating film 4A (the FS upper nitride film 21, the side wall nitride film 22 and the FS gate nitride film 23) is little etched, the thickness of the FS insulating film 4A does not decrease.

Therefore, no edge portion is created in the periphery of the side wall nitride film 22 due to retraction of the side wall nitride film 22, and it is possible to prevent a breakage of the gate oxide film due to existence of the edge portion and increase the reliability of the gate oxide film.

Figure 68:
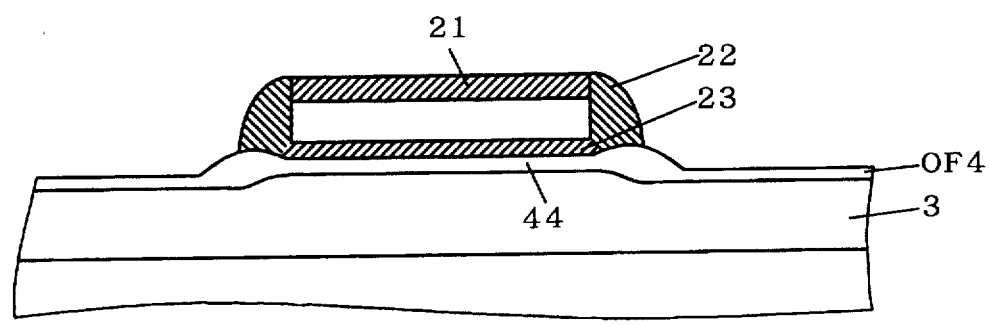

In the step of FIG. 68, the oxide film OF4 which is to become the gate oxide film 10 is formed by thermal oxidation on the surface of the SOI layer 3. In forming the oxide film OF4, since the oxygen as an oxidant can not pass the FS insulating film 4A, the upper surface and lower surface sides of the FS electrode 5 are not oxidized.

The oxygen, however, intrudes into an edge portion of the FS lower oxide film 44 and oxidizes the SOI layer 3, to make the FS lower oxide film 44 beneath the side wall nitride film 22 thicker. This structure increases the reliability of the FS electrode.

Formation of the FS gate oxide film, i.e., the FS lower oxide film 44 by CVD has a disadvantage because, in general, an oxide film formed by CVD (a CVD oxide film) is inferior in reliability (resistance to dielectric breakdown and the like) to that formed by thermal oxidation (a thermal oxide film). As discussed above, however, the FS lower oxide film 44 beneath the side wall nitride film 22 becomes thicker, to prevent dielectric breakdown also at the edge portion where electric field concentration is liable to occur, and therefore the CVD oxide film can achieve reliability equivalent to that of the thermal oxide film.

Figure 69:
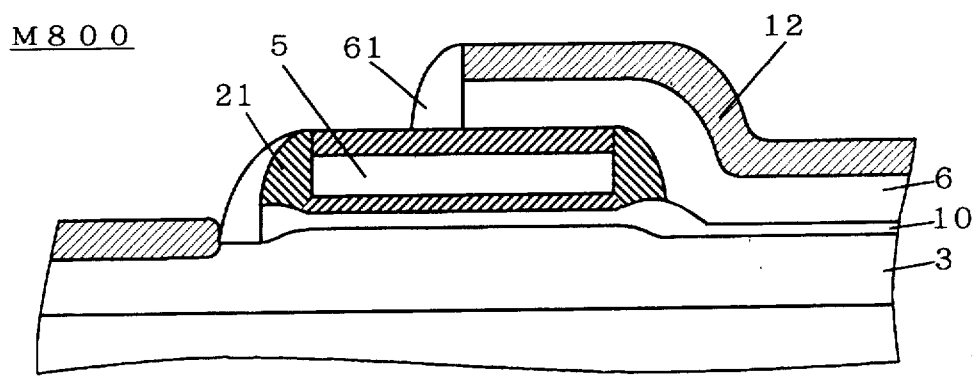

Subsequent steps are the same as those of FIGS. 35 to 38 in the third preferred embodiment, and through the steps of selectively forming the gate electrode 6, forming the side wall oxide films 61 on the side surfaces of the gate electrode 6, selectively forming the silicide-protection film 11 and selectively forming the silicide film 12, the semiconductor device M800 of FIG. 69 is provided.

Furthermore, it is necessary to prevent overetching of the FS upper nitride film 21 in each of the above steps. In other words, the etching condition is determined so that the etching rate for the gate electrode material (polysilicon) may be higher than that for the FS upper nitride film 21 in forming the gate electrode 6, it is determined so that the etching rate for an oxide film may be higher than that for the FS upper nitride film 21 in forming the side wall oxide film 61 and it is determined so that the etching rate for an oxide film may be higher than that for the FS upper nitride film 21 in forming the silicide-protection film 11.

<H-3. Characteristic Action and Effect>

As discussed above, in the semiconductor device M800, the FS insulating film 4A made of a nitride film produces the same action and effect as the sixth preferred embodiment, and by further providing the FS lower oxide film 44 below the FS gate nitride film 23, which is thicker beneath the side wall nitride film 22, it is possible to prevent dielectric breakdown of the FS gate oxide film, i.e., the FS lower oxide film 44 also at the edge portion where electric field concentration is liable to occur. Therefore, the FS lower oxide film 44 formed by CVD can achieve reliability equivalent to that of the thermal oxide film.

It is natural that a bulk silicon substrate may be used though the SOI substrate is used in this preferred embodiment. Also naturally, the FS insulating film 4A may be made of an oxide nitride film (SiON).

<I. The Ninth Preferred Embodiment>
<I-1. Device Structure>

A structure of a semiconductor device with field-shield isolation structure M900 in accordance with the ninth preferred embodiment of the present invention and its characteristic action and effect will be discussed below, showing steps for manufacturing the semiconductor device with field-shield isolation structure M900 in FIGS. 70 to 78. Since the structure of the semiconductor device M900 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<I-2. Manufacturing Method>

Figure 70:
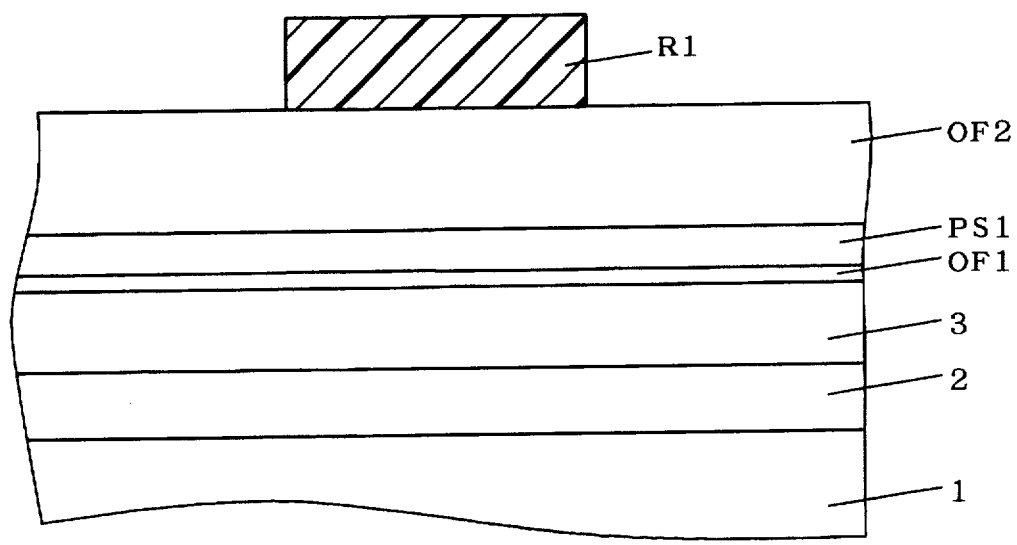
FIGS. 70 to 78 illustrate steps for manufacturing a semiconductor device in accordance with a ninth preferred embodiment of the present invention.
Figure 71:
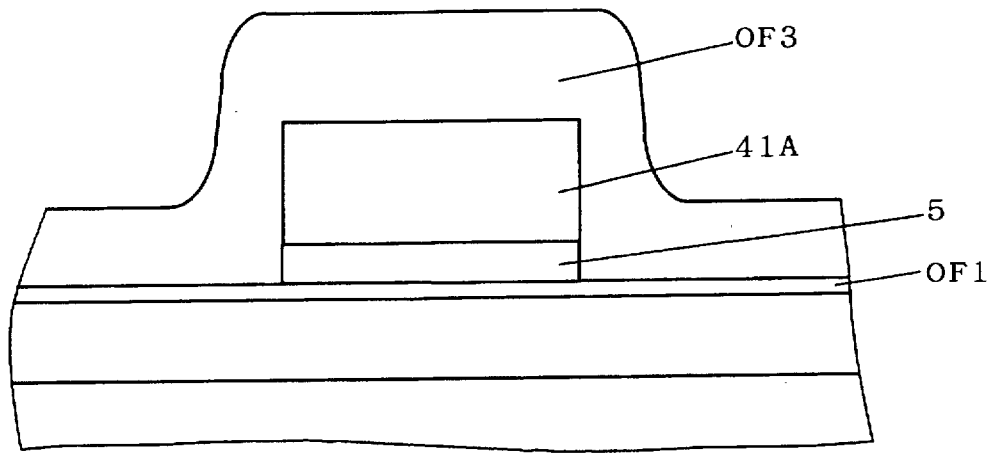

First, as shown in FIG. 70, the oxide film OF1, the polysilicon layer PS1 doped with an impurity (e.g., phosphorus) and the oxide film OF2 are sequentially formed on the surface of the SOI layer 3 provided on the insulating substrate constituted of the supporting substrate 1 and the buried oxide film 2, and the patterned resist mask R1 is formed on the oxide film OF2.

The oxide film OF1 is formed by thermal oxidation or CVD to have a thickness of 200 Å. The polysilicon layer PS1 is formed by CVD, to have a thickness of 500 Å. The oxide film OF2 is formed by CVD to have a thickness of 2000 Å. The thicknesses of the above layers are examples, and the oxide film OF2 may be thicker. The thicknesses of other films are discussed in the first preferred embodiment, so redundant discussion will be omitted.

With the resist mask R1 used as a mask, the oxide film OF2 and the polysilicon layer PS1 are selectively removed by anisotropic etching (dry etching), to form an FS upper oxide film 41A (a first oxide film) and the FS electrode 5. Then, the resist mask R1 is removed, and in the step of FIG. 71, the oxide film OF3 is formed by CVD so as to cover the oxide film OF1, the FS upper oxide film 41A and the FS electrode 5. The oxide film OF3 has a thickness of 1500 to 2000 Å.

Figure 72:
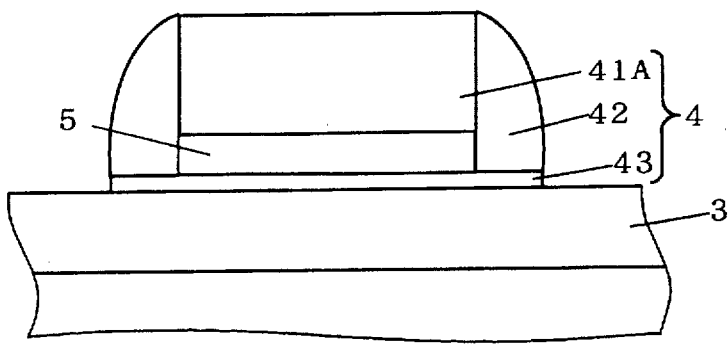

In the step of FIG. 72, the oxide film OF3 is removed by anisotropic etching (dry etching), to form the side wall oxide film 42 on side surfaces of the FS upper oxide film 41A and the FS electrode 5.

After that, the oxide film OF1 is removed. The oxide film OF1 also serves as a protective film for protection of the source/drain region from exposure to the plasma of the dry etching, and is removed by wet etching with buffered HF (hydrofluoric acid). Through this step, the oxide film OF1 remains only below the FS electrode 5 and the side wall oxide film 42, becoming the FS gate oxide film 43. The FS upper oxide film 41A, the side wall oxide film 42 and the FS gate oxide film 43 constitute the FS insulating layer 4.

Figure 73:
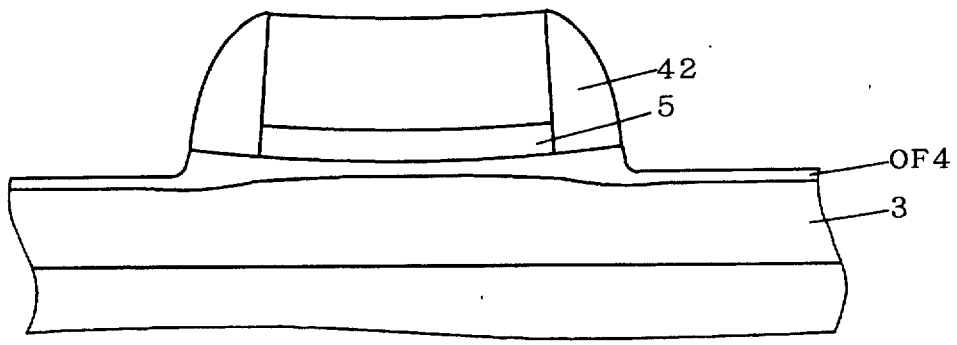

In the step of FIG. 73, the oxide film OF4 which is to become the gate oxide film 10 is formed by thermal oxidation on the surface of the SOI layer 3. In forming the oxide film OF4, the oxygen as an oxidant passing the side wall oxide film 42, the FS gate oxide film 43 oxidizes the upper surface and lower surface sides of the FS electrode 5 to decrease the substantial thickness of the FS electrode 5 due to oxidation, and the oxygen reaching the bottom of the FS electrode 5 oxidizes the edge portion of the FS electrode 5 to be warped up.

Figure 74:
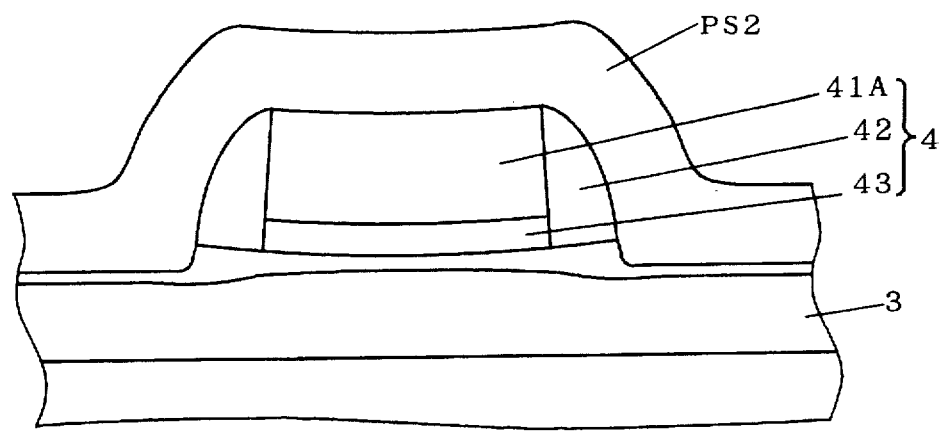

Subsequently, in the step of FIG. 74, the polysilicon layer PS2 which is to become the gate electrode 6 is formed by CVD on the oxide film OF4 and the FS insulating layer 4, to have a thickness of 1000 to 1500 Å.

Figure 75:
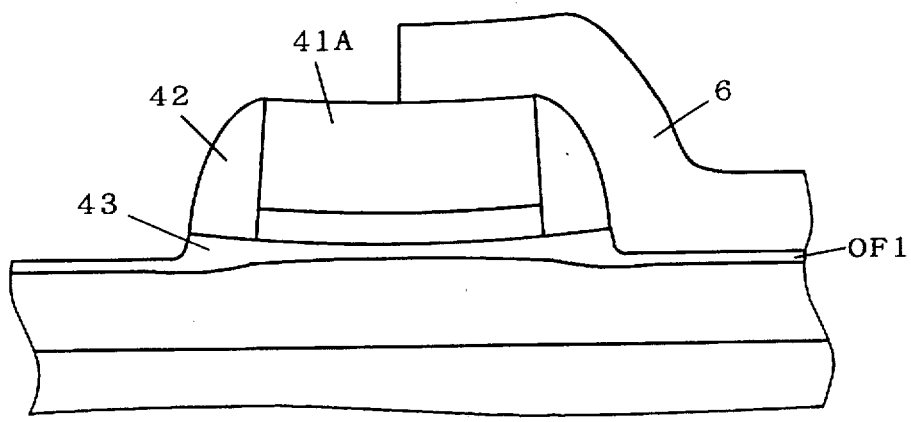

In the step of FIG. 75, the polysilicon layer PS2 is selectively removed by anisotropic etching (dry etching), to form the gate electrode 6.

Subsequently, with the gate electrode 6 used as a mask, the oxide film OF4 is selectively removed to form the gate oxide film 10. At this time, the FS upper oxide film 41A is partially removed by overetching.

Figure 76:
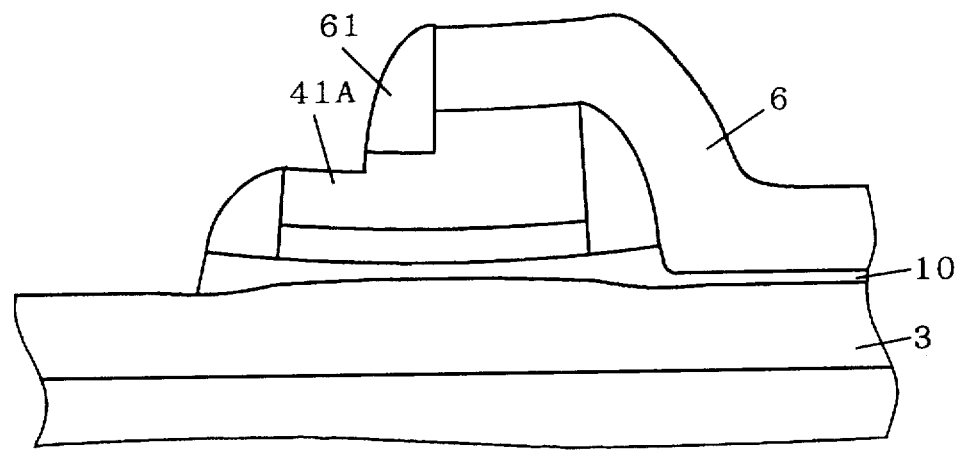

Next, in the step of FIG. 76, the side wall oxide films 61 are formed on both sides of the gate electrode 6 to provide an LDD layer in the source/drain layer. Through the steps of forming an oxide film so as to cover the gate electrode 6 and then removing it by anisotropic etching (dry etching), the side wall oxide films 61 are provided, being self-aligned, on the sides of the gate electrode 6.

At this time, the FS upper oxide film 41A is partially removed by overetching.

Figure 77:
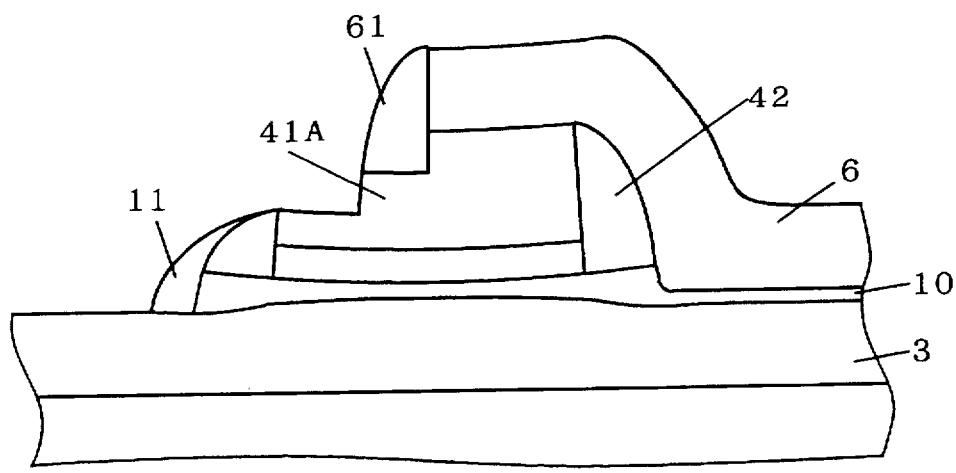

In the step of FIG. 77, the silicide-protection film 11 is formed entirely. Through the steps of forming an oxide film entirely on the substrate, to have a thickness of 500 Å, and then the selectively removing it by anisotropic etching (dry etching), the silicide-protection film 11 is provided so as to cover a surface of a predetermined source/drain layer, and at the same time it is formed, being self-aligned, on side surfaces of the FS insulating layer 4 (the side surface of the side wall oxide film 42 and the side surface of the FS gate oxide film 43) as shown in FIG. 77. Also in forming the silicide film 11, the FS upper oxide film 41A is partially removed by overetching.

Though the FS upper oxide film 41A is partially removed a plurality of times, the FS upper oxide film 41A is not completely partially removed by overetching since it initially has a thickness of 2000 Å.

Specifically discussing, the overetching in forming the gate oxide film 10 is made by 200 Å even if 100%-etching is performed, the overetching in forming the side wall oxide film 61 for LDD layer is made by 1000 Å even if 100%-etching is performed and the overetching in forming the silicide-protection film 11 is made by 500 Å even if 100%-etching is performed, which total 1700 Å.

Figure 78:
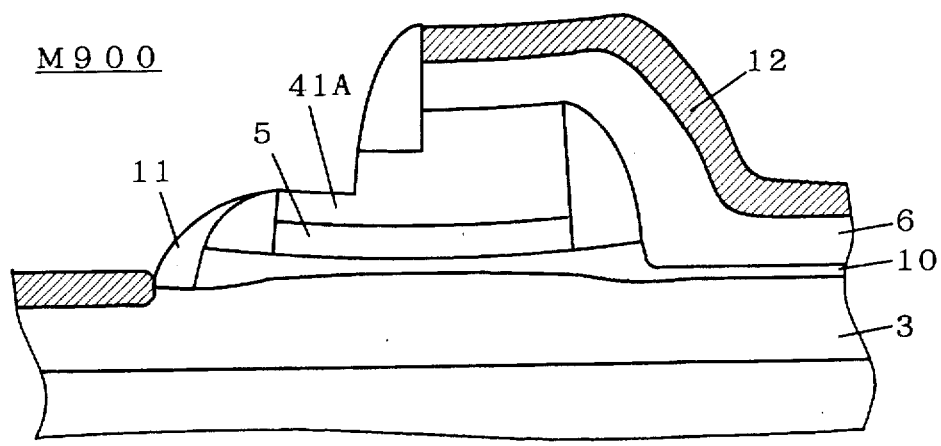

Therefore, the surface of the FS electrode 5 is not exposed and in this state, the silicide film 12 is not formed on the FS electrode 5 even when the silicide film 12 is formed on the upper surface of the gate electrode 6 and the surface of the not-shown source/drain layer, being self-aligned, to have a thickness of e.g., 800 Å, as shown in FIG. 78.

Thus, it is possible to prevent the FS upper oxide film 41A from being completely partially removed due to overetching, by forming it thicker in advance with consideration of overetching.

Furthermore, the thickness of the FS upper oxide film 41A should be determined 1.1 to 3 times as large as the total of those of the side wall oxide film 61 for LDD layer and the silicide-protection film 11. This thickness covers 10% to 100%-ethching, taking the practical upper limit of the thickness of the FS upper oxide film 41A into account.

<I-3. Characteristic Action and Effect>

In the semiconductor device M900, as discussed above, since the silicide film 12 is not formed on the surface of the FS electrode 5, it is possible to prevent ill effect on the operation characteristics of the semiconductor device due to the exfoliated silicide film 12 which comes into conductive dust to be left on the semiconductor device. Further, it is possible to prevent a break in the FS electrode 5 caused by partial lost of the FS electrode 5 with removal of the silicide film 12.

<J. The Tenth Preferred Embodiment>

A structure of a semiconductor device with field-shield isolation structure M1000 in accordance with the tenth preferred embodiment of the present invention and its characteristic action and effect will be discussed below, showing steps for manufacturing the semiconductor device with field-shield isolation structure M1000 in FIGS. 79 to 80. Since the structure of the semiconductor device M1000 is basically the same as that of the semiconductor device M90 shown in FIG. 82, like elements are given the same reference signs and duplicate discussion will be omitted. Furthermore, since the present invention relates to a field-shield isolation structure, the following discussion will be mainly made on a constitution involving the field-shield isolation structure.

<J-1. Device Structure>

Figure 79:
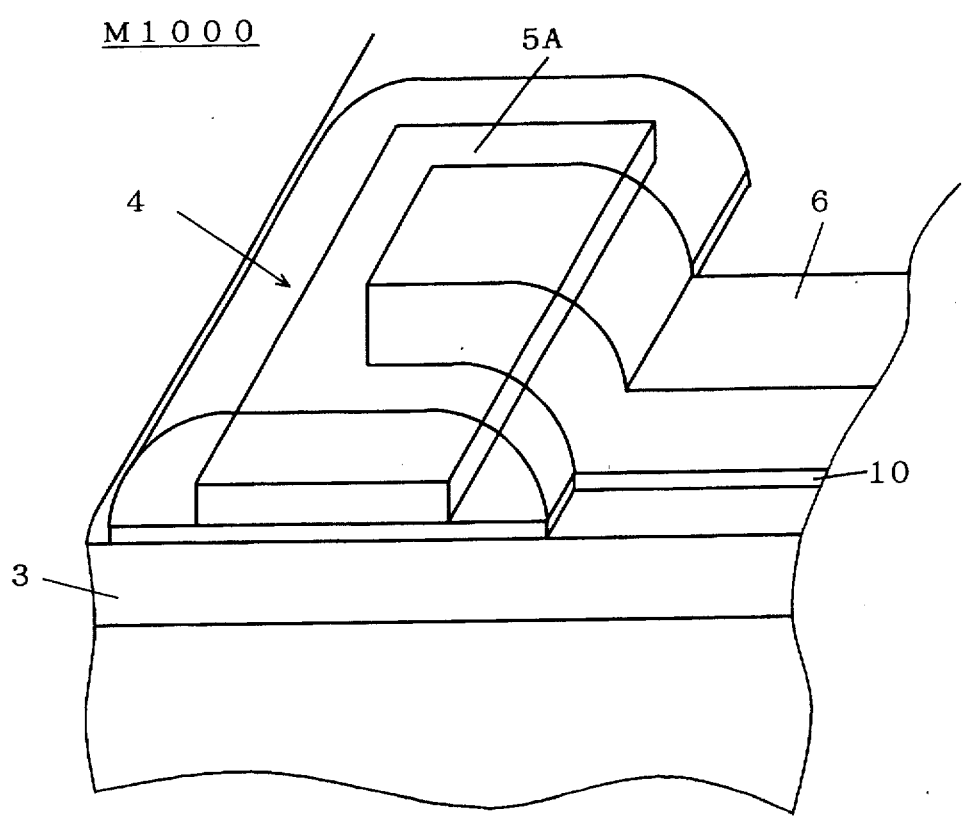
FIG. 79 illustrates a structure of a semiconductor device in accordance with a tenth preferred embodiment of the present invention.

FIG. 79 is a perspective view showing an arrangement of the FS insulating film 4, an FS electrode 5A and the gate electrode 6 in the semiconductor device M1000, for clear understanding.

The FS electrode 5A of FIG. 79 is made of a polysilicon layer of small grain diameter (the diameter of crystal grain is not more than 0.1 μm and the thickness is not more than 1000 Å) and does not have much difference in oxidation rate between the crystal grain and its boundary even when the oxidation is accelerated along the grain boundary in the oxidation process for forming the gate oxide film 10. Therefore, no large projection exists in an edge portion of the FS electrode 5A as shown in FIG. 79 and that prevents a dielectric breakdown between the edge portion of the FS electrode 5A and the opposed gate electrode 6 and a short circuit between these electrodes caused thereby.

<J-2. The First Method of Manufacturing Polysilicon Layer>

Such polysilicon layer of small grain diameter can be formed by CVD with $SiH_4$ gas at the temperature of about 600° C., for example. After the film formation, phosphorus (P) is doped therein as an impurity, to form an N-type polysilicon serving as the FS electrode 5A.

Figure 80:
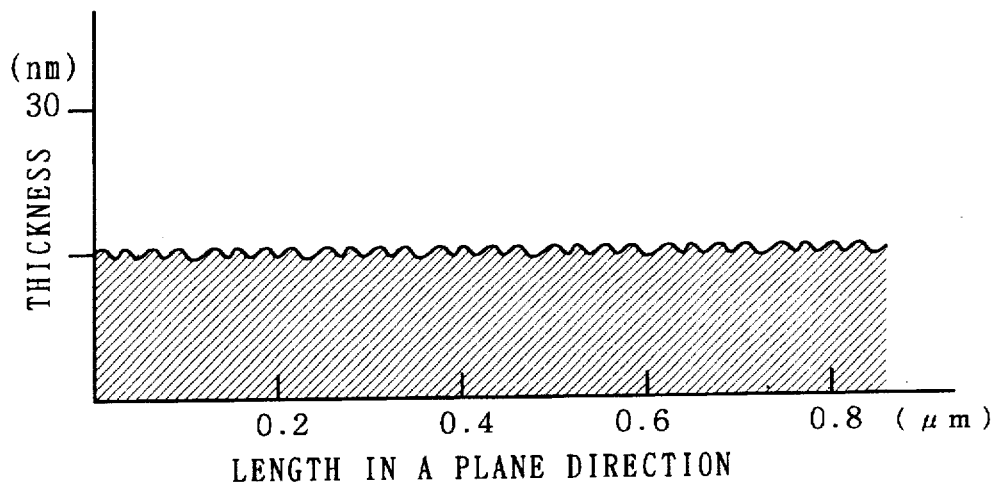
FIGS. 80 and 81 illustrate the tenth preferred embodiment of the present invention.
Figure 81:
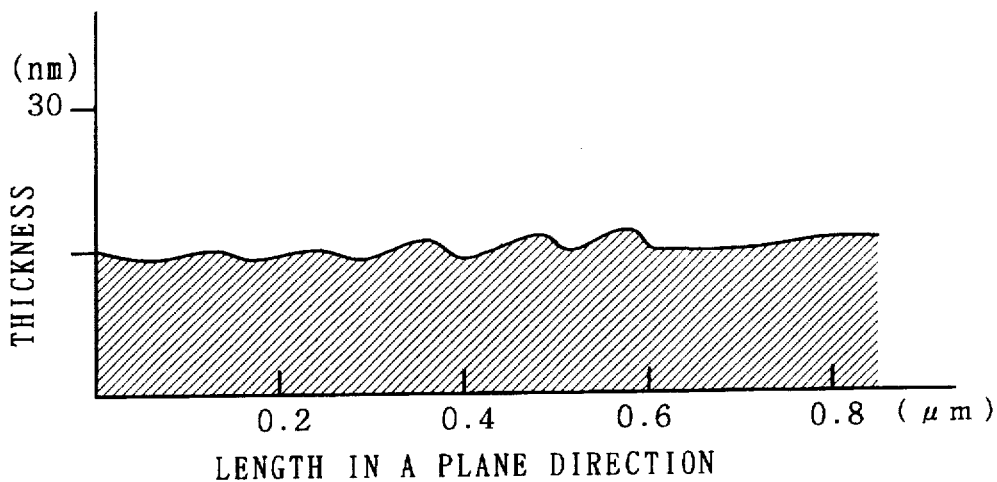

FIG. 80 shows a section of the edge portion of the FS electrode 5A while the FIG. 81 shows a section of the edge portion of the FS electrode formed by the background-art method. In FIGS. 80 and 81, vertical axis is a thickness of the FS electrode and horizontal axis is a length of the FS electrode in a plane direction.

Comparison between FIGS. 80 and 81 shows that the FS electrode 5A has a smaller grain diameter then the FS electrode 5.

<J-3. The Second Method of Manufacturing Polysilicon Layer>

There is another method for forming a polysilicon layer of small grain diameter. Specifically, an amorphous silicon layer containing added nitrogen with its density of $1\times10^{19}/cm^3$ is formed and converted into a polycrystalline silicon, thus obtaining the polysilicon layer of small grain diameter. In this case, since the addition of nitrogen reduces the oxidation rate of the polysilicon layer, it is possible to prevent roughness from being formed on the surface of the FS electrode.

The first specific method is as follows: by CVD using $SiH_4$ gas at the temperature of about 550° C., an amorphous silicon layer is formed. Nitrogen and phosphorus as a dopant are added thereto by ion implantation. After that, in crystallization of the amorphous layer by heat treatment, the N-type polysilicon layer of small grain diameter is obtained.

The second specific method is as follows: by CVD using $SiH_4$ gas with, for example, $NH_3$ gas added, an amorphous silicon layer with nitrogen added is formed. Phosphorus is added thereto by ion implantation, to obtain the N-type polysilicon layer of small grain diameter.

The third specific method is as follows: by CVD using $PH_3$ gas and $NH_3$ gas, a doped polysilicon layer is formed, or a doped amorphous silicon layer is formed and thereafter it is crystallized by heat treatment into a polysilicon layer.

These methods using CVD for forming a polysilicon layer or a doped amorphous silicon layer are effective in forming a thin film like the FS electrode. In other words, while injecting impurity into a non-doped polysilicon by ion implantation inevitably has an injection damage, doping a predetermined impurity in film formation has no process damage.

<J-4. Characteristic Action and Effect>

In the semiconductor device M1000, as discussed above, since the FS electrode 5A is made of a polysilicon layer of small grain diameter, it does not have much difference in oxidation rate between the crystal grain and its boundary even when the oxidation is accelerated along the grain boundary in the oxidation process for forming the gate oxide film 10. Therefore, no large projection exists in the edge portion of the FS electrode 5A and that prevents a dielectric breakdown between the edge portion of the FS electrode 5A and the opposed gate electrode 6 and a short circuit between these electrodes caused thereby.

Furthermore, when the FS electrode 5A has a small grain diameter even if the gate electrode 6 has a large grain diameter, it is possible to prevent a dielectric breakdown between the FS electrode 5A and the gate electrode 6 and a short circuit between these electrodes caused thereby.

<J-5. Modification>

In the semiconductor device M1000 as discussed above, the FS electrode is made of an N-type polysilicon doped with phosphorus (P) as an impurity. The FS electrode may be made of a P-type polysilicon doped with boron (B) as an impurity.

It is generally known that a polysilicon doped with phosphorus has a larger oxidation rate than that doped with boron (B). Further, a polysilicon doped with arsenic (As) also has a large oxidation rate.

The FS electrode made of a P-type polysilicon has a lower oxidation rate, has a smaller roughness on the surface of the FS electrode and produces more reliable effect of preventing a dielectric breakdown between the edge portion of the FS electrode and the opposed gate electrode and a short circuit between these electrodes caused thereby.

In the tenth preferred embodiment, discussion is made taking the semiconductor device with field-shield isolation structure formed on the SOI substrate as an example. Naturally, the semiconductor formed on the bulk silicon substrate, instead of the SOI substrate, may produce the same action and effect. Further it is sure that this preferred embodiment may applies to any of the semiconductor devices M100 to M900 in the first to ninth preferred embodiments.

While the invention has been shown and described in detail, the foregoing description is in all aspects illustrative and not restrictive. It is therefore understood that numerous modifications and variations can be devised without departing from the scope of the invention.

We claim:

1. A semiconductor device having a field-shield isolation structure selectively formed on an upper surface of a semiconductor substrate, said field-shield isolation structure comprising:

an insulating film formed on the upper surface of said semiconductor substrate;

a field-shield electrode formed on an upper surface of said insulating film over a boundary region that separates element regions of the semiconductor device, said boundary region including a region formed on opposite sides of a channel covered by a conduction controlling gate electrode, with no channel being formed on said region;

an oxidation-resistant film formed so as to cover an upper surface of said field-shield electrode;

a first oxide film covering an upper surface of said oxidation-resistant film; and a second oxide film directly contacting side surfaces of said first oxide film, said oxidation-resistant film, and said field-shield electrode, wherein said field-shield isolation structure is configured to electrically isolate the element regions from each other.

2. The semiconductor device of claim 1, wherein said oxidation-resistant film is a titanium nitride film or a tungsten nitride film.

3. The semiconductor device of claim 1, wherein said oxidation-resistant film is a silicon nitride film or an SiON film.

4. The semiconductor device of claim 1, wherein said second oxide film has a surface structure with a roundly stepped contour in a vertical sectional direction, said roundly-stepped contour being roundly convex towards said semiconductor substrate at a contact portion with said substrate.

5. The semiconductor device of claim 1, wherein said field-shield electrode is made of a polycrystalline silicon layer, and said polycrystalline silicon layer has a crystal grain average grain diameter of not more than 0.1 μm.

6. The semiconductor device of claim 1, wherein at least one of the element regions electrically isolated by said field-shied isolation structure includes an MOS transistor, a gate electrode of said MOS transistor and said field-shield electrode are each made of a polycrystalline silicon layer, and an average diameter of a crystal grain of said field-shield electrode is smaller than an average diameter of a crystal grain of said gate electrode of said MOS transistor.

7. The semiconductor device of claim 5, wherein said polycrystalline silicon layer includes therein nitrogen having a density of $1 \times 10^{19}/cm^3$.

8. A semiconductor device having a field-shield isolation structure selectively formed on a semiconductor substrate, said field-shield isolating structure comprising:

an insulating film having resistance to oxidation formed on an upper surface of said semiconductor substrate;

a field-shield electrode formed on an upper surface of said insulating film over a boundary region that separates element regions of the semiconductor device, said boundary region including a region formed on opposite sides of a channel covered by a conduction controlling gate electrode;

a first oxidation-resistant film formed so as to cover an upper surface of said field-shield electrode; and a second oxidation-resistant film formed so as to be in direct contact with side surfaces of said first oxidation-resistant film and said field-shield electrode, wherein said field-shield isolation structure is configured to electrically isolate the element regions from each other.

9. The semiconductor device of claim 8, wherein at least one of the element regions electrically isolated by said field-shield isolation structure includes an MOS transistor, a surface part of said semiconductor substrate on which said MOS transistor is formed is located lower than a surface part of said semiconductor substrate on which said field-shield insulating film is formed.

10. The semiconductor device of claim 8, wherein said field-shield electrode is made of a polycrystalline silicon layer, and said polycrystalline silicon layer has a crystal grain average diameter of not more than 0.1 μm.

11. The semiconductor device of claim 8, wherein at least one of the element regions electrically isolated by said field-shield isolation structure includes an MOS transistor, a gate electrode of said MOS transistor and said field-shield electrode are each made of a polycrystalline silicon layer, and an average diameter of a crystal grain of said field-shield electrode is smaller than an average diameter of a crystal grain of said gate electrode of said MOS transistor.

12. The semiconductor device of claim 10, wherein said polycrystalline silicon layer includes therein nitrogen having a density of $1 \times 10^{19}/cm^3$.

13. The semiconductor device of claim 9, wherein said semiconductor substrate is an SOI substrate having an SOI layer formed on an insulating substrate, and said field-shield isolation structure is are formed on said SOI layer and an impurity concentration in said SOI layer beneath said field-shield electrode is higher than that in a channel region of said MOS transistor formed in said SOI layer.

14. The semiconductor device of claim 8, wherein said field-shield isolation structure further comprises an oxide film formed between said semiconductor substrate and said insulating film so as to cover a lower surface of said insulating film, and an edge portion of said oxide film is thicker than a central portion thereof.

15. A semiconductor device having a field-shield isolation structure selectively formed on a semiconductor substrate so as to isolate separate element regions making up the semiconductor device, said field-shield isolation structure comprising:

an insulating film formed on an upper surface of said semiconductor substrate;

a field-shield electrode formed on an upper surface of said insulating film;

a first oxide film covering an upper surface of said field-shield electrode;

a second oxide film covering side surfaces of said first oxide film and said field-shield electrode, and wherein at least one of the element regions isolated by said field-shield isolation structure includes an MOS transistor, and a thickness of said first oxide film is larger than the total of those of a side wall oxide film formed in an end surface of a gate electrode of said MOS transistor for formation of a lightly doped drain layer of said MOS transistor and a silicide protection film formed on a portion of said MOS transistor.

16. The semiconductor device of claim 15. wherein said thickness of said first oxide film is 1.1 to 3 times as large as the total of those of said side wall oxide film and said silicide-protection film.

* * * * *